US009507248B2

(12) United States Patent
Okazaki et al.

(10) Patent No.: US 9,507,248 B2
(45) Date of Patent: Nov. 29, 2016

(54) TWO-BEAM INTERFERENCE APPARATUS AND TWO-BEAM INTERFERENCE EXPOSURE SYSTEM

(71) Applicant: Gigaphoton Inc., Tochigi (JP)

(72) Inventors: Shinji Okazaki, Tochigi (JP); Hakaru Mizoguchi, Tochigi (JP); Junichi Fujimoto, Tochigi (JP); Takashi Matsunaga, Tochigi (JP); Kouji Kakizaki, Tochigi (JP); Osamu Wakabayashi, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 923 days.

(21) Appl. No.: 13/681,744

(22) Filed: Nov. 20, 2012

(65) Prior Publication Data
US 2013/0135601 A1 May 30, 2013

(30) Foreign Application Priority Data

Nov. 29, 2011 (JP) .................................. 2011-260513
Dec. 15, 2011 (JP) .................................. 2011-274867
Sep. 25, 2012 (JP) .................................. 2012-211282

(51) Int. Cl.
*G03F 7/20* (2006.01)
*G03B 27/52* (2006.01)

(52) U.S. Cl.
CPC ......... *G03B 27/522* (2013.01); *G03F 7/70408* (2013.01)

(58) Field of Classification Search
CPC G03F 7/70408; G03F 7/7045; G03B 27/522
USPC .................................................. 355/53, 67
See application file for complete search history.

(56) References Cited

U.S. PATENT DOCUMENTS 5,151,754 A * 9/1992 Ishibashi et al. ............. 356/490
5,369,486 A * 11/1994 Matsumoto ........... G03F 9/7049
356/488

(Continued)

FOREIGN PATENT DOCUMENTS

EP            11679 A   *  6/1980
JP         62-018562       1/1987

(Continued)

OTHER PUBLICATIONS

"Tunable VUV Radiation Generated by Two-Photon Resonant Frequency Mixing in Xenon" (IEEE Journal of Quantum Electronics, vol. QE-19, No. 2, Feb. 1983).

(Continued)

*Primary Examiner* — Toan Ton
*Assistant Examiner* — Mona M Sanei
(74) *Attorney, Agent, or Firm* — Studebaker & Brackett PC

(57) ABSTRACT

A two-beam interference apparatus may include a wafer stage on which a wafer may be set, a beam splitter to split first laser light into second and third laser light having a beam intensity distribution elongated in a first direction within a surface of the wafer, and an optical system to guide the second and third laser light onto the wafer. The wafer is irradiated with the second laser light from a second direction perpendicular to the first direction, and the third laser light from a third direction perpendicular to the first direction but different from the second direction, to thereby cause interference of the second and third laser light on the wafer. This apparatus increases the accuracy of the two-beam interference exposure.

19 Claims, 45 Drawing Sheets

(56) References Cited

U.S. PATENT DOCUMENTS

| | | | |
|---|---|---|---|
| 5,415,835 A | 5/1995 | Brueck et al. | |
| 5,705,321 A | 1/1998 | Brueck et al. | |
| 5,759,744 A | 6/1998 | Brueck et al. | |
| 5,771,098 A | 6/1998 | Ghosh et al. | |
| 6,233,044 B1 | 5/2001 | Brueck et al. | |
| 6,246,709 B1* | 6/2001 | Oshiba et al. | 372/50.1 |
| 6,255,038 B1 | 7/2001 | Hobbs | |
| 6,304,318 B1 | 10/2001 | Matsumoto | |
| 6,526,086 B1 | 2/2003 | Wakabayashi et al. | |
| 6,671,054 B2 | 12/2003 | Goldstein | |
| 7,042,577 B1 | 5/2006 | Jacob et al. | |
| 7,088,758 B2 | 8/2006 | Sandstrom et al. | |
| 7,142,282 B2 | 11/2006 | Borodovsky | |
| 7,154,928 B2 | 12/2006 | Sandstrom et al. | |
| 7,319,551 B2 | 1/2008 | Nunes Vicente Rebordao et al. | |
| 7,459,241 B2 | 12/2008 | Wago | |
| 7,492,442 B2 | 2/2009 | Markoya et al. | |
| 7,561,252 B2 | 7/2009 | Sewell et al. | |
| 7,751,030 B2 | 7/2010 | Markoya et al. | |
| 7,859,646 B2 | 12/2010 | Bentley | |
| 8,623,588 B2 | 1/2014 | Sewell | |
| 2001/0015808 A1* | 8/2001 | Akihiro | G01D 5/38 356/499 |
| 2002/0163707 A1* | 11/2002 | Chen et al. | 359/246 |
| 2005/0085085 A1 | 4/2005 | Borodovsky | |
| 2007/0279642 A1 | 12/2007 | Shmarev | |
| 2011/0249270 A1* | 10/2011 | Ishizuka | 356/486 |

FOREIGN PATENT DOCUMENTS

| | | |
|---|---|---|
| JP | H05-217856 A | 8/1993 |
| JP | 07047481 A * | 2/1995 |
| JP | H07-047481 A | 2/1995 |
| JP | H10-313143 A | 11/1998 |
| JP | 11-143085 | 5/1999 |
| JP | H11-352420 A | 12/1999 |
| JP | 2000-019713 | 1/2000 |
| JP | 2000-021713 | 1/2000 |
| JP | 2000-021714 | 1/2000 |
| JP | 2000-021715 | 1/2000 |
| JP | 2000-021720 | 1/2000 |
| JP | 2000-077319 | 3/2000 |
| JP | 2000-150366 | 5/2000 |
| JP | 2000-150376 | 5/2000 |
| JP | 2001-138300 | 5/2001 |
| JP | 2001-319874 | 11/2001 |
| JP | 2002-139696 A | 5/2002 |
| JP | 2002-162750 A | 6/2002 |
| JP | 2002-329911 | 11/2002 |
| JP | 2003-005233 | 1/2003 |
| JP | 2004-107150 A | 4/2004 |
| JP | 2005-026649 | 1/2005 |
| JP | 2006-019568 | 1/2006 |
| JP | 2007-227637 | 9/2007 |
| JP | 2008-170679 A | 7/2008 |
| JP | 2008-277618 | 11/2008 |
| JP | 2011-508443 A | 3/2011 |
| JP | 2011-155080 A | 8/2011 |
| WO | WO 98/32054 | 7/1998 |

OTHER PUBLICATIONS

An Office Action; "Notice of Reason(s) for Refusal," issued by the Japanese Patent Office on May 10, 2016, which corresponds to Japanese Patent Application No. 2012-211282 and is related to U.S. Appl. No. 13/681,744; with English language translation.

* cited by examiner

TWO-BEAM INTERFERENCE APPARATUS AND TWO-BEAM INTERFERENCE EXPOSURE SYSTEM

CROSS-REFERENCE TO RELATED APPLICATIONS

This application is based upon and claims the benefit of priority of the prior Japanese Patent Applications No. 2011-260513 filed on Nov. 29, 2011, No. 2011-274867 filed on Dec. 15, 2011, and No. 2012-211282 filed on Sep. 25, 2012, the entire contents of which are incorporated herein by reference.

BACKGROUND

1. Technical Field

The present disclosure relates to a two-beam interference apparatus and a two-beam interference exposure system.

2. Related Art

The miniaturization and increased levels of integration of semiconductor integrated circuits have led to demands to increase the resolutions of semiconductor exposure apparatuses (hereinafter simply referred to as "exposure apparatuses"). Accordingly, advances are being made in the reduction of the wavelengths of light output from exposure light sources. Gas laser devices are being used as exposure light sources in place of conventional mercury lamps. At the present, a KrF excimer laser device that outputs ultraviolet light having a wavelength of 248 nm and an ArF excimer laser device that outputs ultraviolet light having a wavelength of 193 nm are used as gas laser devices for the exposure.

Immersion exposure, in which the apparent wavelength of an exposure light source is reduced by filling a gap between a projection lens of the exposure apparatus and a wafer with a liquid and changing the refractive index of the gap, is being researched as the next-generation exposure technique. In a case where the immersion exposure is carried out using the ArF excimer laser device as the exposure light source, the wafer is irradiated with the ultraviolet light having a wavelength of 134 nm within the liquid. This technique is called ArF immersion exposure, and this ArF immersion exposure is also sometimes referred to as the "ArF immersion lithography".

Because the width of the natural oscillation of a KrF or ArF excimer laser device is approximately 350 pm to 400 pm and wide, chromatic aberration occurs when the projection lens in the device is used, which in turn causes the resolution to deteriorate. Accordingly, it is necessary to narrow the spectral line width of the laser beam output from the gas laser device until the chromatic aberration reaches a level that may be negligible. The spectral line width is also sometimes called the "spectral width". For this reason, a line narrow module having a line narrowing element (etalon, grating, etc.) is provided within a laser resonator of the gas laser device, and the narrowing of spectral width is realized using this line narrow module. A laser device that narrows the spectral width in this manner is called a narrow-band laser device.

In addition, techniques have been developed, which carries out the circuit design of the devices using the line-and-space (L & S) as the fundamental patterns. For this reason, much attention are drawn to the two-beam interference apparatus that may be used as an apparatus to form the line-and-space patterns.

Related techniques may be found in U.S. Pat. Nos. 7,088,758, 7,154,928, 6,304,318, and 5,759,744, and Japanese Laid-Open Patent Publications No. 2002-329911, No. 2003-5233, and No. 2008-277618, for example.

SUMMARY

According to one aspect of the present disclosure, a two-beam interference apparatus may include a wafer stage configured to receive a wafer to be set on the wafer stage; a beam splitter configured to split first laser light output from a laser device into second laser light and third laser light having a beam intensity distribution elongated in a first direction within a surface of the wafer; and an optical system configured to guide the second laser light and the third laser light onto the wafer, wherein the wafer is irradiated with the second laser light from a second direction perpendicular to the first direction, and the third laser light from a third direction perpendicular to the first direction but different from the second direction, to thereby cause interference of the second and third laser light output from the optical system on the wafer.

According to another aspect of the present disclosure, a two-beam interference exposure system may include a laser device configured to output first laser light and having an amplifier unit that includes a pair of excitation electrodes forming a discharge region, wherein a cross section of the discharge region taken in a direction perpendicular to an optical axis of the first laser light is elongated in a first direction; and a two-beam interference apparatus configured to cause interference of the laser light output from the laser device, wherein the two-beam interference apparatus includes a beam splitter configured to split the first laser light output from the laser device into second laser light and third laser light; a wafer stage configured to receive a wafer to be set on the wafer stage; and an optical system configured to guide the second laser light and the third laser light onto the wafer, wherein the wafer is irradiated with the second laser light from a second direction perpendicular to the first direction, and the third laser light from a third direction perpendicular to the first direction but different from the second direction, to thereby cause interference of the second and third laser light output from the optical system on the wafer.

BRIEF DESCRIPTION OF THE DRAWINGS

Embodiments of the present disclosure will be described below, as simple examples, with reference to the accompanying drawings.

DETAILED DESCRIPTION

Figure 1:
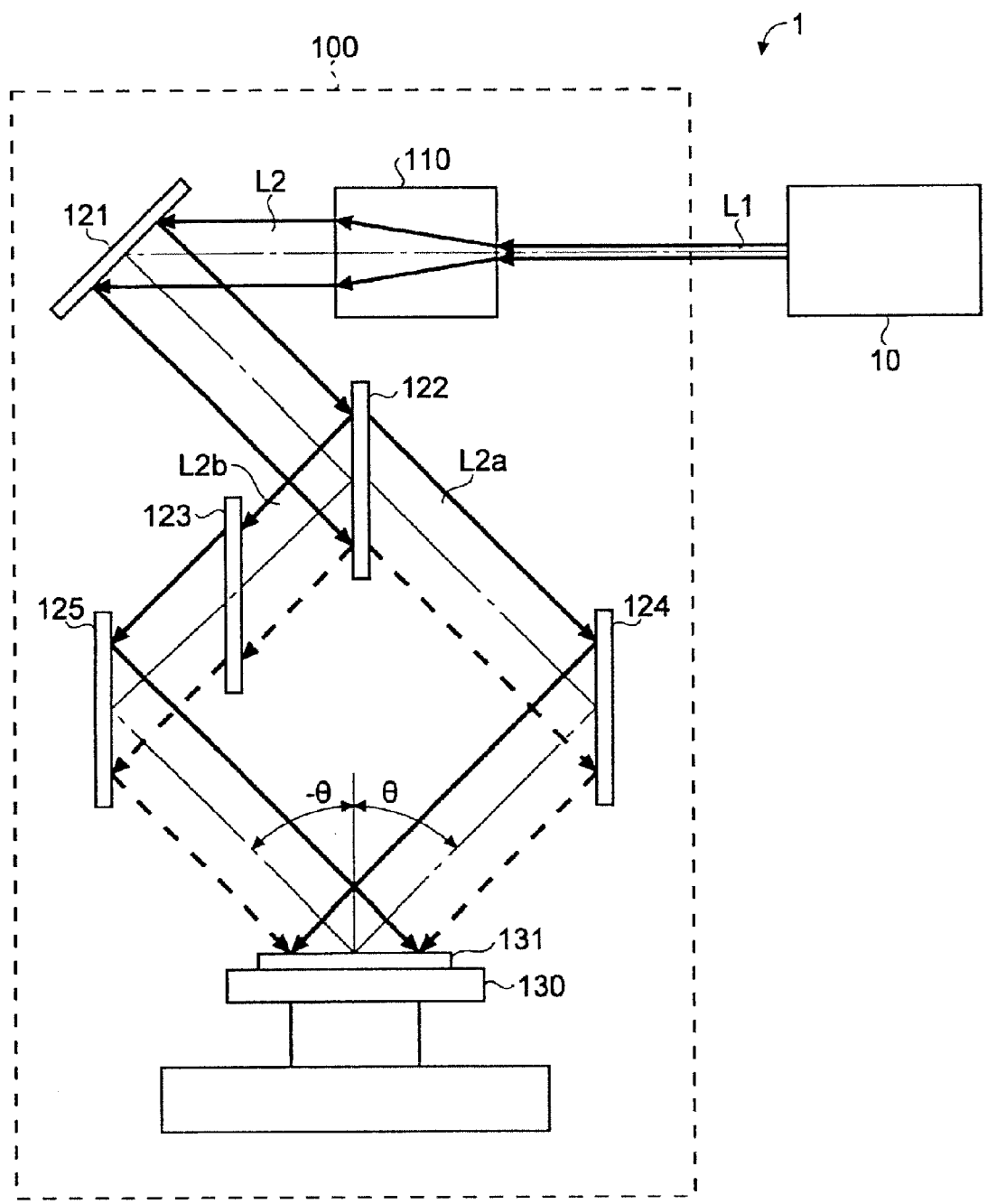
FIG. 1 is a diagram schematically illustrating a configuration of a two-beam interference exposure system in a first embodiment.

A description will be given of embodiments of the present disclosure, by referring to the drawings. The embodiments described hereinafter are examples of the present disclosure, and contents of the present disclosure are not limited to these embodiments. In addition, configurations and operations of each embodiment that is described hereinafter are not necessarily required in their entirety as configurations and operations of the present disclosure. Those constituent elements that are the same are designated by the same reference characters, and redundant description thereof will be omitted.

The description will hereinafter be made along the following table of contents.

Table of Contents

1. Outline
2. Description of Terminologies
3. Two-Beam Interference Exposure System (First Embodiment)
   3.1   Configuration
   3.2   Operation
   3.3   Effects
4. Two-Beam Interference Exposure Apparatus With Tunable Beam Profile (Second Embodiment)
   4.1   Configuration
       4.1.1   Gaussian Beam Tuning Unit
   4.2   Effects
5. Two-Beam Interference Exposure System Using Narrow Band Excimer Laser Device (Third Embodiment)
   5.1   Configuration
       5.1.1   Narrow Band Excimer Laser Device
       5.1.2   Spatial Coherence of Narrow Band Excimer Laser Device
       5.1.3   Excimer Laser Beam Tuning Unit
   5.2   Effects
6. Two-Beam Interference Exposure System Combining Optical Retarder And Excimer Laser Device (Fourth Embodiment)
   6.1   Configuration
   6.2   Effects
7. Two-Beam Interference Exposure System With Alignment Adjusting System (Fifth Embodiment)
   7.1   Configuration
   7.2   Operation
       7.2.1   Alignment Adjustment of Two-Beam Interference Apparatus
           7.2.1.1   Wave Front Measurement By Wavelength Change
                7.2.1.1.1   Details of Wave Front Measurement By Wavelength Change
           7.2.1.2   Alignment Adjustment Flow Chart
       7.2.2   Two-Beam Interference Exposure
   7.3   Effects
8. Two-Beam Interference Exposure System With Modifiable Pattern Direction (Sixth Embodiment)
   8.1   Configuration
   8.2   Effects
9. Two-Beam Interference Exposure System With Optical Retarder (Seventh Embodiment)
   9.1   Configuration
       9.1.1   Example of Optical Retarder
   9.2   Operation
   9.3   Effects
10. Two-Beam Interference Exposure System With Beam Rotating Mechanism (Eighth Embodiment)
   10.1   Configuration
       10.1.1   Example of Beam Rotating Mechanism
   10.2   Operation
   10.3   Effects
   10.4   Modification of Beam Rotating Mechanism
11. Four-Beam Interference Exposure System (Ninth Embodiment)
   11.1   Configuration
   11.2   Operation
   11.3   Effects
12. Two-Beam Interference Exposure System Using Laser Device Having Coherence Tuning Mechanism (Tenth Embodiment)
   12.1   Configuration
   12.2   Operation
       12.2.1   Flow Chart
   12.3   Effects
13. Variation of Laser Device
   13.1   MOPA System
   13.2   MOPO System
   13.3   Laser Device Using Amplifier Apparatus With Ring Resonator
   13.4   Laser Device Using Amplifier Apparatus With Unstable Resonator
   13.5   Solid State Laser Device
       13.5.1   Wavelength Converter For ArF Excimer Laser
       13.5.2   Wavelength Converter For KrF Excimer Laser
   13.6   F2 Laser Using Solid State Seeder
       13.6.1   Solid State Seeder Using Non-Linear Optical Crystal
       13.6.2   Solid State Seeder Using Xenon Gas Cell
           13.6.2.1   Wavelength Converting Mechanism Using Xenon Gas
   13.7   Laser Device Having Coherence Tuning Mechanism
       13.7.1   Configuration
           13.7.1.1   Example of Coherence Tuning Mechanism
       13.7.2   Operation
14. Definition of Contrast
15. Complementary Lithography 1. Outline Conventionally, the two-beam interference apparatus is known as an apparatus for exposing micro line-and-space patterns on a wafer. The two-beam interference apparatus causes two light beams to interfere, in order to form interference patterns having a high contrast on the wafer. The present disclosure relates to such a two-beam interference apparatus.

2. Description of Terminologies

Next, the following definitions are made with respect to terminologies used in the present disclosure. An upstream side is defined as a side closer to a light source along an optical path of laser light. In addition, a downstream side is defined as a side closer to an exposure surface along the optical path of the laser light. A prism is defined as an optical element having a triangular prism shape or a shape similar thereto, and capable of transmitting light including the laser light. A top surface and a bottom surface of the prism may have a triangular shape or a shape similar thereto. Three surfaces that connect to both the top surface and the bottom surface of the prism at an angle of approximately 90° are referred to as side surfaces. In the case of a right angle prism, the side surface that does not connect to the other two surfaces at an angle of 90° is referred to as a sloping surface. An optical element obtained by deforming the shape of the prism, such as by grinding the peak of the prism, is also included in the prism referred to in the present disclosure. An optical axis may be an axis that passes an approximate center of a beam cross section of the laser light along a propagating direction of the laser light.

In the present disclosure, a Z-direction is defined as the propagating direction of the laser light. In addition, an X-direction is defined as one direction perpendicular to the Z-direction, and a Y-direction is defined as a direction perpendicular to both the X-direction and the Z-direction. The propagating direction of the laser light is the Z-direction, however, the X-direction and the Y-direction may change depending on the position of the laser light referred to in the description. For example, when the propagating direction (Z-direction) of the laser light changes within an XZ-plane, the X-direction after the change in the propagating direction changes depending on the change in the propagating direction, but the Y-direction does not change. On the other hand, when the propagating direction (Z-direction) of the laser light changes within a YZ-plane, the Y-direction after the change in the propagating direction changes depending on the change in the propagating direction, but the X-direction does not change. In each of the figures, for the shown optical elements, a coordinate system may be illustrated to facilitate the understanding where appropriate, with respect to the laser light incident to an optical element located at a most upstream side, and the laser light output from an optical element located at a most downstream side.

With regard to a reflection optical element, when an incident plane is defined as a plane including both an optical axis of the laser light incident to the optical element and the optical axis of the laser light reflected by the optical element, a "S-polarized" is defined as a polarization state in a direction perpendicular to the incident plane. On the other hand, a "P-polarized" is defined as a polarization state in a direction perpendicular to the optical axis and parallel to the incident plane.

3. Two-Beam Interference Exposure System (First Embodiment)

First, a detailed description will be given with respect to the two-beam interference exposure system in a first embodiment of the present disclosure, with reference to the drawings.

3.1 Configuration

FIG. 1 is a diagram schematically illustrating a configuration of a two-beam interference exposure system 1 in the first embodiment. As illustrated in FIG. 1, the two-beam interference exposure system 1 may include a laser device 10 and a two-beam interference apparatus 100.

The laser device 10 may output ultraviolet laser light. For example, the laser device 10 may be formed by an ultraviolet laser device that outputs laser light L1 in a wavelength band of KrF (248.4 nm) or ArF (193.4 nm).

The two-beam interference apparatus 100 may include a beam tuning unit 110, a high reflection mirror 121, a beam splitter 122, an optical path correcting plate 123, a high reflection mirrors 124 and 125, and a wafer stage 130. A wafer 131 may be set on the wafer stage 130.

The beam tuning unit 110, the high reflection mirror 121, and the beam splitter 122 may be arranged in this order in an optical path of the laser light L1 output from the laser device 10 towards the downstream side.

The high reflection mirror 124 and the wafer 131 on the wafer stage 130 may be arranged in this order in an optical path of laser light L2a transmitted through the beam splitter 122 towards the downstream side. The optical path correcting plate 123, the high reflection mirror 125, and the wafer 131 on the wafer stage 130 may be arranged in this order in an optical path of laser light L2b reflected by the beam splitter 122 towards the downstream side.

The beam tuning unit 110 may be formed by a beam expander that enlarges a cross section of the laser light L1 output from the laser device 10 to a desired size. The desired size may be determined depending on a size of a beam spot to be formed on the wafer 131.

The high reflection mirrors 121, 124, and 125 may reflect laser light L2, the laser light L2a, and the laser light L2b, respectively, with a high reflectivity. A reflection surface of each of the high reflection mirrors 121, 124, and 125 may be coated with a film that reflects light having a wavelength corresponding to that of the laser light L2 with a high reflectivity.

An input surface of the beam splitter 122 to which the laser light L2 is incident may be coated with a film that reflects approximately 50% of the laser light L2 and transmits approximately 50% of the laser light L2. In addition, an output surface of the beam splitter 122 from which the transmitted laser light L2a is output may be coated with a reflection preventing film that reduces reflectivity of the laser light L2a.

Both surfaces of the optical path correcting plate 123 may be coated with a reflection preventing film. The optical path correcting plate 123 may be made of the same material as and have the same thickness as the beam splitter 122. Hence, it is possible to substantially match a length of the optical path of the laser light L2a transmitted through the beam splitter 122 and reaching the wafer 131 and a length of the optical path of the laser light L2b reflected by the beam splitter 122 and reaching the wafer 131.

The wafer stage 130 may be formed by a variable stage that variably adjusts a position and an inclination of the wafer 131.

3.2 Operation

Next, a description will be given of an operation of the two-beam interference exposure system 1 illustrated in FIG. 1.

The laser light L1 output from the laser device 10 may be incident to the beam tuning unit 110 of the two-beam interference apparatus 100. The beam tuning unit 110 may enlarge the beam cross section of the incident laser light L1.

The laser light L2 output from the beam tuning unit 110 may be incident to the beam splitter 122 via the high reflection mirror 121. The beam splitter 122 may transmit approximately 50% of the incident laser light L2 as the laser light L2a, and may reflect approximately 50% of the incident laser light L2 as the laser light L2b.

The laser light L2a transmitted through the beam splitter 122 may be reflected by the high reflection mirror 124 to become incident to the wafer 131 at an incident angle θ. On the other hand, the laser light L2b reflected by the beam splitter 122 may be transmitted through the optical path correcting plate 123 to be reflected by the high reflection mirror 125. The laser light L2b reflected by the high reflection mirror 125 may be incident to the wafer 131 at an incident angle −θ that is axisymmetrical to the laser light L2a, with respect to an axis approximately perpendicular to the surface of the wafer 131.

3.3 Effects

Figure 2A:
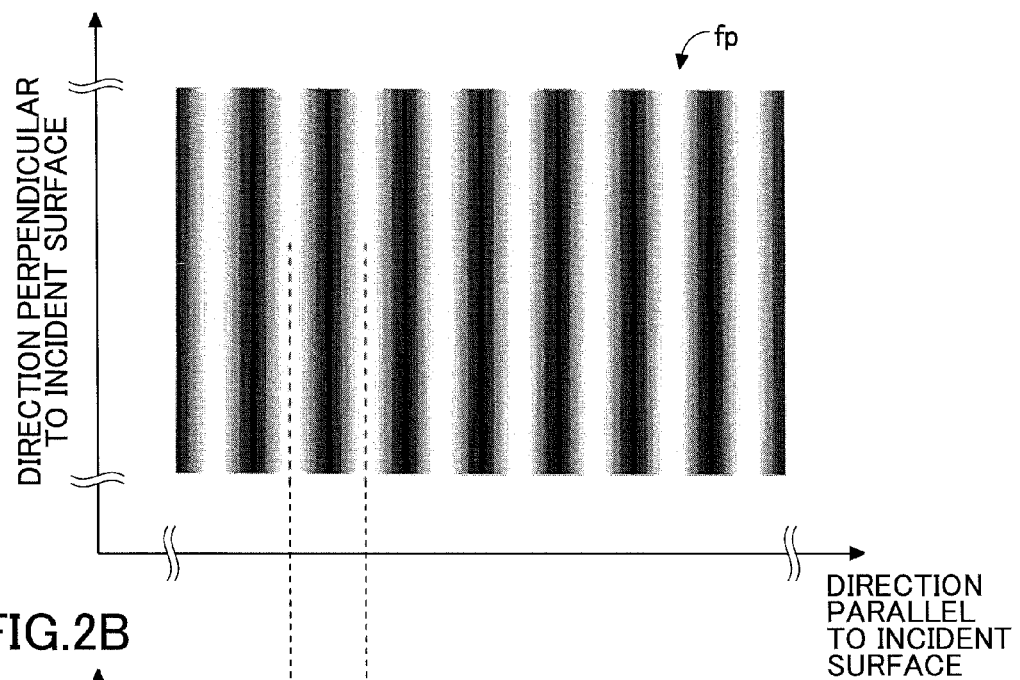
FIGS. 2A and 2B are diagrams illustrating an example of interference fringes formed on a wafer by laser light in the first embodiment.
Figure 2B:
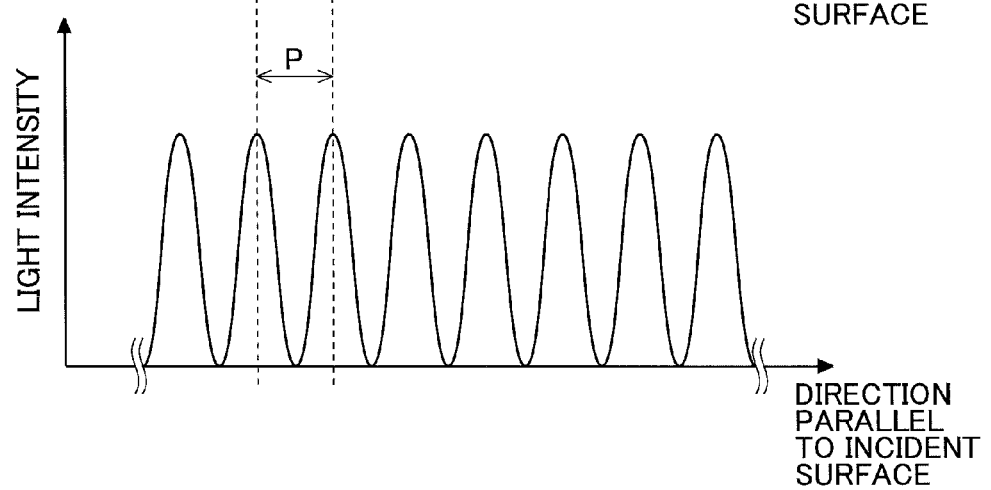

FIGS. 2A and 2B are diagrams illustrating an example of interference fringes fp formed on the wafer 131 by the laser light L2a and the laser light L2b. FIG. 2A illustrates an image of the interference fringes fp, and FIG. 2B illustrates a light intensity distribution of the interference fringes fp.

As illustrated in FIGS. 2A and 2B, the two laser light L2a and L2b are caused to interfere with each other, so that the interference fringes fp, arranged at a predetermined half pitch interval P in a direction parallel to the incident plane on the wafer 131 to which the laser light L2a and L2b are incident, may be formed on the wafer 131. The two laser light L2a and L2b preferably have high spatial coherence and high time coherence, in order to generate interference fringes having a high contrast on the wafer 131. The spatial coherence may depend on respective spatial phases of the two laser light L2a and L2b, and may affect the contrast of the interference fringes fp that are generated when the two laser light L2a and L2b overlap on the wafer 131. In order to form the interference fringes fp having the high contrast on the wafer 131, the two laser light L2a and L2b preferably have a high spatial coherence. A definition of the contrast will be given later in the specification.

In this embodiment, the time coherence may depend on a difference between optical path lengths of the two laser light L2a and L2b. The interference fringes fp may be generated on the wafer 131 when the difference between the optical path lengths is within a coherent length $lc(=\lambda^2/\Delta\lambda)$ that is obtained from a spectral line width Δλ of the laser light L1. For example, when the spectral line width Δλ of the ArF laser for the exposure apparatus is assumed to be approximately 0.3 pm, the coherent length lc may be 12.5 cm. In a case in which a difference Lc between the optical path lengths (difference between optical path lengths of the two laser light L2a and L2b) of the interference fringes fp formed on the wafer 131 at an end part on the wafer 131 is smaller than the coherent length lc (that is, Lc <lc), the interference fringes fp having a high contrast may be formed. In addition, when a range in which the interference fringes fp are to be formed is large, the spectral line width Δλ of the laser light L1 output from the laser device 10 is preferably set narrow.

The half pitch interval P of the interference fringes fp may be represented by the following formula (1).

$$P=\lambda/(2n\cdot\sin\theta) \quad (1)$$

As represented by the formula (1) above, the half pitch interval P of the interference fringes fp may depend on the wavelength λ of the laser light L1, a refractive index n of a medium at the exposure position, and the incident angle θ to the wafer 131. For example, when the laser device 10 is formed by the ArF laser (with a wavelength of 193.4 nm), the incident angle θ is 75°, and the medium is air (n=1), the half pitch interval P of the interference fringes fp may be approximately 100 nm. Hence, the exposure may be carried out at a half pitch interval of approximately 100 nm.

4. Two-Beam Interference Exposure Apparatus With Tunable Beam Profile (Second Embodiment)

Next, a detailed description will be given of the two-beam interference exposure system in a second embodiment of the present disclosure, with reference to the drawings. In the following description, those constituent elements that are similar to those described above are designated by the same reference characters, and redundant description thereof will be omitted.

4.1 Configuration

Figure 3:
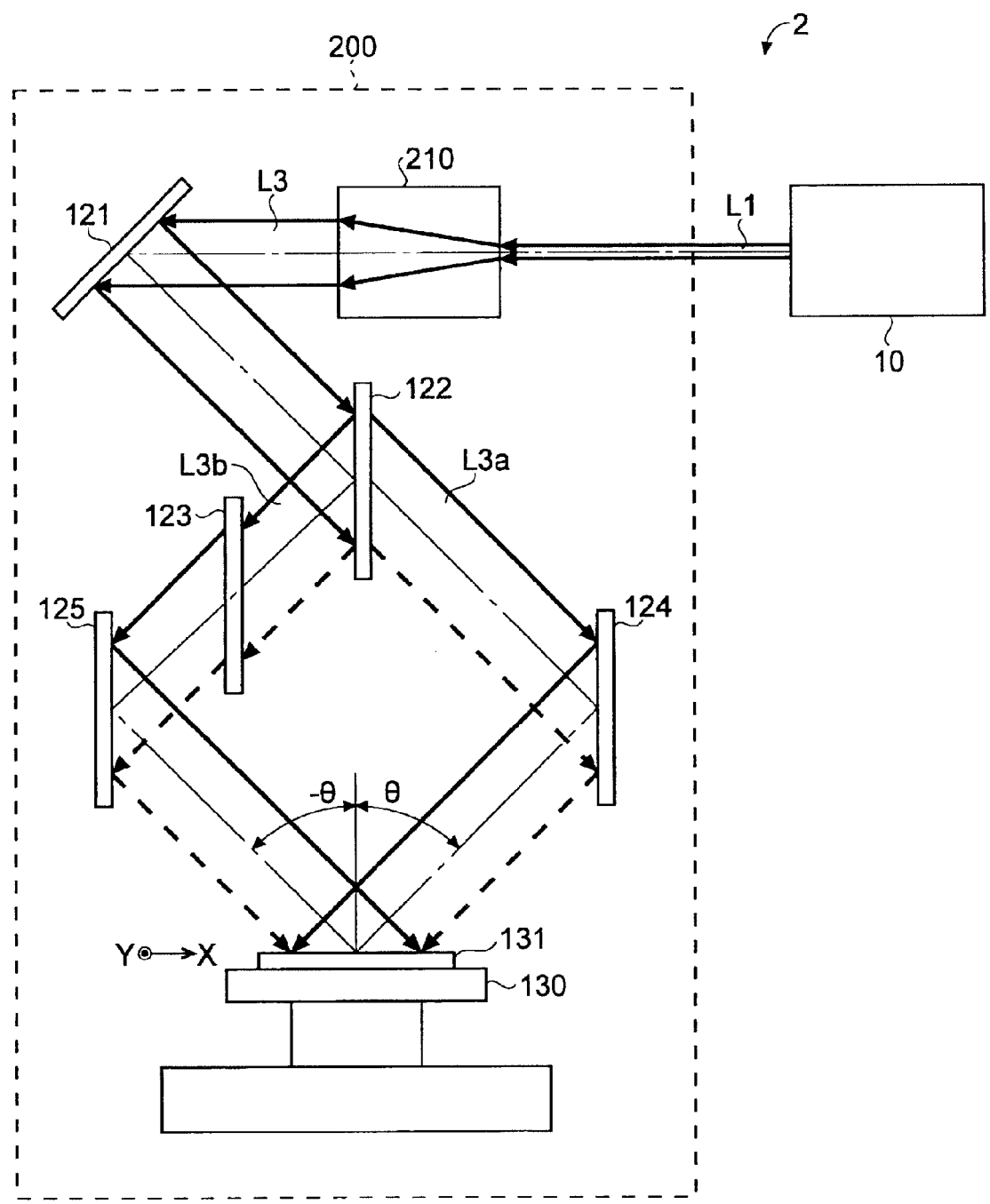
FIG. 3 is a diagram schematically illustrating a configuration of the two-beam interference exposure system in a second embodiment.

FIG. 3 is a diagram schematically illustrating a configuration of a two-beam interference exposure system 2 in the second embodiment. As illustrated in FIG. 3, the two-beam interference exposure system 2 may include a laser device 10 and a two-beam interference apparatus 200. The two-beam interference apparatus 200 may have a configuration similar to that of the two-beam interference apparatus 100 illustrated in FIG. 1. However, the beam tuning unit 110 may be replaced by a beam tuning unit 210.

The beam tuning unit 210 may tune the beam profile of the laser light L1. In a case in which the beam profile of the laser light L1 having a circular cross section has a Gaussian shape having a strong light intensity near the optical axis, for example, the beam tuning unit 210 may tune this beam profile into a beam profile having a light intensity distribution that is flat in a predetermined region. In the present disclosure, the shape of the beam profile having the light intensity distribution that is flat in the predetermined region may be referred to as a top hat shape.

4.1.1 Gaussian Beam Tuning Unit

Figure 4:
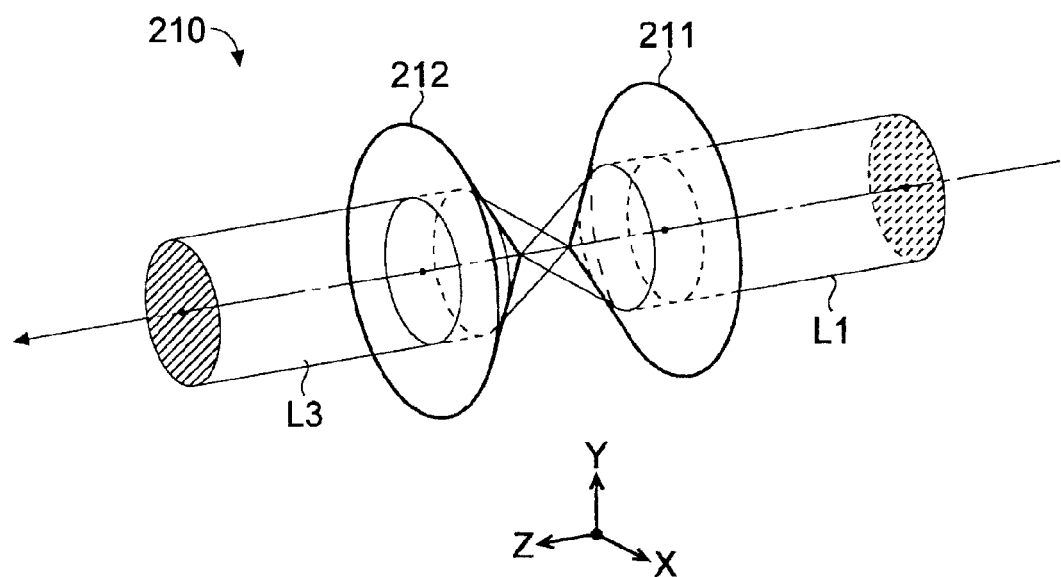
FIG. 4 is a diagram illustrating an example of a beam tuning unit for a Gaussian beam in the second embodiment.
Figure 5:
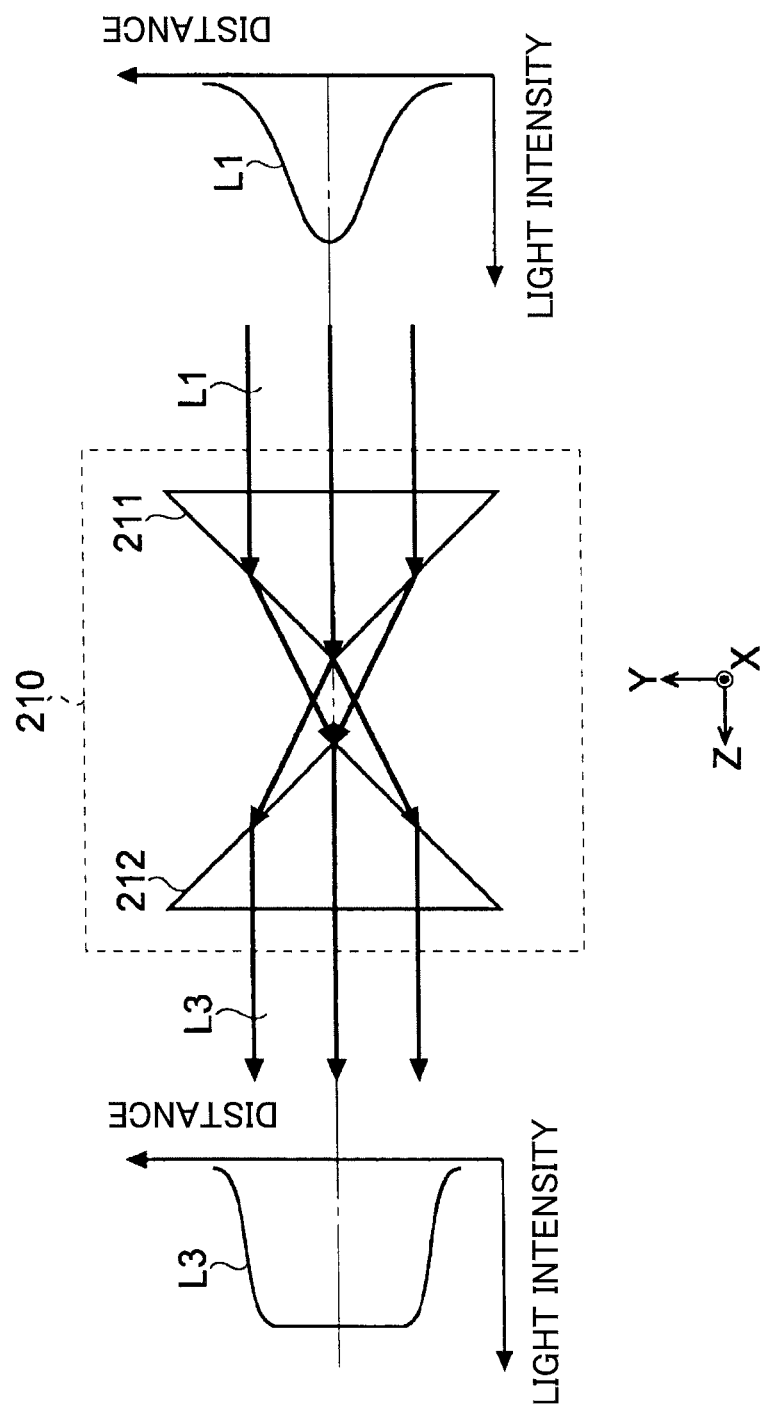
FIG. 5 is a diagram illustrating examples of beam profiles of laser light input to the beam tuning unit and laser light output from the beam tuning unit in the second embodiment.

FIG. 4 is a diagram illustrating an example of the beam tuning unit 210 for a Gaussian beam. FIG. 5 is a diagram illustrating examples of beam profiles of the laser light L1 input to the beam tuning unit 210 and laser light L3 output from the beam tuning unit 210.

As illustrated in FIG. 4, the beam tuning unit 210 may include two axicon lenses 211 and 212, for example. Center axes of cylindrical parts of the two axicon lenses 211 and 212 may lie approximately on a single straight line, and the two axicon lenses 211 and 212 may be arranged so that vertexes thereof oppose each other. In addition, as illustrated in FIG. 5, the positions of the two axicon lenses 211 and 212 may be aligned so that an outer peripheral part of the laser light L1 incident to a bottom surface of the axicon lens 211 on the incident side becomes incident near the vertex of the axicon lens 212 on the output side, for example. By employing such an arrangement for the axicon lenses 211 and 212, the beam tuning unit 210 may convert the laser light L1 having the Gaussian shaped beam profile into the laser light L3 having the top hat shaped beam profile, as illustrated in FIG. 5.

4.2 Effects

In a case in which the laser device 10 outputs the laser light L1 in the single transverse mode, the laser light L3 having the top hat shaped beam profile may be generated without varying the wave front of the laser light L1, by using the beam tuning unit 210 described above. Hence, a peak intensity of each of the peaks in the interference fringes fp generated on the wafer 131 may be made uniform. As a result, it may be advantageous in that uniform line-and-space patterns may be formed.

The beam tuning unit 210 may include a beam expander to convert the size of the beam cross section of the laser light L1, in addition to the two axicon lenses 211 and 212. The beam expander may be arranged on the downstream side than the two axicon lenses 211 and 212. Other configuration, operation, and effects may be similar to those of the first embodiment described above.

5. Two-Beam Interference Exposure System Using Narrow Band Excimer Laser Device (Third Embodiment)

Next, a detailed description will be given of the two-beam interference exposure system in a third embodiment of the present disclosure, with reference to the drawings. In the following description, those constituent elements that are similar to those described above are designated by the same reference characters, and redundant description thereof will be omitted.

5.1 Configuration

Figure 6:
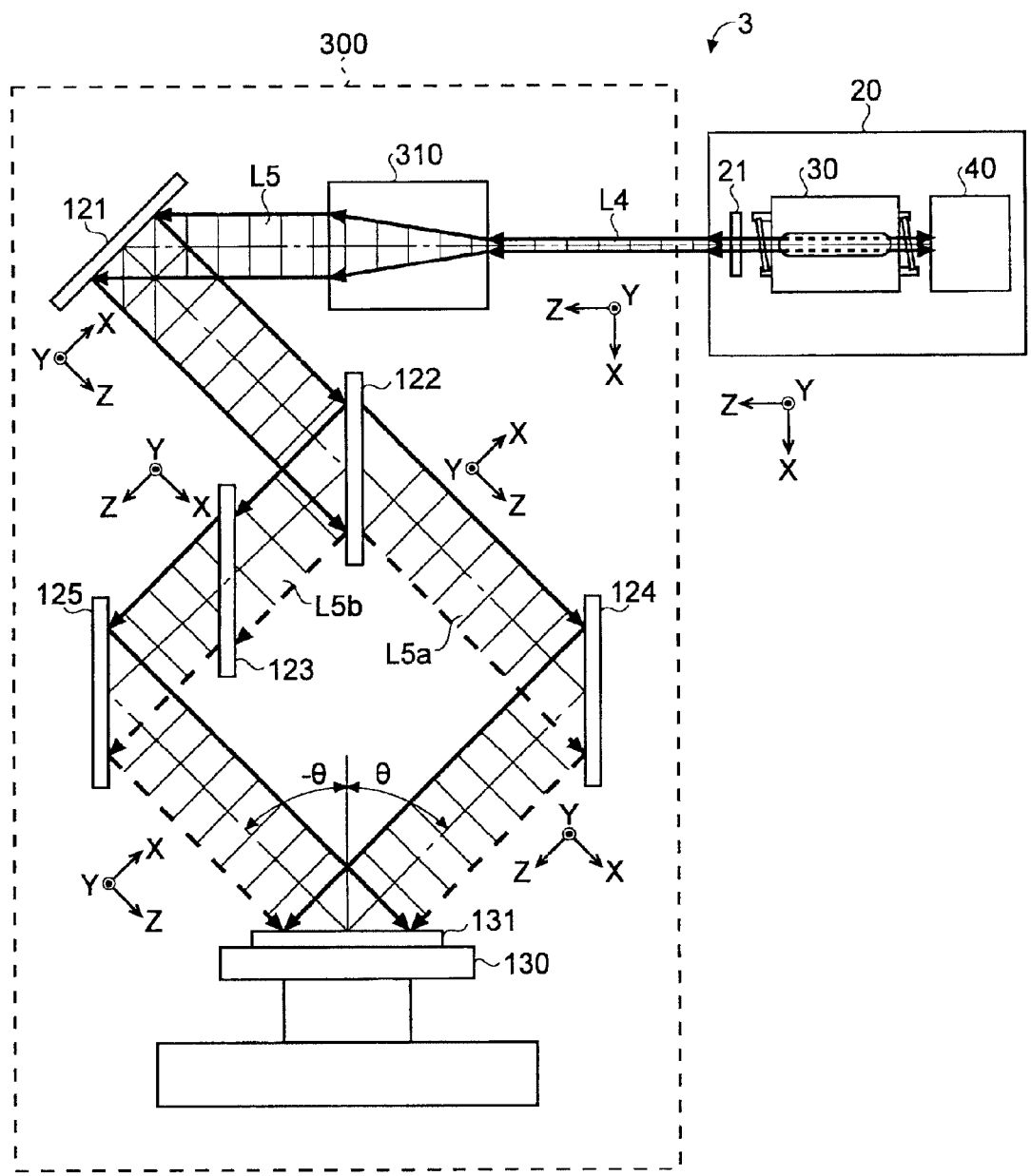
FIG. 6 is a diagram schematically illustrating a configuration of the two-beam interference exposure system in a third embodiment.

FIG. 6 is a diagram schematically illustrating a configuration of a two-beam interference exposure system 3 in the third embodiment. As illustrated in FIG. 6, the two-beam interference exposure apparatus 3 may include an excimer laser device 20 and a two-beam interference apparatus 300. The excimer laser device 20 may be a KrF excimer laser or an ArF excimer laser, for example. The two-beam interference apparatus 300 may have a configuration similar to that of the two-beam interference apparatus 100 illustrated in FIG. 1. However, the beam tuning unit 110 may be replaced by a beam tuning unit 310.

5.1.1 Narrow Band Excimer Laser Device

Figure 7:
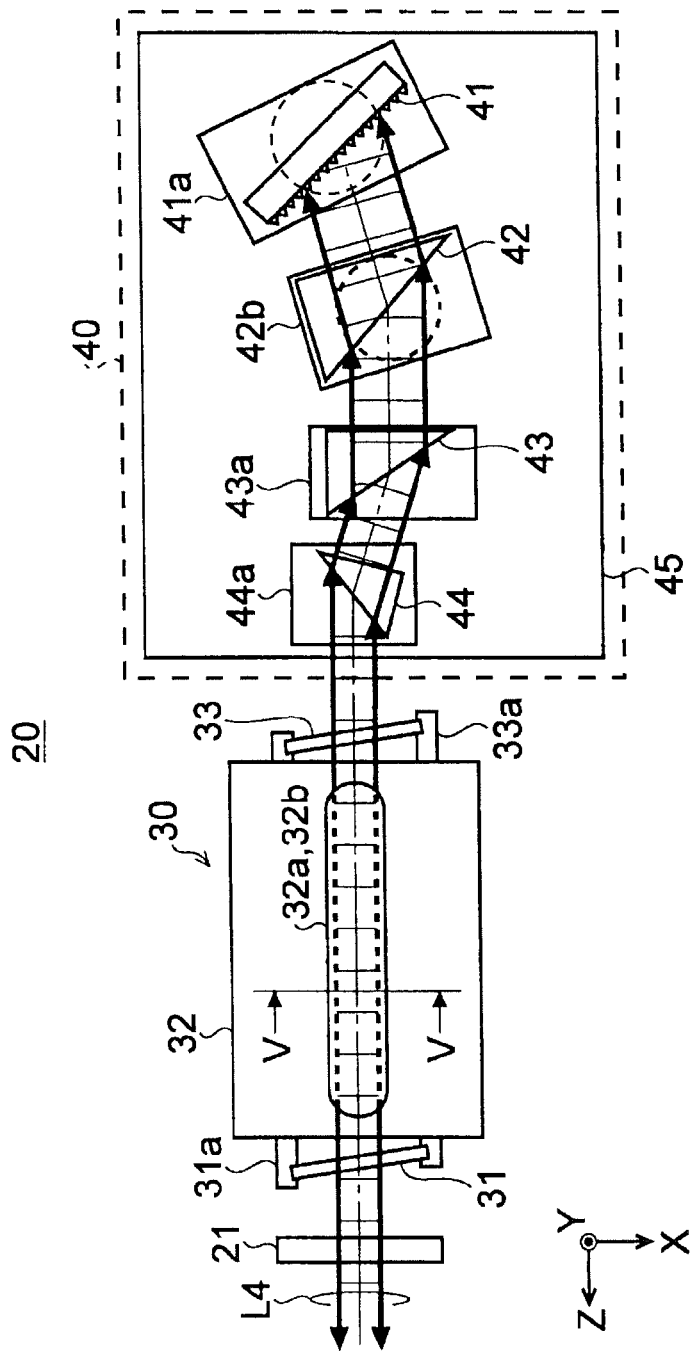
FIG. 7 is a top view illustrating an example of an excimer laser device in the third embodiment.
Figure 8:
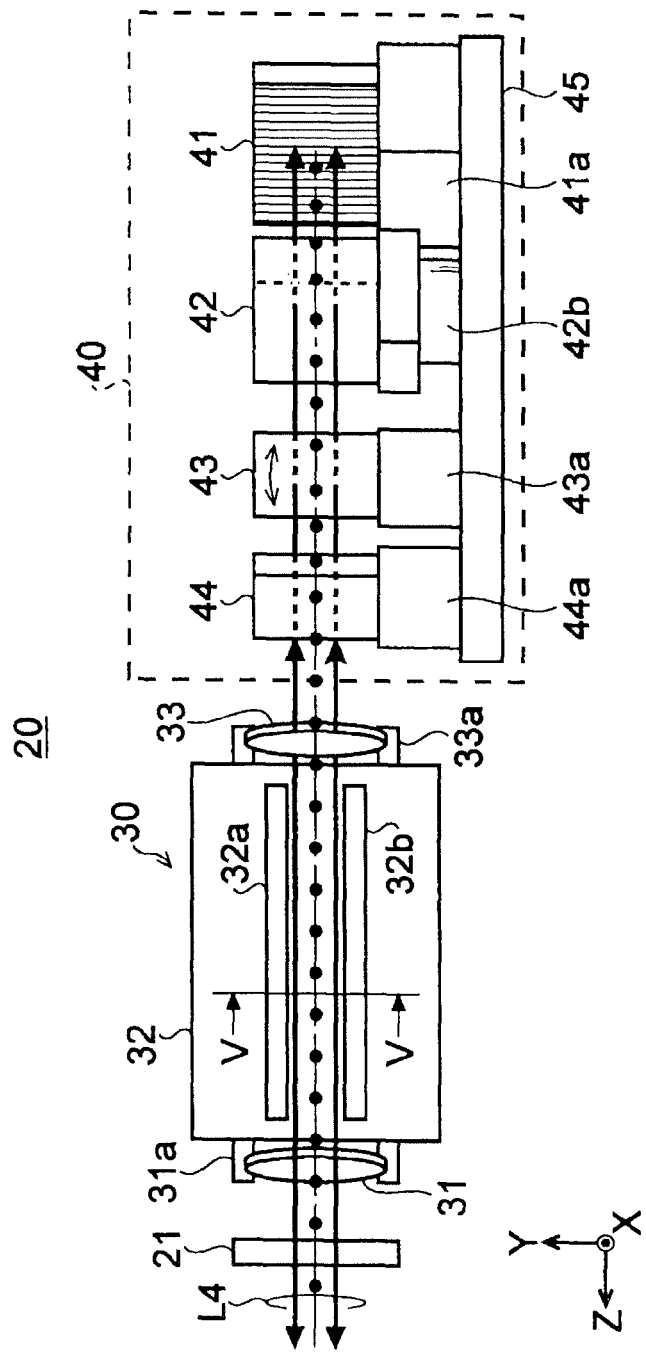
FIG. 8 is a side view illustrating the excimer laser device illustrated in FIG. 7.

FIG. 7 is a diagram illustrating an example of the excimer laser device 20, viewed from the same direction as FIG. 6. FIG. 8 is a side view illustrating the excimer laser device 20 illustrated in FIG. 7. As illustrated in FIGS. 7 and 8, the excimer laser device 20 may include an output coupling mirror 21, an amplifier unit 30, and a line narrow module 40.

The line narrow module 40 may include a plurality of prisms 42, 43 and 44, and a grating 41. The grating 41 and the output coupling mirror 21 may form an optical resonator. The grating 41 may function as a wavelength selection unit. The grating 41 may be held on a rotary table 41a that is rotatable within a plane parallel to the paper in FIG. 7. The wavelength of the laser light output from the grating 41 towards the output coupling mirror 21 may be tuned by adjusting a rotary angle of the rotary table 41a. An oscillation wavelength of the excimer laser device 20 may be tuned by the tuning of the wavelength of the laser light output from the grating 41. The plurality of prisms 43 and 44 may be fixed on a base 43a and 44a, respectively. The prism 42 may be held on a rotary table 42b that is rotatable within the plane parallel to the paper in FIG. 7. The beam cross section of the laser light incident to the grating 41 may be enlarged or reduced by adjusting a rotary angle of the rotary table 42b. A spectral line width of laser light L4 may be adjusted by the enlarging or reducing of the beam cross section of the laser light incident to the grating 41. The rotary table 41a, the base 43a, the base 44a, and the rotary table 42b may be provided on a frame 45.

The amplifier unit 30 may amplify the laser light reciprocating within the optical resonator. The amplifier unit 30 may include a laser chamber 32, windows 31 and 33, and a pair of excitation electrodes 32a and 32b. The windows 31 and 33 may be arranged to be inclined by the Brewster's angle with respect to the optical axis of the laser light reciprocating within the optical resonator. The inside of the laser chamber 32 may be filled with excimer gas forming the laser medium. The excimer gas may include various laser gasses such as a mixture gas of Ne gas, Kr gas and $F_2$ gas, and a mixture gas of Ne gas, Ar gas and $F_2$ gas. An excitation voltage from a power supply (not illustrated) may be applied to the excitation electrodes 32a and 32b under the control of a controller (not illustrated).

According to the configuration described above, each transmission optical element (windows 31 and 33, and prisms 42, 43 and 44) arranged within the optical resonator may transmit more P-polarized component of the incident laser light than the S-polarized component of the incident laser light. In FIGS. 7 and 8, the linearly polarized light in the X-direction is P-polarized with respect to the windows 31 and 33 and the prisms 42, 43 and 44. By employing such an arrangement and combination, the laser light L4 output from the output coupling mirror 21 may be made linearly polarized substantially in the X-direction.

5.1.2 Spatial Coherence of Narrow Band Excimer Laser Device

Figure 9:
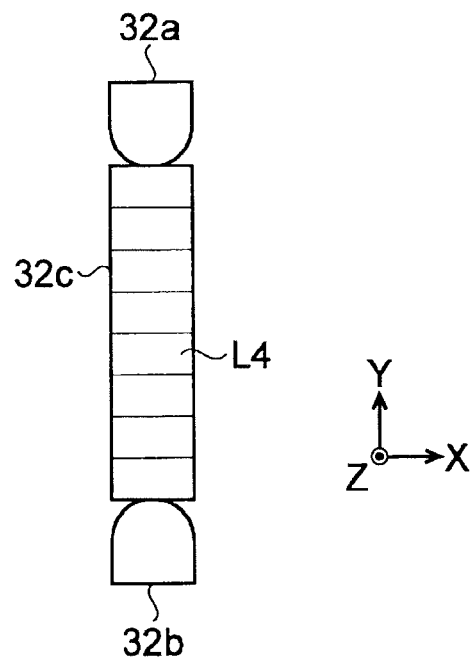
FIG. 9 is a diagram illustrating an example of an arrangement of excitation electrodes within an amplifier in the third embodiment.
Figure 10:
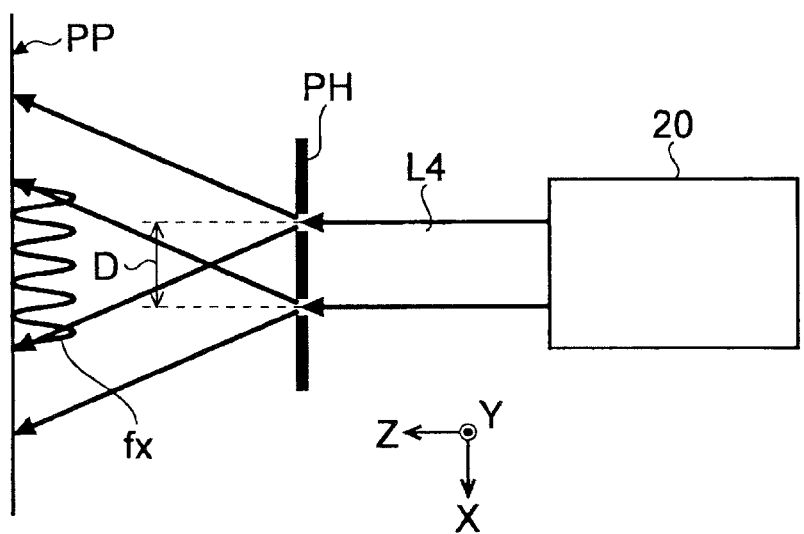
FIG. 10 is a diagram illustrating an X-direction spatial coherence of the laser light output from the excimer laser device in the third embodiment.
Figure 11:
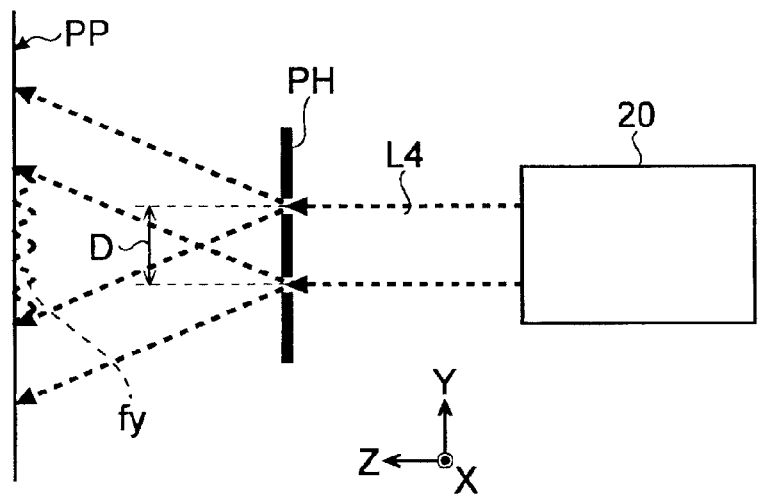
FIG. 11 is a diagram illustrating a Y-direction spatial coherence of the laser light output from the excimer laser device in the third embodiment.
Figure 12:
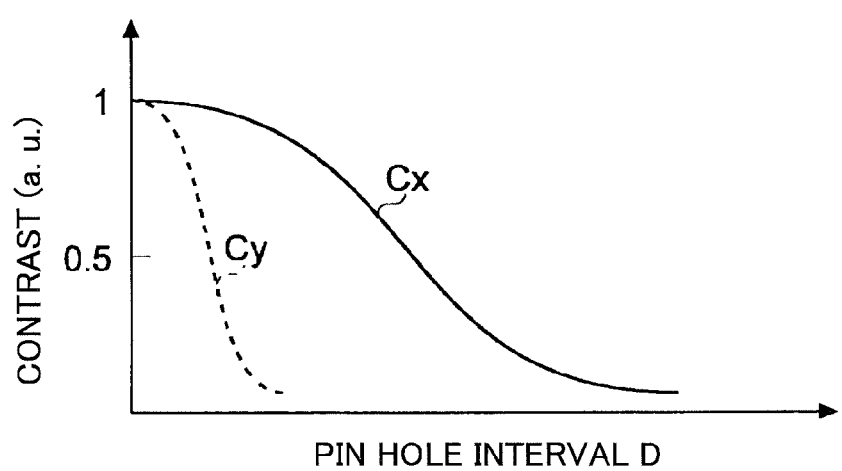
FIG. 12 is a diagram illustrating a relationship of contrasts of the interference fringes of the laser light output from the excimer laser device in the third embodiment with respect to a pin hole interval in the X-direction and the Y-direction, respectively.

FIG. 9 is a diagram illustrating an example of an arrangement of the excitation electrodes 32a and 32b within the amplifier unit 30 and a cross section of a discharge region 32c. FIG. 10 schematically illustrates interference fringes fx of the laser light L4 output from the excimer laser device 20 in the X-direction. FIG. 11 schematically illustrates interference fringes fy of the laser light L4 output from the excimer laser device 20 in the Y-direction. FIG. 12 is a diagram illustrating a relationship of contrasts of the interference fringes fp of the laser light L4 output from the excimer laser device 20 with respect to a pin hole interval D in the X-direction and the Y-direction, respectively. A curve Cx in FIG. 12 indicates the contrast of the interference fringes fx normalized by taking a maximum value as "1". Similarly, a curve Cy in FIG. 12 indicates the contrast of the interference fringes fy normalized by taking the maximum value as "1". An example of a target numerical value of the contrast may be 10% or greater when the pin hole interval D is D=1 mm.

As illustrated in FIG. 9, a cross section of the discharge region 32c that is formed between the excitation electrodes 32a and 32b arranged within the amplifier unit 30, taken in a direction perpendicular to the optical axis, may have an approximately rectangular shape that is elongated in the direction in which the excitation electrodes 32a and 32b are arranged, for example. The direction in which the excitation electrodes 32a and 32b are arranged may coincide with the Y-direction, for example. The contrast of the interference fringes fx formed by projecting the laser light L4 onto a projection plane PP via double pin holes PH arranged in the X-direction in FIG. 10 may be compared with the contrast of the interference fringes fy formed by projecting the laser light L4 onto the projection plane PP via the double pin holes PH arranged in the Y-direction in FIG. 11. FIG. 12 may be a graph that is obtained by normalizing the contrasts of the interference fringes fx and the interference fringes fy in the arrangements illustrated in FIGS. 10 and 11, and plotting normalized values with respect to the pin hole interval D. In FIG. 12, the contrast of the interference fringes fx may be higher than the contrast of the interference fringes fy. In the laser light L4 that is generated based on the discharge region 32c illustrated in FIG. 9, the spatial coherence in the X-direction may be higher than the spatial coherence in the Y-direction.

Hence, in the third embodiment, the laser light L4 may be subjected to the two-beam interference in the direction in which the spatial coherence is high. For example, in FIG. 6, the laser light L4 may be split into laser light L5a and laser light L5b with respect to the X-direction of the laser light L4, in order to cause the two-beam interference of the laser light L5a and the laser light L5b. Thus, a high contrast may be obtained for the interference fringes fp formed on the wafer 131 by the laser light L5a and the laser light L5b. In addition, as described above in conjunction with FIGS. 7 and 8, the polarization direction of the laser light L4 may be the X-direction, and the optical elements within the resonator may be arranged in order to obtain a high transmittance. The interval D of the double pin holes PH may correspond to an overlap error of the two laser light L5a and L5b on the wafer 131 in the two-beam interference apparatus 300.

5.1.3 Excimer Laser Beam Tuning Unit

Figure 13:
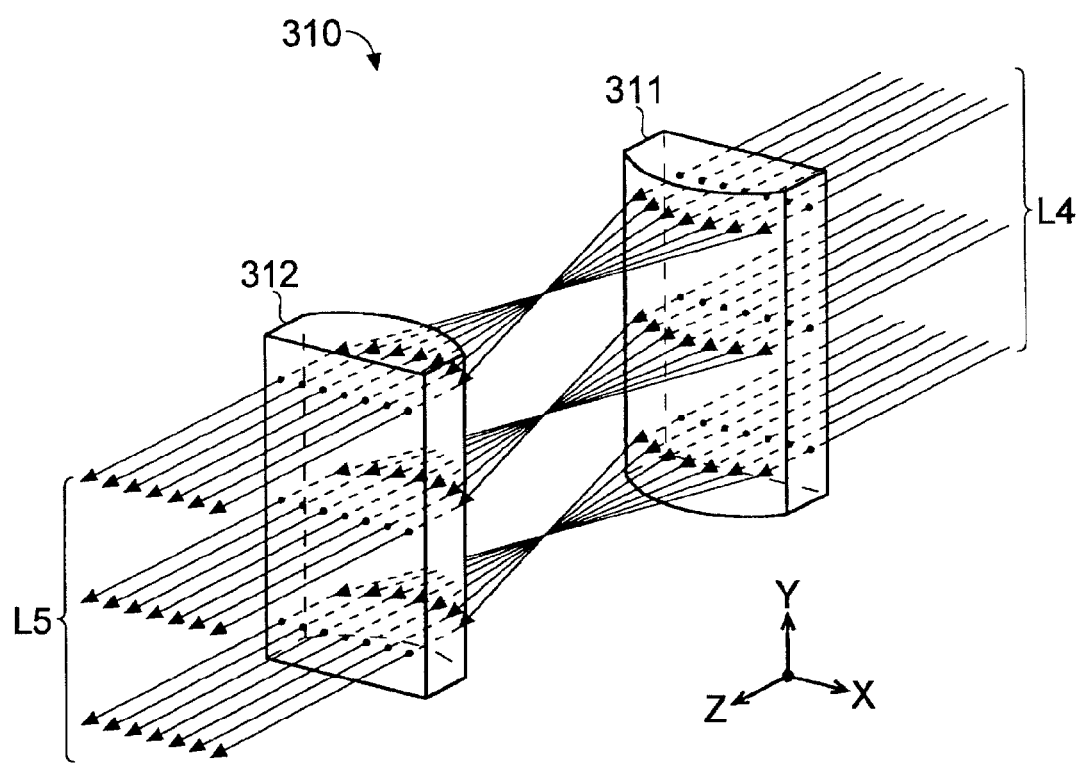
FIG. 13 is a diagram illustrating an example of the beam tuning unit for the excimer laser in the third embodiment.
Figure 14:
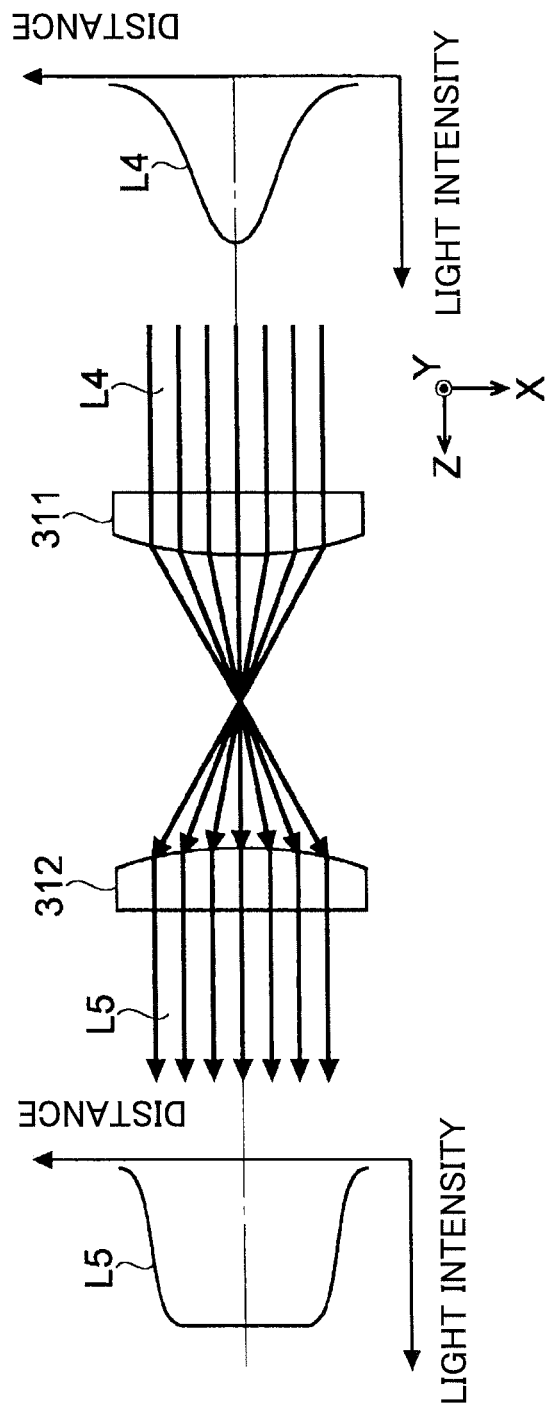
FIG. 14 is a diagram illustrating examples of beam profiles of the laser light incident to the beam tuning unit and the laser light output from the beam tuning unit in an XZ-plane in the third embodiment.
Figure 15:
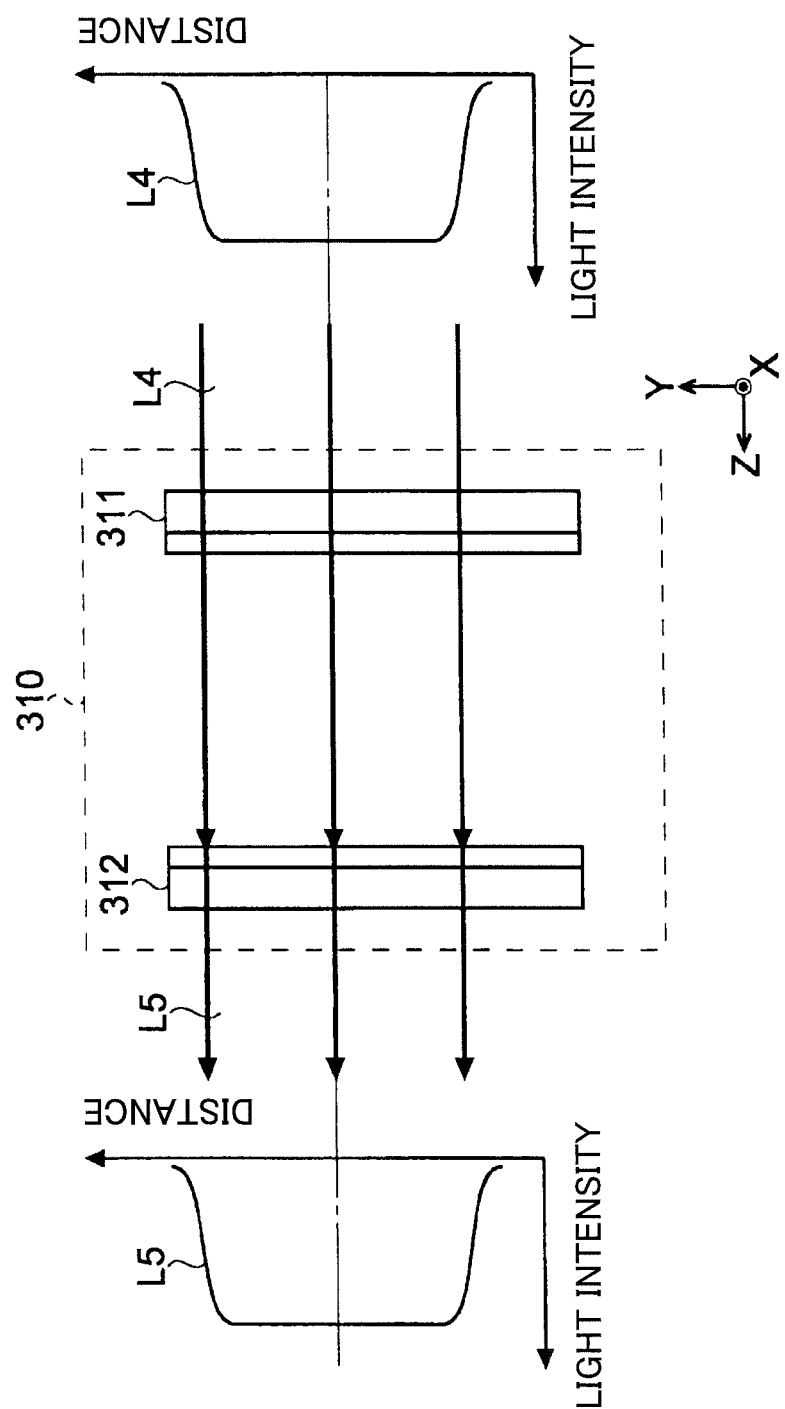
FIG. 15 is a diagram illustrating examples of beam profiles of the laser light incident to the beam tuning unit and the laser light output from the beam tuning unit in a YZ-plane in the third embodiment.

FIG. 13 is a diagram illustrating an example of the beam tuning unit 310 for the excimer laser. FIG. 14 is a diagram illustrating examples of beam profiles of the laser light L4 incident to the beam tuning unit 310 and the laser light L5 output from the beam tuning unit 310 in an XZ-plane. FIG. 15 is a diagram illustrating examples of beam profiles of the laser light L4 incident to the beam tuning unit 310 and the laser light L5 output from the beam tuning unit 310 in a YZ-plane.

As illustrated in FIG. 13, the beam tuning unit 310 may include two cylindrical lenses 311 and 312, for example. The two cylindrical lenses 311 and 312 may be arranged so that convex surfaces thereof oppose each other.

In addition, as illustrated in FIG. 14, the beam profile of the laser light L4 output from the excimer laser device 20 by the discharge excitation may be close to a Gaussian shape with respect to the X-direction that is perpendicular to the Y-direction, when the discharge direction is assumed to be the Y-direction. In addition, as illustrated in FIG. 15, this beam profile may be close to a top hat shape with respect to the direction parallel to the Y-direction.

Hence, as illustrated in FIG. 14, the beam profile of the laser light L4 in the X-direction may be converted into the top hat shape by tuning the light intensity distribution by the cylindrical lens 311. In this case, the wave front in the X-direction distorted by the cylindrical lens 311 may be corrected by the cylindrical lens 312 into a substantially plane wave.

On the other hand, as illustrated in FIG. 15, with respect to the beam profile of the laser light L4 in the Y-direction, the cylindrical lenses 311 and 312 may transmit the laser light L4 as the laser light L5 by making substantially no correction on the laser light L4. As a result, the beam profile of the laser light L5 may have the top hat shape in both the X-direction and the Y-direction.

5.2 Effects

As described above, the excimer laser device 20 may output the laser light L4 with the beam cross section having a shape elongated in the discharge direction (Y-direction). In addition, the spatial coherence of the laser light L4 may be higher in the direction (X-direction) perpendicular to the discharge direction than in the direction parallel to the discharge direction. For this reason, when the excimer laser device 20 is used as the light source, the excimer laser device 20 and the two-beam interference apparatus 300 may be arranged and combined so that the two laser light L5a and L5b interfere in the direction (X-direction) in which the spatial coherence is higher. Accordingly, the contrast of the interference fringes fp formed on the wafer 131 may be improved.

By combining the beam tuning unit 310 to the excimer laser device 20, the laser light L4 output from the excimer laser device 20 may be converted into the laser light L5 that has the beam profile having the top hat shape in both the X-direction and the Y-direction and having the wave front that is close to the plane wave. In this case, the plurality of peak intensities of the interference fringes fp generated on the wafer 131 may be made even more uniform. As a result, the line-and-space patterns may be formed with a high accuracy because the energy distribution of the laser light that exposes a resist with which the wafer 131 is coated may be made even more uniform.

The beam tuning unit 310 may include a beam expander to convert the size of the beam cross section of the laser light L4, in addition to the two cylindrical lenses 311 and 312. The beam expander may be arranged on the downstream side of the two cylindrical lenses 311 and 312. Other configuration, operation, and effects may be similar to those of the first or second embodiment described above.

6. Two-Beam Interference Exposure System Combining Optical Retarder And Excimer Laser Device (Fourth Embodiment)

Next, a detailed description will be given of the two-beam interference exposure system in a fourth embodiment of the present disclosure, with reference to the drawings. In the following description, those constituent elements that are similar to those described above are designated by the same reference characters, and redundant description thereof will be omitted.

6.1 Configuration

Figure 16:
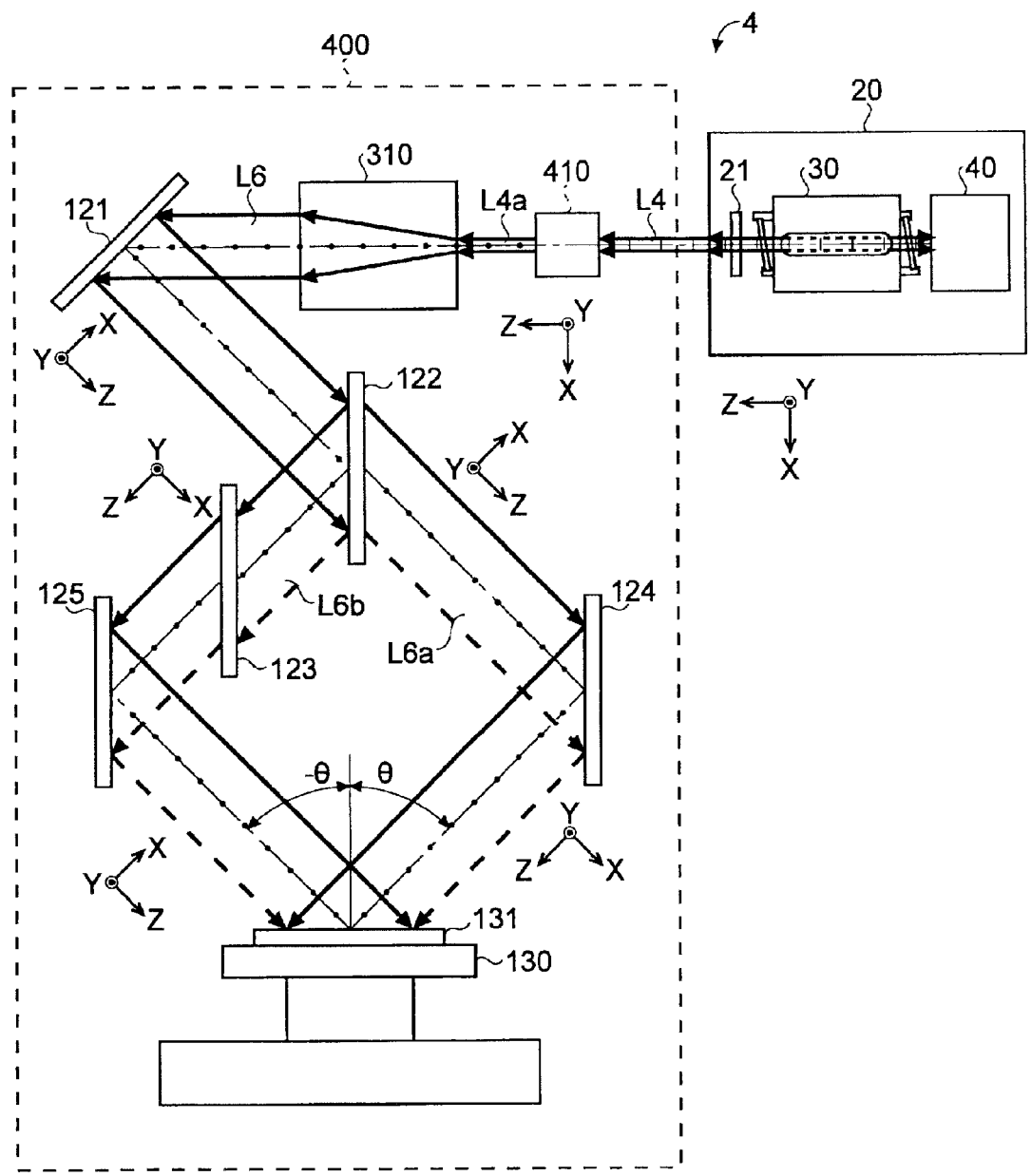
FIG. 16 is a diagram schematically illustrating a configuration of the two-beam interference exposure system in a fourth embodiment.

FIG. 16 is a diagram schematically illustrating a configuration of a two-beam interference exposure system 4 in the fourth embodiment. As illustrated in FIG. 16, the two-beam interference exposure system 4 may include an excimer laser device 20 and a two-beam interference apparatus 400. The two-beam interference apparatus 400 may have a configuration similar to that of the two-beam interference apparatus 300 illustrated in FIG. 6. However, the two-beam interference apparatus 400 may further include an optical retarder 410.

The optical retarder 410 may convert the polarization direction of the laser light L4 from the X-direction into the Y-direction, for example. The optical retarder 410 may include a λ/2 wave plate, an optical substrate coated with a film to shift the phase of the incident laser light by 180°, or the like. The optical retarder may be an example of an optical retarder that tilts the polarization direction of the laser light L4 in a rotating direction about the optical axis of the laser light L4.

6.2 Effects

When absolute values of the incident angles ±θ of the two laser light with respect to the wafer 131 become large, the effects of the polarization directions of the two laser light begin to appear in the interference of the two laser light. As described above, the polarization direction of the laser light L4 may be converted from the X-direction into the Y-direction by using the optical retarder 410, so that laser light L6a and L6b become incident to the wafer 131 with the S-polarization. In this case, the contrast of the interference fringes fp formed on the wafer 131 may be improved.

The optical retarder 410 may be arranged on the downstream side of the beam tuning unit 310. In addition, the beam tuning unit 310 may include a beam expander to convert the size of the beam cross section of the laser light L4, in addition to the two cylindrical lenses 311 and 312. The beam expander may be arranged on the downstream side of the two cylindrical lenses 311 and 312. Other configuration, operation, and effects may be similar to those of any of the first, second, and third embodiments described above.

7. Two-Beam Interference Exposure System With Alignment Adjusting System (Fifth Embodiment)

Next, a detailed description will be given of the two-beam interference exposure system in a fifth embodiment of the present disclosure, with reference to the drawings. In the following description, those constituent elements that are similar to those described above are designated by the same reference characters, and redundant description thereof will be omitted. In addition, this embodiment may be combined with other configurations of the present disclosure.

7.1 Configuration

Figure 17:
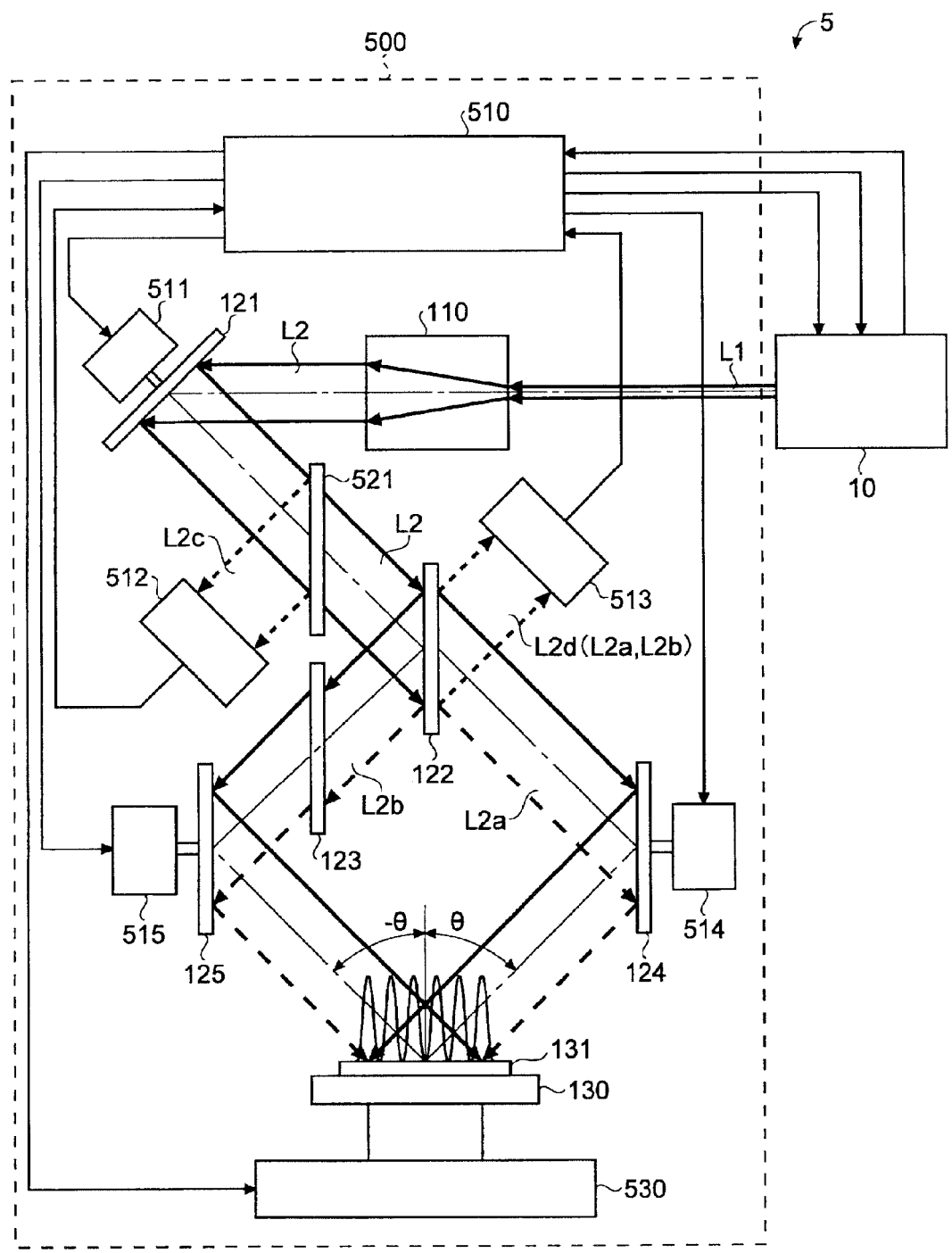
FIG. 17 is a diagram schematically illustrating a configuration of the two-beam interference exposure system in a fifth embodiment.

FIG. 17 is a diagram schematically illustrating a configuration of a two-beam interference exposure system 5 in the fifth embodiment. As illustrated in FIG. 17, the two-beam interference exposure system 5 may have a configuration similar to that of the two-beam interference exposure system 1 illustrated in FIG. 1. In addition, the two-beam interference exposure system 5 may further include a controller 510, actuators 511, 514 and 515, a beam splitter 521, an energy sensor 512, an image sensor 513, and a stage moving mechanism 530.

The beam splitter 521 may be arranged in an optical path of the laser light L2 at a state before the laser light L2 is split by the beam splitter 122. The energy sensor 512 may measure an energy of laser light L2c split by the beam splitter 521. For example, the energy sensor 512 may be formed by a photodiode. The energy sensor 512 may output a measured energy value to the controller 510.

For example, the image sensor 513 may be formed by a line sensor. The image sensor 513 may be formed by a CCD (Charge Coupled Device). The image sensor 513 may be formed by a plurality of line sensors or a plurality of CCDs. The image sensor 513 may measure interference fringes formed by laser light L2d in which the laser light L2a that is transmitted through the beam splitter 122 via the high reflection mirror 125 after being reflected by the wafer 131 and the laser light L2b that is reflected by the beam splitter 122 via the high reflection mirror 124 after being reflected by the wafer 131 overlap. The image sensor 513 may output measured image data to the controller 510. The image sensor 513 may be an example of a phase error detector that detects a phase error between the laser light L2d and the laser light L2b.

The actuators 511, 514, and 515 may hold the high reflection mirrors 121, 124, and 125, respectively, in a manner such that inclinations of the high reflection mirrors 121, 124, and 125 are adjustable. The actuators 511, 514, and 515 may adjust the inclinations of the high reflection mirrors 121, 124, and 125 that the actuators hold, under the control of the controller 510. A deformable mirror having a reflection surface whose entire or local curvature is variable may be used in place of each of the high reflection mirrors 121, 124, and 125. In this case, each of the actuators 511, 514, and 515 may adjust the entire or local curvature of the corresponding deformable mirror, in addition to adjusting the inclination of the corresponding deformable mirror.

The stage moving mechanism 530 may adjust a three-dimensional position of the wafer stage 130. The stage moving mechanism 530 may operate under the control of the controller 510.

7.2 Operation

Next, a description will be given of the operation of the two-beam interference exposure system 5 illustrated in FIG. 17.

7.2.1 Alignment Adjustment of Two-Beam Interference Apparatus

The controller 510 may carry out an alignment adjustment of the two-beam interference apparatus 500 before carrying out the two-beam interference exposure. A wafer 131 to be used for the alignment adjustment may be set on the wafer stage 130 when carrying out the alignment adjustment. The controller 510 may control the laser device 10 to undergo the laser oscillation in a state in which the alignment adjusting wafer 131 is set on the wafer stage 130. In this state, the controller 510 may vary the oscillation wavelength of the laser device 10 in order to scan the wavelengths in a predetermined range. The oscillation wavelength of the laser device 10 may be varied by varying the rotary angle of the rotary table that holds the grating included in the laser device 10, as described above in conjunction with FIG. 7, for example. Hence, the image sensor 513 may measure, as the image data, the light intensity distribution of the laser light L2d that varies according to the variation in the wavelength. The controller 510 may calculate the change in the wave front of the laser light L2, based on the change in the image data measured by the image sensor 513 with respect to the variation in the wavelength, and control the laser device 10, the actuators 511, 514 and 515, and the stage moving mechanism 530 so that the half pitch interval and the contrast of the interference fringes fp formed on the wafer 131 satisfy the desired half pitch interval and the desired contrast.

7.2.1.1 Wave Front Measurement By Wavelength Change

Figure 18:
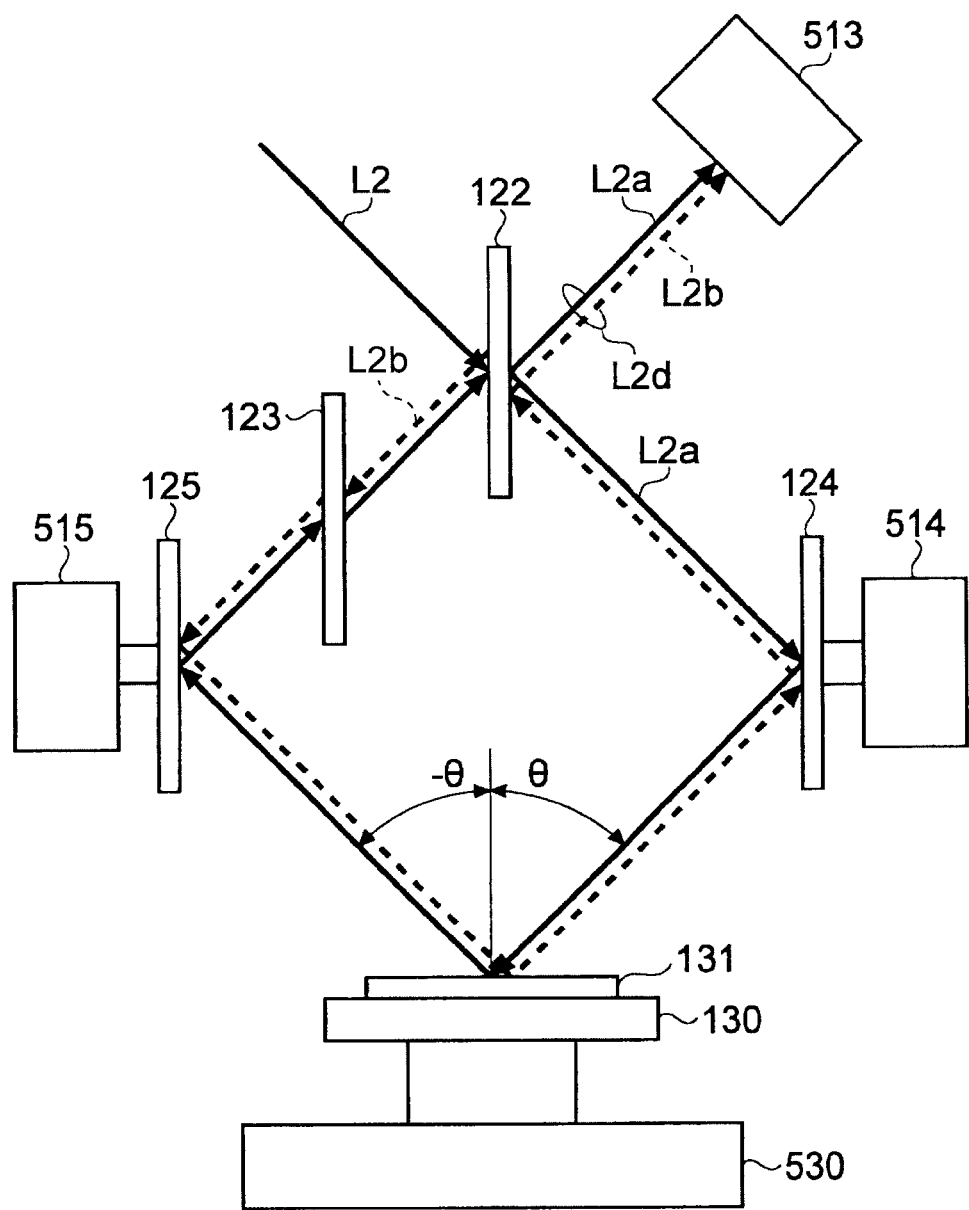
FIG. 18 is a diagram for explaining an example in which a wavelength of the laser light in the fifth embodiment is varied and a wave front thereof is measured.

A description will be given of an example in which the wavelength of the laser light is varied and the wave front of the laser light is measured. FIG. 18 is a diagram for explaining the example in which the wavelength of the laser light is varied and the wave front thereof is measured. In FIG. 18, the two-beam interference apparatus 500 illustrated in FIG. 17 is used.

As illustrated in FIG. 18, the laser light L2a transmitted through the beam splitter 122 may be successively reflected by the high reflection mirror 124, the wafer 131, and the high reflection mirror 125. Thereafter, the laser light L2a may be successively transmitted through the optical path correcting plate 123 and the beam splitter 122, to become incident to the image sensor 513. On the other hand, the laser light L2b reflected by the beam splitter 122 may be successively reflected by the high reflection mirror 125, the wafer 131, the high reflection mirror 124, and the beam splitter 122, after being transmitted through the optical path correcting plate 123, to become incident to the image sensor 513. In other words, the laser light L2d in which the laser light L2a that is transmitted through the beam splitter 122 via the high reflection mirror 125 after being reflected by the wafer 131 and the laser light L2b that is reflected by the beam splitter 122 via the high reflection mirror 124 after being reflected by the wafer 131 overlap, may be incident to the image sensor 513. The image sensor 513 may measure the interference fringes formed by the laser light L2d.

The laser light L2a that is incident to the image sensor 513 after being reflected by the wafer 131 is transmitted through the beam splitter 122 a number of times that is two more than the laser light L2b that is incident to the image sensor 513 after being reflected by the wafer 131. For this reason, a difference L between the optical path lengths of the laser light L2a and the laser light L2b may be twice an optical path length Lbs of the laser light that is transmitted through the beam splitter 122 once. In this case, the interference fringes generated by the difference L between the optical path lengths may be measured by the image sensor 513. In addition, the wavelength of the laser light may be varied by an amount greater than or equal to one period of the bright and dark parts of the interference fringes. A varying amount δλ of the wavelength required to shift the phase of the interference fringes by one period may be represented by the following formula (2).

$$\delta\lambda = \lambda^2/L \qquad (2)$$

For example, a case will be considered in which an ArF excimer laser having a spectral line width of 0.3 pm and a wavelength of 193.4 nm (wavelength variable range of ±0.2 nm) is used as the laser device 10. In this case, when the optical path length Lbs of the beam splitter 122 with respect to the wavelength of 193.4 nm is 5 mm, the difference L between the optical path lengths may be 10 mm. Accordingly, the varying amount δλ of the wavelength required to shift the phase of the interference fringes measured by the image sensor 513 by one period may be obtained to be 0.00374 nm (=3.74 pm) according to the formula (2). Hence, when varying the wavelength of the laser light and measuring the wave front thereof, the wavelength of the laser light may be varied in a range of at least the varying amount δλ or greater.

7.2.1.1.1 Details of Wave Front Measurement By Wavelength Change

A more detailed description will be given of the wave front measurement described above. The wave front of the laser light L2 may be measured by measuring a change in the light intensity detected by each pixel of the image sensor 513 when the wavelength of the laser light L1 output from the laser device 10 is varied from the short wavelength to the long wavelength, and calculating the phase error of the laser light L1 whose wavelength is varied from the short wavelength to the long wavelength.

Figure 19:
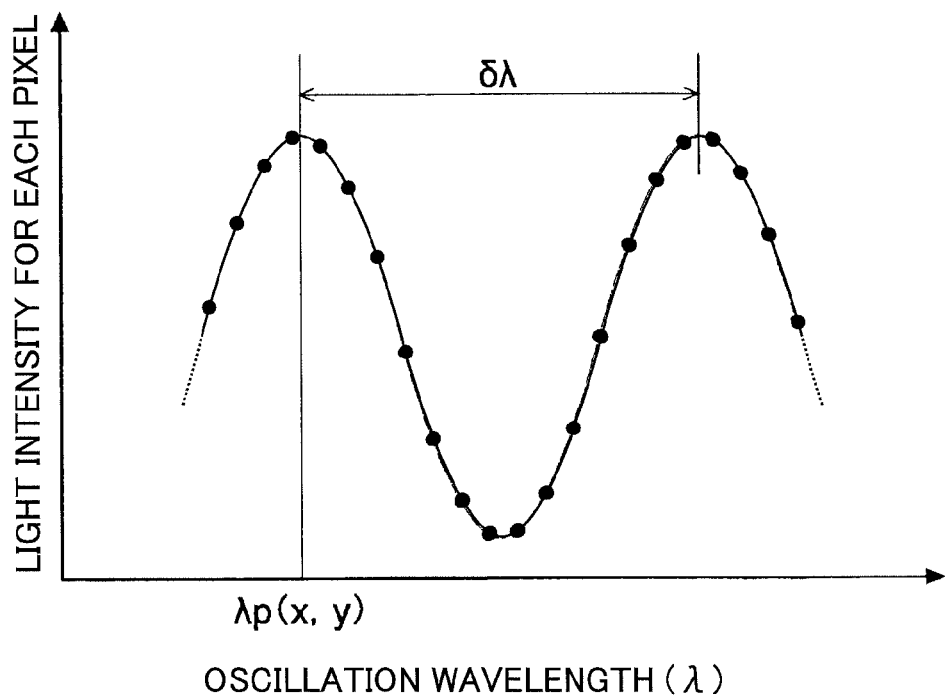
FIG. 19 is a diagram illustrating an example of a change in light intensity detected by each pixel of an image sensor when the wavelength of the laser light is varied between a short wavelength and a long wavelength in the fifth embodiment.
Figure 20:
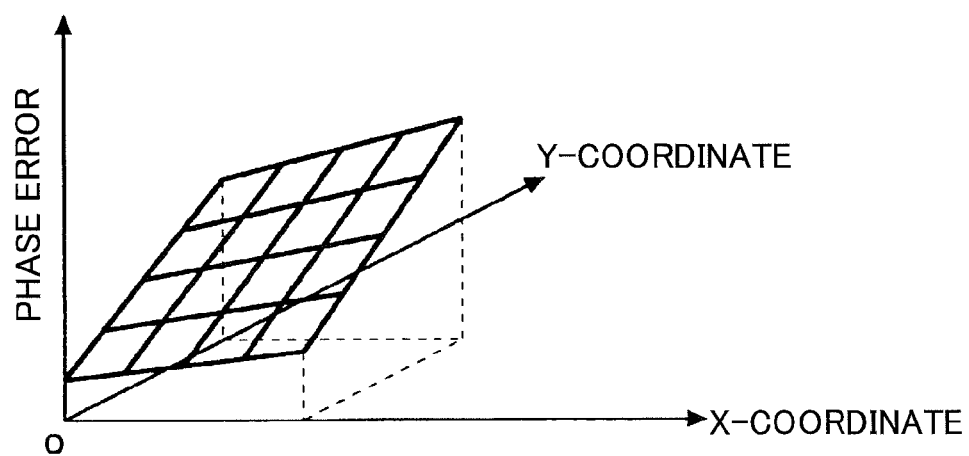
FIG. 20 is a diagram illustrating an example of the wave front of the laser light calculated based on the change in light intensity detected by all pixels of the image sensor when the wavelength of the laser light is varied between the short wavelength and the long wavelength in the fifth embodiment.

FIG. 19 is a diagram illustrating an example of the change in the light intensity detected by each pixel of the image sensor 513 when the wavelength of the laser light L1 is varied between a short wavelength λmin and the long wavelength. FIG. 20 is a diagram illustrating an example of the wave front of the laser light L2 calculated based on the change in light intensity detected by all pixels of the image sensor 513 when the wavelength of the laser light L1 is varied between the short wavelength λmin and the long wavelength.

As illustrated in FIG. 19, when the wavelength of the laser light L1 output from the laser device 10 is varied from the short wavelength λmin (for example, 193.400 nm) to the long wavelength (for example, 193.400561 nm), the light intensity detected by one pixel of the image sensor 513 may change in the form of a sine curve with respect to the wavelength. Thus, a fitting using the sine curve may be performed with respect to data points of the light intensities corresponding to the detected wavelengths, in order to obtain an oscillation wavelength λp(x, y) corresponding to a peak on the side of the shortest wavelength amongst the plurality of light intensity peaks that are obtained by the fitting. The coordinate (x, y) may be the layout coordinate of each pixel. The oscillation wavelength λp(x, y) corresponding to the peak on the side of the shortest wavelength in the light intensity variation may be obtained for each pixel. In addition, a period of the sine curve may correspond to the varying amount δλ. A phase error W between the laser light L2a and the laser light L2b at the pixel of the layout coordinate (x, y) may be represented by the following formula (3), using λmin, λp(x, y), and δλ.

$$W = (\lambda p - \lambda \min)/\delta\lambda \quad (3)$$

The formula (3) described above may be used to obtain the phase error W for all of the pixels. The phase error W may reflect the shape of the wave front of the laser light L2d incident to the image sensor 513. By making the phase error W correspond to the coordinate (x, y) of each pixel, the wave front having a shape illustrated in FIG. 20 may be calculated. Hence, the image sensor 513 may measure the shape of the wave front of the laser light L2d, by varying the wavelength of the laser light L1. This shape of the wave front of the laser light L2d may reflect the phase error W between the two laser light L2a and L2b incident to the image sensor 513. For this reason, in a case in which the shape of the wave front of the laser light L2d is observed to be flat and parallel with respect to a predetermined plane, the phase error W at each of the pixels may be substantially the same. The predetermined plane may be a plane on which each of the pixels are arranged, for example, and may be a YZ-plane in FIG. 20. Alternatively, the predetermined plane may be an imaginary plane that is set by taking into consideration the inclination of the image sensor 513 with respect to the incident optical axis. In a case in which the wave front is observed to be parallel to the predetermined plane, the two laser light L2a and L2b may be incident to the surface of the wafer 131 to be exposed in a manner such that the interference increases. The controller 510 may control the stage moving mechanism 530 based on shape data of the wave front. For example, the controller 510 may adjust the position and inclination of the wafer stage 130 so that the phase error W is substantially the same for each of the pixels, in order to adjust the alignment of the surface of the wafer 131 to be exposed in the two-beam interference apparatus 500.

7.2.1.2 Alignment Adjustment Flow Chart

Figure 21:
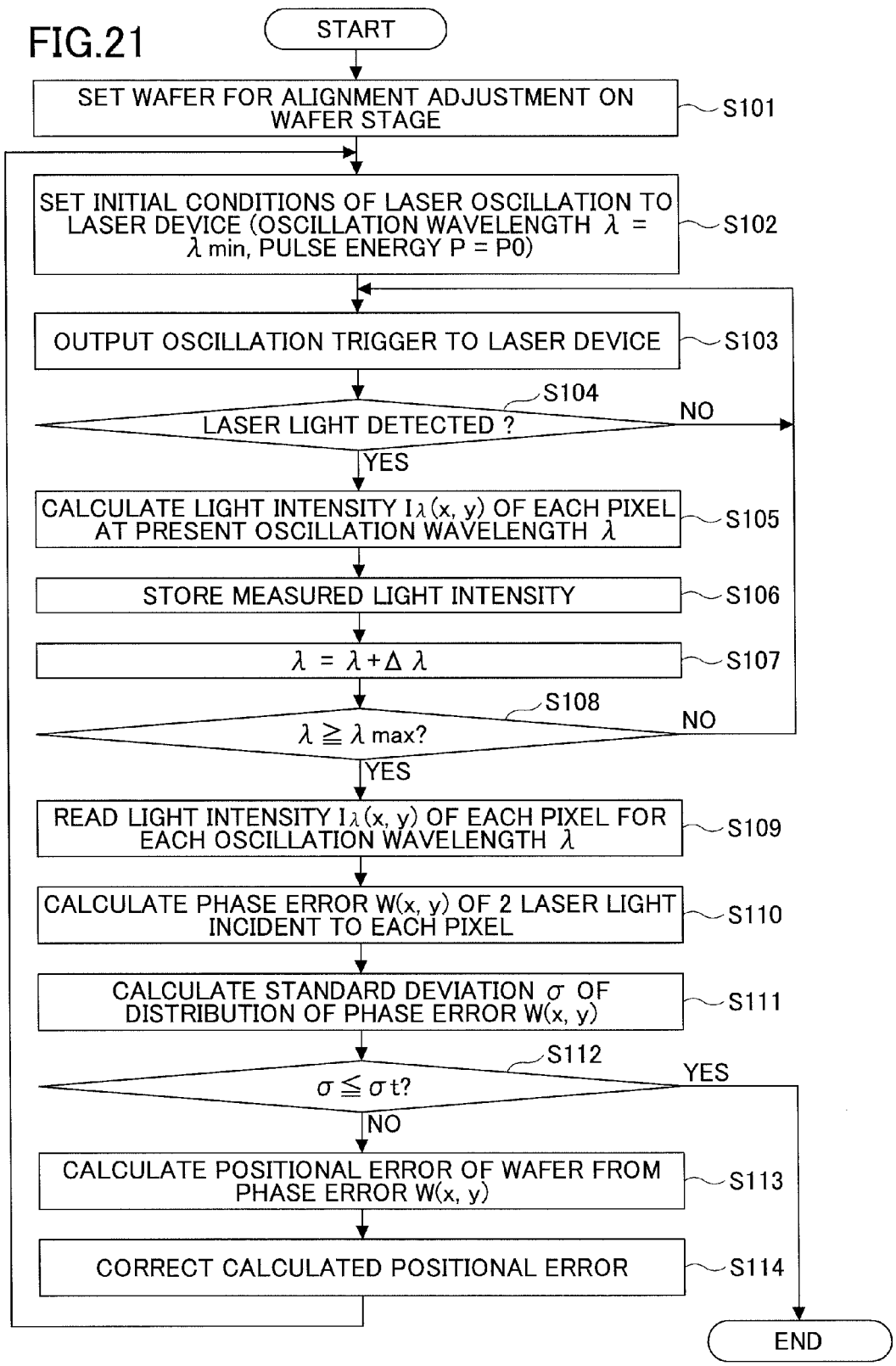
FIG. 21 is a flow chart illustrating an operation of a controller at the time of an alignment adjustment in the fifth embodiment.

Next, a detailed description will be given of the operation of the controller 510 at the time of the alignment adjustment, by referring to a flow chart. FIG. 21 is a flow chart illustrating the operation of the controller 510 at the time of the alignment adjustment.

As illustrated in FIG. 21, at the time of the alignment adjustment, the controller 510 may set the alignment adjusting wafer 131 on the wafer stage 130 by a transport mechanism (not illustrated), in step S101. Next, the controller 510 may set initial conditions of the laser oscillation to the laser device 10, in step S102. The initial conditions may include the oscillation wavelength λ=λmin (initial wavelength) and a pulse energy P=P0. The pulse energy P may be a pulse energy for the exposure. The initial wavelength λmin may be a shortest wavelength of the oscillation wavelength of the laser device 10.

Next, the controller 510 may output an oscillation trigger to the laser device 10, in step S103. The laser device 10 may output the laser light L1 in response to the oscillation trigger. Next, the controller 510 may judge whether the laser light L2 is detected, based on a detection value input from the energy sensor 512, for example, in step S104. When the laser light L2 is not detected and the judgment result in step S104 is NO, the controller 510 may return the operation to step S103 in order to output the oscillation trigger to the laser device 10 again. On the other hand, when the laser light L2 is detected and the judgment result in step S104 is YES, the controller 510 may acquire from the image sensor 513 a light intensity value $I_\lambda(x, y)$ detected by each pixel of the image sensor 513, in step S105. In addition, the controller 510 may store the acquired light intensity value $I_\lambda(x, y)$ in a memory (not illustrated) or the like, in correspondence with the current oscillation wavelength λ and identification information of each of the pixels, in step S106. The identification information of each of the pixels may be the position coordinate (x, y) of each of the pixels, for example.

Next, the controller 510 may set, as a next oscillation wavelength λ(=λ+Δλ), a value that is obtained by adding the correction wavelength Δλ to the oscillation wavelength λ, in step S107. The correction wavelength Δλ may be an increment value with which a number of data is obtainable such that the sine curve may be fitted with respect to data plots indicating the relationship of the oscillation wavelength λ and the light intensity detected for each of the pixels.

Next, the controller 510 may judge whether the oscillation wavelength λ(=λ+Δλ), added with the correction wavelength Δλ, is longer than or equal to a maximum oscillation wavelength λmax of the laser device 10, in step S108. When the oscillation wavelength λ is shorter than the maximum oscillation wavelength λmax and the judgment result in step S108 is NO, the controller 510 may return the operation to step S103 and input the oscillation trigger to the laser device 10 in order to cause the laser oscillation at a new oscillation wavelength $\lambda(=\lambda+\Delta\lambda)$ and to continue the operation thereafter.

On the other hand, when the oscillation wavelength $\lambda$ is longer than or equal to the maximum oscillation wavelength $\lambda$max and the judgment result in step S108 is YES, the controller 510 may read the light intensity value $I_\lambda(x, y)$ of each of the pixels for each oscillation wavelength $\lambda$ stored in the memory (not illustrated) or the like, in step S109.

Next, the controller 510 may calculate the phase error W(x, y) between the two laser light L2a and L2b incident to each of the pixels of the image sensor 513, using the formula (3) described above, for example, in step S110. Then, the controller 510 may calculate a standard deviation $\sigma$ of the phase error W(x, y) of each of the pixels from the data of the calculated phase error W(x, y), in step S111. The standard deviation $\sigma$ may be an index of inclination of the shape of the wave front or the wave front of the laser light L2.

Next, the controller 510 may judge whether the standard deviation $\sigma$ is less than or equal to a preset threshold value $\sigma$t, in step S112. When the standard deviation $\sigma$ is less than or equal to the preset threshold value $\sigma$t and the judgment result in step S112 is YES, the controller 510 may end the operation. On the other hand, when the standard deviation $\sigma$ is greater than the preset threshold value $\sigma$t and the judgment result in step S112 is NO, the controller 510 may calculate the positional error of the wafer 131, based on the calculated phase error W(x, y), in step S113. The positional error of the wafer 131 may be a value reflecting an extent of the deviation of the position and the inclination of the wafer stage 130 from respective appropriate or tolerable values. Next, the controller 510 may correct the calculated positional error of the wafer 131, in step S114. The controller 510 may adjust the actuators 511, 514 and 515 of the high reflection mirrors 121, 124 and 125, and the stage moving mechanism 530, for example, in order to correct the positional error. After step S114, the controller 510 may return the operation to step S102, in order to continue the operation thereafter.

The alignment of the two-beam interference apparatus 500 may be adjusted by carrying out the operation described above in the above described manner.

7.2.2 Two-Beam Interference Exposure

In addition, the controller 510 may also adjust the wafer stage 130 by driving the stage moving mechanism 530 in order to match the position and the inclination of the wafer that is to be actually exposed to the position and the inclination of the wafer 131 at the time of the alignment adjustment, immediately before the two-beam interference exposure. When this alignment adjustment is completed, the controller 510 may send a target wavelength $\lambda$t and a target pulse energy Pt with respect to the laser light L1 of the laser device 10. The target pulse energy Pt may be the same as the pulse energy P used at the time of the alignment adjustment. The laser device 10 may output the laser light L1 so that the wavelength and the pulse energy of the laser light L1 become the target wavelength $\lambda$t and the target pulse energy Pt that are received. The controller 510 may carry out a feedback control of the pulse energy of the laser light L1 output from the laser device 10, based on the pulse energy detected by the energy sensor 512. In this case, the wavelength of the laser light L1 may be measured from the image data of the interference fringes detected by the image sensor 513. For this reason, the controller 510 may carry out a feedback control of the wavelength of the laser light L1 output from the laser device 10, based on the image data of the interference fringes detected by the image sensor 513. Hence, target line-and-space patterns may be formed on the resist coated on the wafer 131 on the wafer stage 130.

7.3 Effects

According to the fifth embodiment, the alignment of the two-beam interference apparatus 500 may be adjusted, based on the interference fringes measured by the image sensor 513. Other configuration, operation, and effects may be similar to those of any of the first, second, and third embodiments described above.

8. Two-Beam Interference Exposure System With Modifiable Pattern Direction (Sixth Embodiment)

Next, a detailed description will be given of the two-beam interference exposure system in a sixth embodiment of the present disclosure, with reference to the drawings. In the following description, those constituent elements that are similar to those described above are designated by the same reference characters, and redundant description thereof will be omitted. In addition, this embodiment may be combined with other configurations of the present disclosure.

8.1 Configuration

Figure 22:
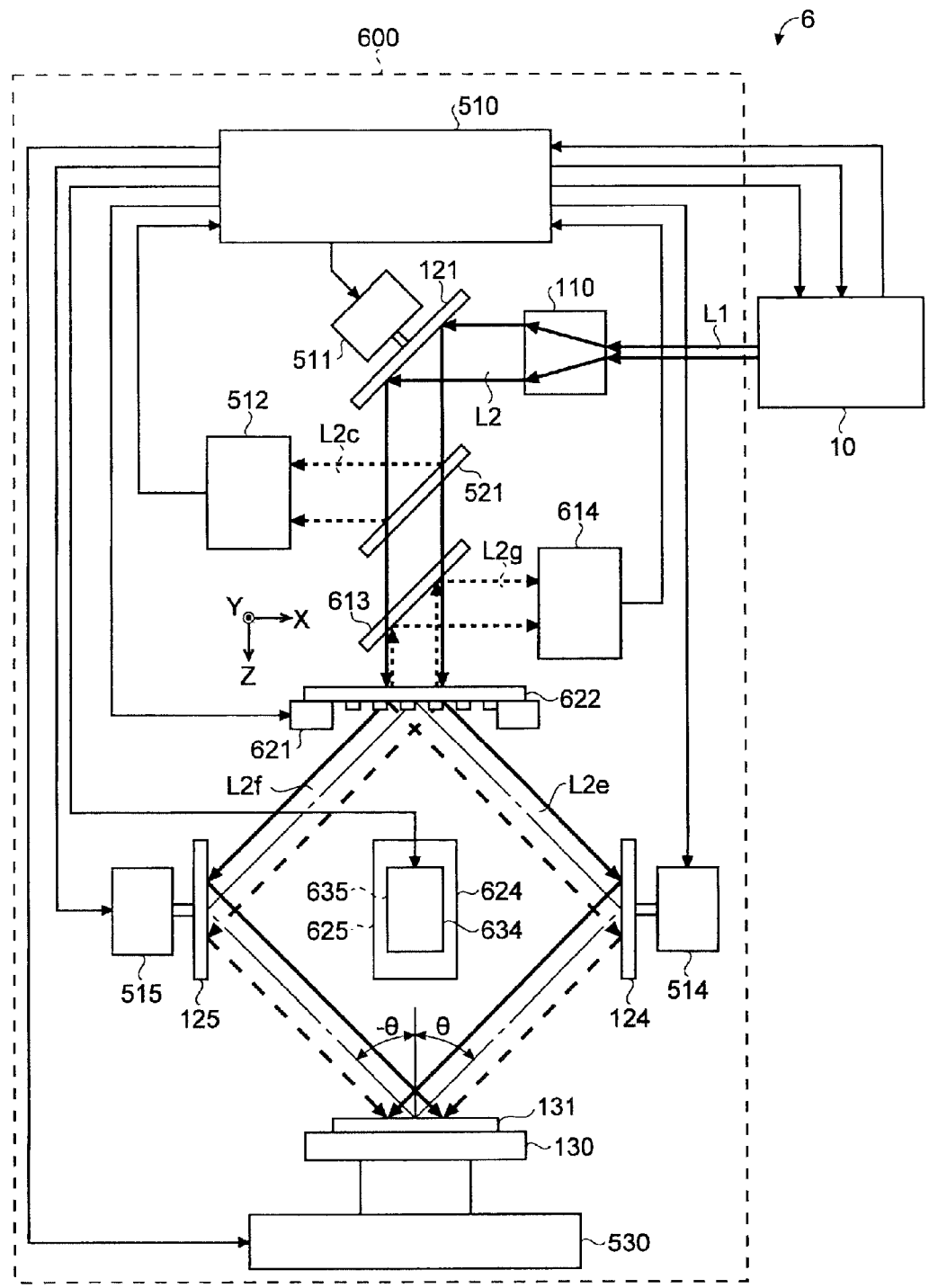
FIG. 22 is a diagram schematically illustrating a configuration of the two-beam interference exposure system in a sixth embodiment.
Figure 23:
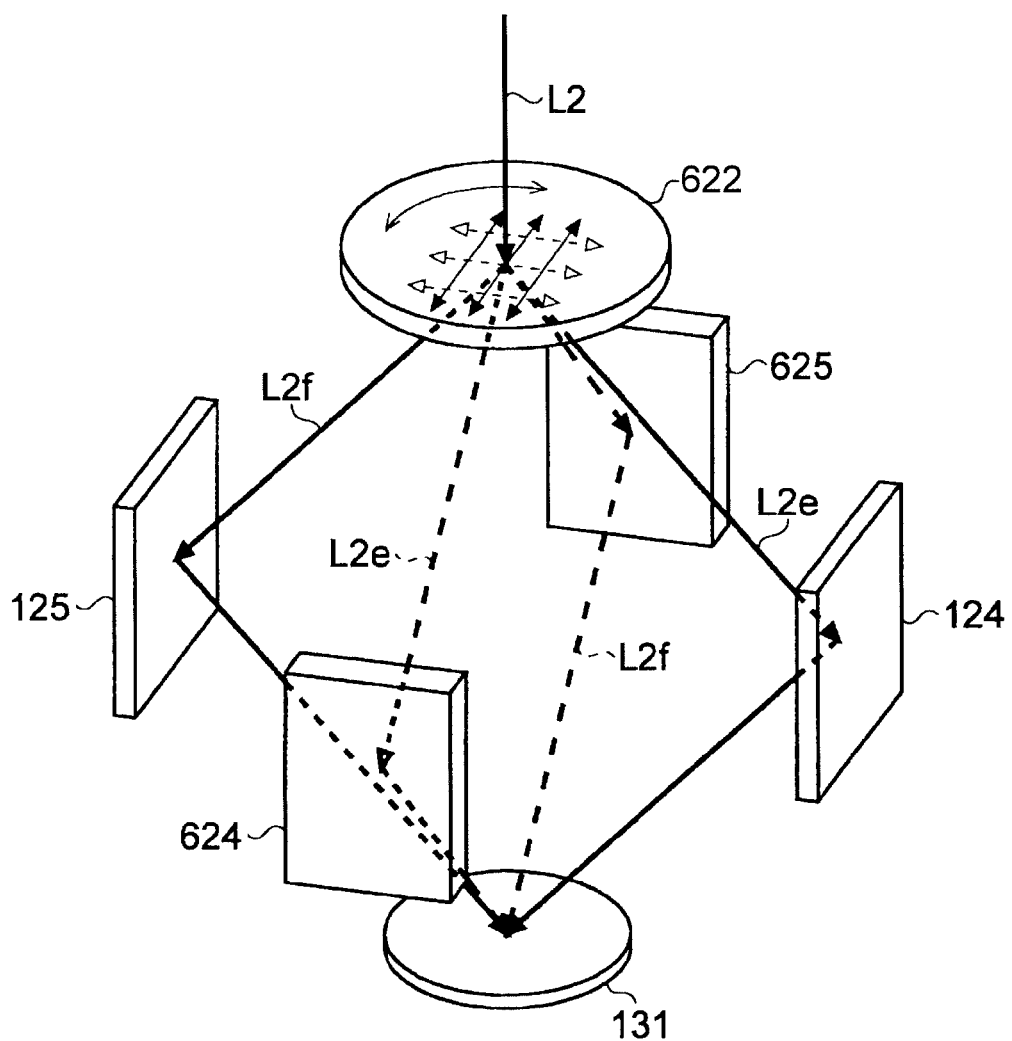
FIG. 23 is a diagram illustrating an optical path of ±1st order diffracted light transmitted through a transmission type grating in the sixth embodiment.

FIG. 22 is a diagram schematically illustrating a configuration of a two-beam interference exposure system 6 in the sixth embodiment. FIG. 23 is a diagram illustrating an optical path of ±1st order diffracted light L2e and L2f diffracted by a transmission type grating 622 illustrated in FIG. 22.

As illustrated in FIG. 22, the two-beam interference exposure system 6 may have a configuration similar to that of the two-beam interference exposure system 5 illustrated in FIG. 17. However, in the two-beam interference exposure system 6, the beam splitter 122 may be replaced by the transmission type grating 622. In addition, the two-beam interference exposure system 6 may further include a beam splitter 613, an image sensor 614, and a rotary stage 621. Moreover, the two-beam interference exposure system 6 may further include a high reflection mirrors 624 and 625, and actuators 634 and 635.

The laser light L1 output from the laser device 10 may be incident to the high reflection mirror 121 via the beam tuning unit 110, as the laser light L2. The high reflection mirror 121 may reflect the incident laser light L2 towards the transmission type grating 622. The beam splitters 521 and 613 may be arranged in an optical path between the high reflection mirror 121 and the transmission type grating 622. The energy sensor 512 may detect the pulse energy of the laser light L2c split by the beam splitter 521.

A depth of grooves of the transmission type grating 622 may be designed so that the +1st order diffracted light and the −1st order diffracted light of the incident laser light L2 interfere more strongly than other diffracted light, for example. As illustrated in FIGS. 22 and 23, +1st order diffracted light L2e output from the transmission type grating 622 may be reflected by the high reflection mirror 124, for example, to become incident to the wafer 131. On the other hand, −1st order diffracted light L2f output from the transmission type grating 622 may be reflected by the high reflection mirror 125, for example, to become incident to the wafer 131. Hence, the interference fringes of the +1st order diffracted light L2e and the −1st order diffracted light L2f may be formed on the wafer 131.

The rotary stage 621 may rotate the transmission type grating 622 within a plane (XY-plane) perpendicular to the optical axis of the laser light L2. For example, the emitting direction of the ±1st order diffracted light L2e and L2f may be rotated by 90° within the XY-plane, by rotating the transmission type grating 622 by 90°. Accordingly, as illustrated in FIGS. 22 and 23, the +1st order diffracted light L2e output from the transmission type grating 622 may be reflected by the high reflection mirror 624, for example, to become incident to the wafer 131. On the other hand, the −1st order diffracted light L2f output from the transmission type grating 622 may be reflected by the high reflection mirror 625, for example, to become incident to the wafer 131. As a result, the interference fringes formed on the wafer 131 may be rotated by 90° within the XY-plane with respect to the interference fringes formed before the transmission type grating 622 is rotated by 90°. Hence, the direction in which the line-and-space patterns that are to be formed on the wafer 131 are arranged may be modified.

In addition, as illustrated in FIG. 22, the +1st order diffracted light L2e reflected by the wafer 131 may be reflected by the high reflection mirror 125 or 625, to become incident again to the transmission type grating 622. Similarly, the −1st order diffracted light L2f reflected by the wafer 131 may be reflected by the high reflection mirror 124 or 624, to become incident again to the transmission type grating 622. Diffracted light L2g of the ±1st order diffracted light L2e and L2f incident to the transmission type grating 622 via the wafer 131 may be output towards the beam splitter 613. The beam splitter 613 may reflect a part of the diffracted light L2g towards the image sensor 614. The image sensor 614 may measure image data of the interference fringes formed by the diffracted light L2g. In addition, the image sensor 614 may output the measured image data to the controller 510. The controller 510 may use the image data input thereto in order to adjust the alignment of the two-beam interference apparatus 600. An example of a target numerical value of the contrast in this embodiment may be 10% or greater when two pin holes are provided in the optical path of the laser light as described above in conjunction with FIG. 12 and the pin hole interval D is D=1 mm.

8.2 Effects

According to the sixth embodiment, the direction in which the line-and-space patterns that are to be formed on the wafer 131 are arranged may be modified with ease. Other configuration, operation, and effects may be similar to those of any of the first through fifth embodiments described above.

9. Two-Beam Interference Exposure System With Optical Retarder (Seventh Embodiment)

Next, a detailed description will be given of the two-beam interference exposure system in a seventh embodiment of the present disclosure, with reference to the drawings. In the following description, those constituent elements that are similar to those described above are designated by the same reference characters, and redundant description thereof will be omitted. In addition, this embodiment may be combined with other configurations of the present disclosure.

9.1 Configuration

Figure 24:
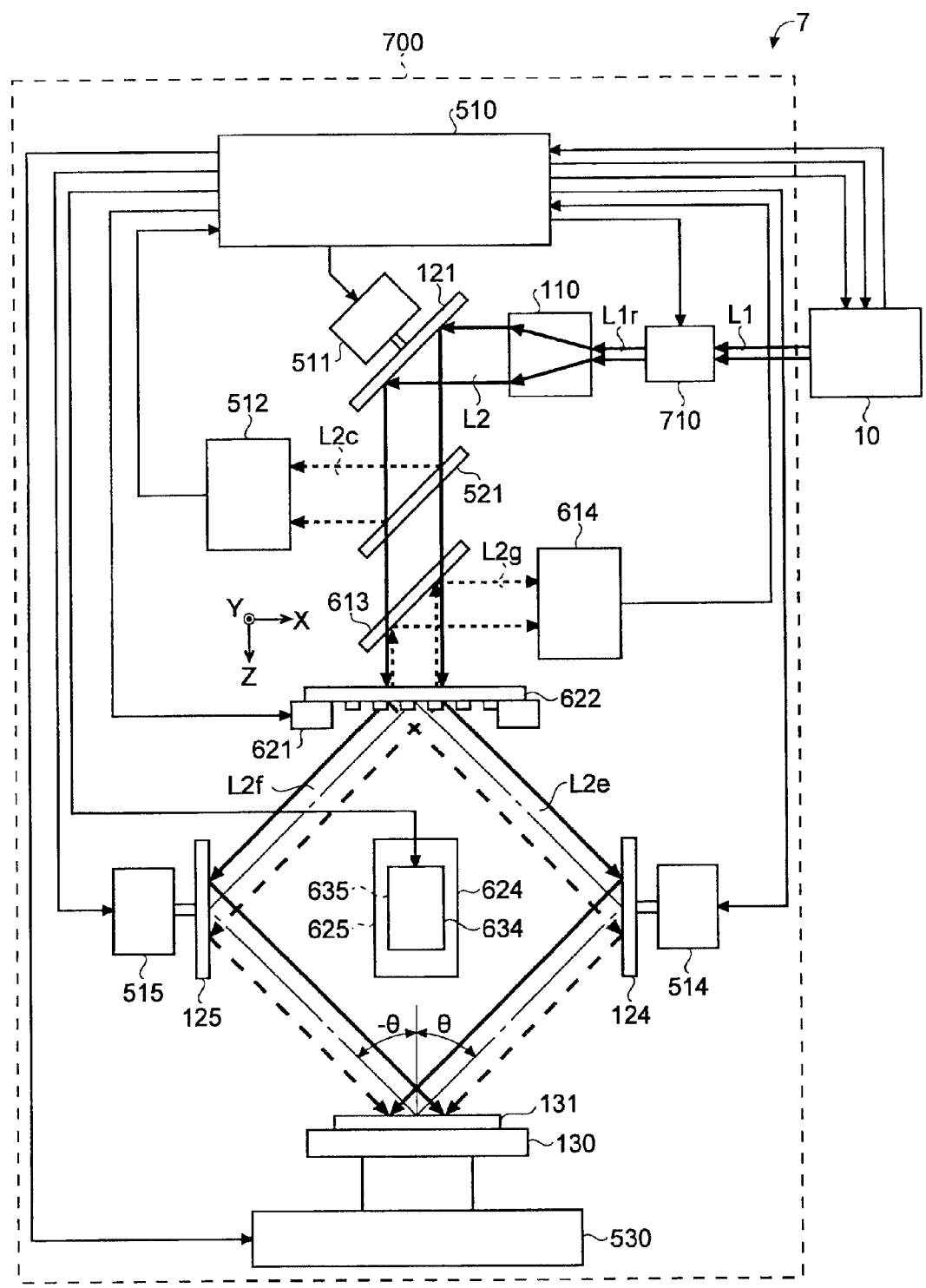
FIG. 24 is a diagram schematically illustrating a configuration of the two-beam interference exposure system in a seventh embodiment.

FIG. 24 is a diagram schematically illustrating a configuration of a two-beam interference exposure system 7 in the seventh embodiment. As illustrated in FIG. 24, the two-beam interference exposure system 7 may have a configuration similar to that of the two-beam interference exposure system 6 illustrated in FIG. 22, and further include an optical retarder 710. The optical retarder 710 may be arranged in an optical path between the laser device 10 and the beam tuning unit 110. However, the arrangement of the optical retarder 710 is not limited to this location. For example, the optical retarder 710 may be arranged in an optical path between the beam tuning unit 110 and the high reflection mirror 121, or in an optical path between the high reflection mirror 121 and the transmission type grating 622, for example.

The optical retarder 710 may rotate the polarization direction of the laser light L1 output from the laser device 10 in a rotating direction about the optical axis of the laser light L1. The optical retarder 710 may include a rotating mechanism (not illustrated). This rotating mechanism may rotate the optical retarder 710 in the rotating direction about the optical axis of the laser light L1, under the control of the controller 510. Hence, the polarization direction of laser light L1r transmitted through the optical retarder 710 may be rotated in the rotating direction about the optical axis of the laser light L1.

9.1.1 Example of Optical Retarder

Figure 25:
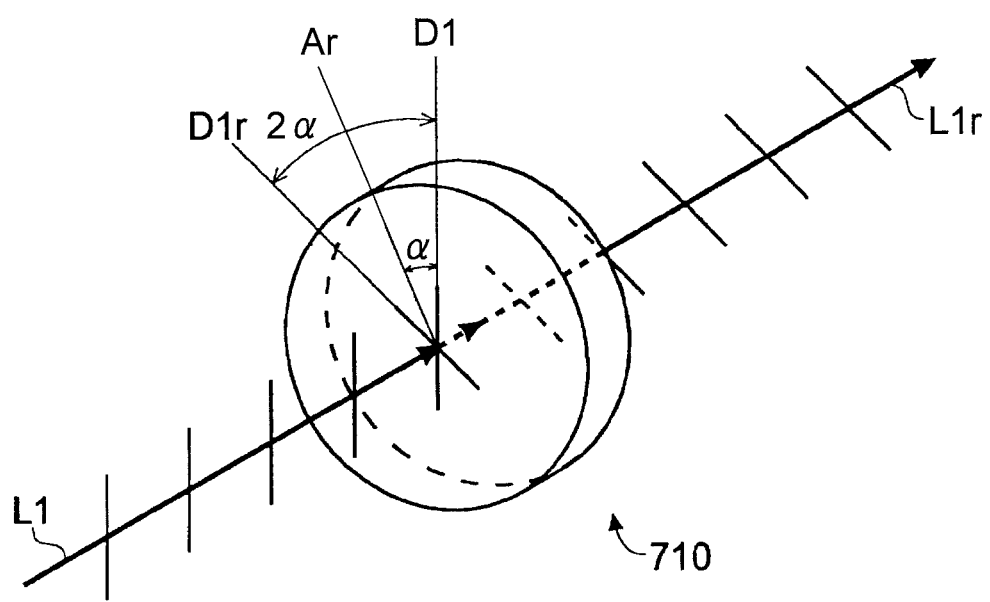
FIG. 25 is a diagram illustrating an example of an optical retarder illustrated in FIG. 24.

FIG. 25 is a diagram illustrating an example of the optical retarder 710. As illustrated in FIG. 25, the optical retarder 710 may be formed by a λ/2 wave plate. In this case, when an angle formed by an optical axis Ar of the optical retarder 710 and a polarization direction D1 of the laser light L1 is denoted by α, an angle formed by a polarization direction D1r of the laser light L1r that is emitted with respect to the polarization direction D1 of the laser light L1 may be denoted by 2α.

The rotating mechanism (not illustrated) may adjust the rotating angle α of the optical retarder 710 in the rotating direction about the optical axis of the laser light L1, under the control of the controller 510. Hence, the polarization direction D1r of the laser light L1r transmitted through the optical retarder 710 may be adjusted to a desired direction. For example, in a case in which the optical axis Ar of the optical retarder 710 forms an angle of 45° with respect to the polarization direction D1 of the laser light L1, the polarization direction D1r of the laser light L1r may be rotated by 90° with respect to the polarization direction D1 of the laser light L1.

9.2 Operation

In a case in which the controller 510 modifies the direction in which the line-and-space patterns to be formed on the wafer 131 are arranged, the rotating mechanism (not illustrated) may be controlled to rotate the optical retarder 710 in order to rotate the polarization direction D1 of the laser light L1 depending on the change in the direction in which the line-and-space patterns are arranged. For example, in a case in which the controller 510 controls the rotary stage 621 to rotate the transmission type gratin 622 in order to change the direction in which the line-and-space patterns are arranged by 90°, the rotating mechanism (not illustrated) may be controlled to rotate the polarization direction D1 of the laser light L1 by 90° about the optical axis.

9.3 Effects

The contrast of the line-and-space patterns formed on the wafer 131 may be made higher, by rotating the polarization direction D1 of the laser light L1 depending on the direction in which the line-and-space patterns to be formed on the wafer 131 are arranged, as in the seventh embodiment.

10. Two-Beam Interference Exposure System with Beam Rotating Mechanism (Eighth Embodiment)

Next, a detailed description will be given of the two-beam interference exposure system in an eighth embodiment of the present disclosure, with reference to the drawings. In the following description, those constituent elements that are similar to those described above are designated by the same reference characters, and redundant description thereof will be omitted. In addition, this embodiment may be combined with other configurations of the present disclosure.

10.1 Configuration

Figure 26:
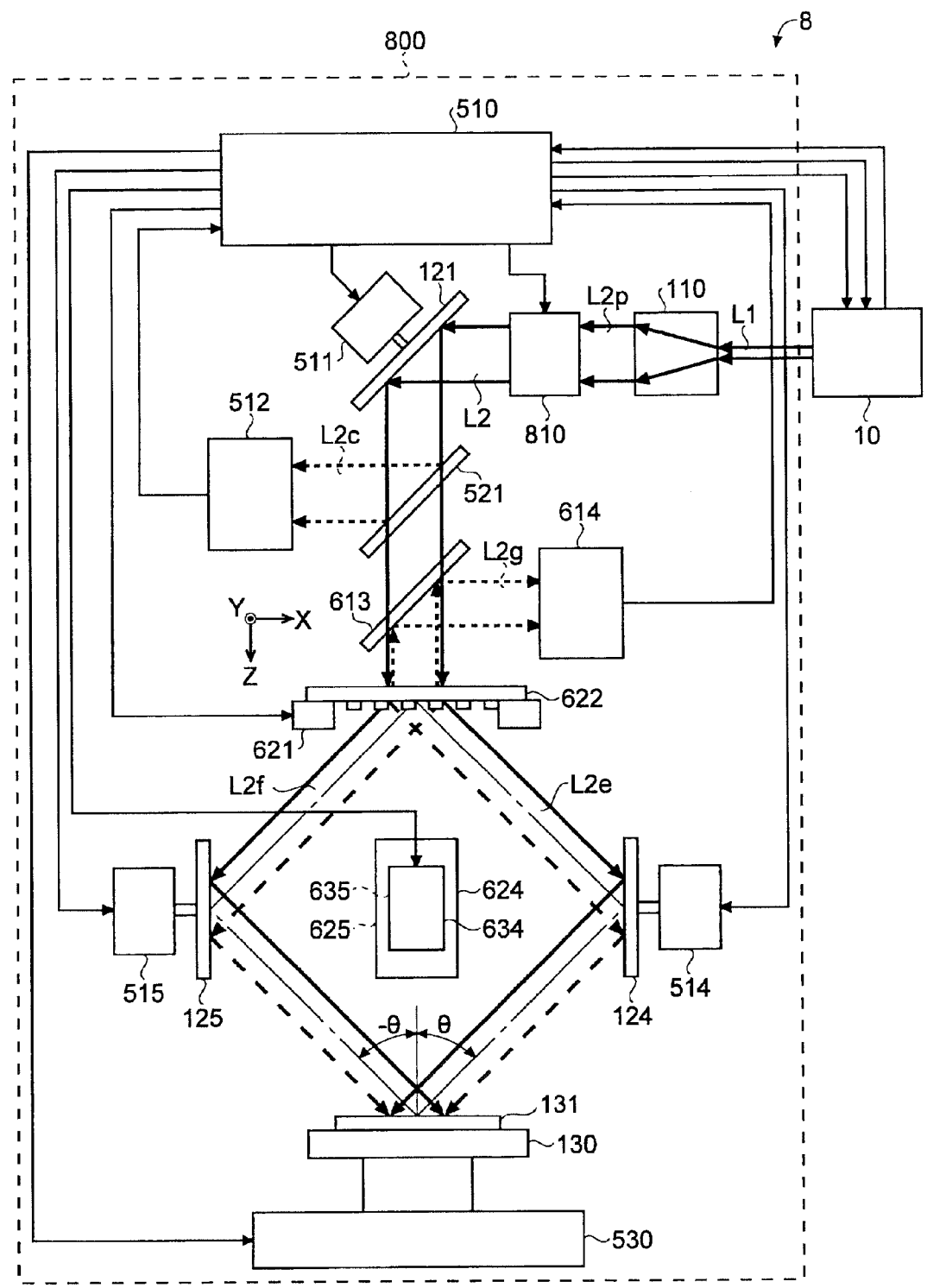
FIG. 26 is a diagram schematically illustrating a configuration of the two-beam interference exposure system in an eighth embodiment.

FIG. 26 is a diagram schematically illustrating a configuration of a two-beam interference exposure system 8 in the eighth embodiment. As illustrated in FIG. 26, the two-beam interference exposure system 8 may have a configuration similar to that of the two-beam interference exposure system 6 illustrated in FIG. 22, and further include a beam rotating mechanism 810. The beam rotating mechanism 810 may be arranged in an optical path between the beam tuning unit 110 and the high reflection mirror 121. However, the arrangement of the beam rotating mechanism 810 is not limited to this location. For example, the beam rotating mechanism 810 may be arranged in an optical path between the laser device 10 and the beam tuning unit 110, or in an optical path between the high reflection mirror 121 and the transmission type grating 622.

The beam rotating mechanism 810 may rotate in a rotating direction about an optical axis of laser light L2$p$ emitted from the beam tuning unit 110. In this case, a beam cross section at a predetermined position of the laser light L2$p$ may be regarded as rotating about the optical axis of the laser light L2$p$. The beam rotating mechanism 810 may also rotate a polarization direction of the laser light L2$p$ in the rotating direction about the optical axis of the laser light L2$p$. The beam rotating mechanism 810 may include a rotating mechanism (not illustrated). This rotating mechanism (not illustrated) may rotate the beam rotating mechanism 810 in the rotating direction about the optical axis of the laser light L2$p$, under the control of the controller 510. Hence, the beam cross section (that may include the polarization direction) of the laser light L2 transmitted through the beam rotating mechanism 810 may be rotated in the rotating direction about the optical axis of the laser light L2$p$.

10.1.1 Example of Beam Rotating Mechanism

Figure 27:
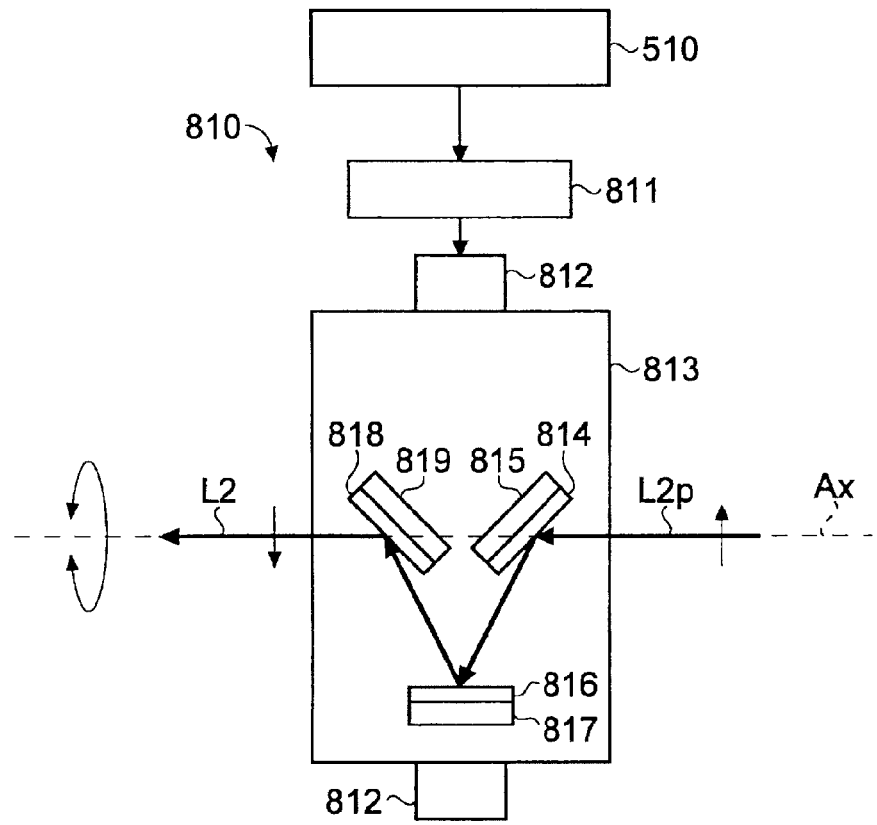
FIG. 27 is a diagram schematically illustrating a configuration of a first example of a beam rotating mechanism.
Figure 28:
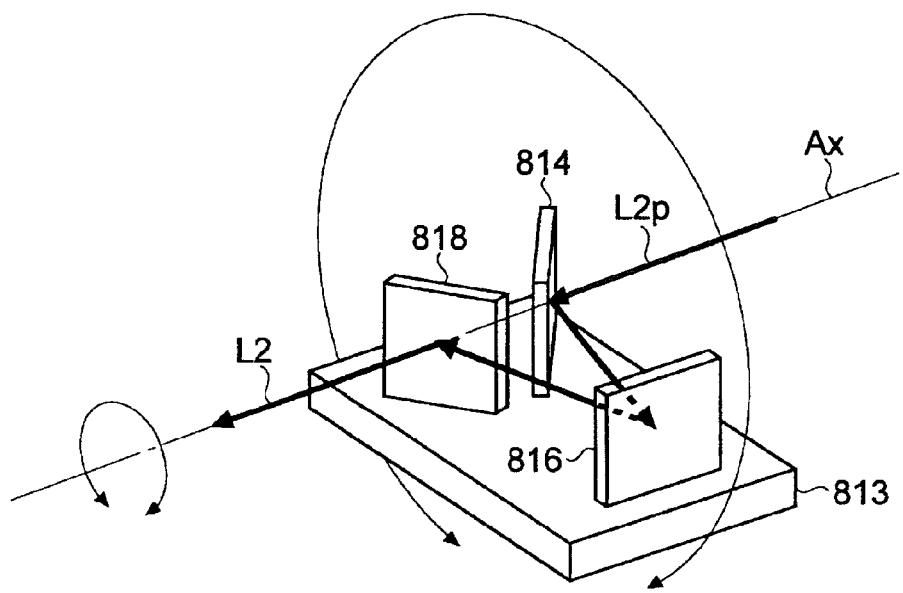
FIG. 28 is a perspective view illustrating the beam rotating mechanism illustrated in FIG. 27.

FIG. 27 is a diagram schematically illustrating a configuration of a first example of the beam rotating mechanism 810. FIG. 28 is a perspective view illustrating the beam rotating mechanism 810 illustrated in FIG. 27. However, in FIG. 28, a part of the configuration illustrated in FIG. 27 is omitted for the sake of convenience.

As illustrated in FIGS. 27 and 28, the beam rotating mechanism 810 may include high reflection mirrors 814, 816 and 818, mirror holders 815, 817 and 819, a rotary plate 813, a rotating mechanism 812, and a driver 811. The high reflection mirrors 814, 816 and 818 may be fixed on the rotary plate 813 via the mirror holders 815, 817 and 819, respectively.

The laser light L2$p$ emitted from the beam tuning unit 110 may be incident to the high reflection mirror 814. The high reflection mirror 814 may be inclined within a plane parallel to a mounting surface of the rotary plate 813, with respect to the optical axis Ax of the laser light L2$p$. Alternatively, a reflection surface of the high reflection mirror 814 may be substantially perpendicular to the mounting surface of the rotary plate 813 and be inclined with respect to the optical axis Ax of the laser light L2$p$. The laser light L2$p$ reflected by the high reflection mirror 814 may be reflected by the high reflection mirror 816 and be further reflected by the high reflection mirror 818, in order to emit the laser light L2 from the beam rotating mechanism 810. The beam rotating mechanism 810 may be arranged so that the laser light L2$p$ becomes incident to the high reflection mirror 814, in a manner parallel to the mounting surface of the rotary plate 813.

The three high reflection mirrors 814, 816 and 818 may be fixed on the mounting surface of the rotary plate 813 so that the optical axis of the laser light L2 reflected by the high reflection mirror 818 matches an extension of the optical axis Ax of the laser light L2$p$ incident to the high reflection mirror 814. The rotating mechanism 812 may rotate the rotary plate 813 about the optical axis Ax. According to this configuration, when the rotary plate 813 is rotated by the angle $\theta$ about the optical axis Ax, the beam cross section of the laser light L2 rotates by twice the angle $\theta$, that is, $2\theta$, with respect to the beam cross section of the laser light L2$p$. For example, when the rotary plate 813 is rotated by 45° about the optical axis Ax, the beam cross section of the laser light L2 may be rotated by 90° with respect to the beam cross section of the laser light L2$p$. In this case, the polarization direction of the laser light L2 may be rotated together with the beam cross section.

10.2 Operation

The rotating mechanism 812 may rotate the rotary plate 813 in response to a driving signal from the driver 811. The driver 811 may output the driving signal to the rotating mechanism 812 under the control of the controller 510. In other words, the rotary angle of the rotary plate 813 that is rotated by the rotating mechanism 812 may be controlled by the controller 510.

10.3 Effects

When the beam cross section of the laser light L2 is rotated as in the eighth embodiment, the spatial coherence of the laser light L2 may be tuned depending on the direction in which the line-and-space patterns that are to be formed on the wafer 131 are arranged. Hence, the contrast of the line-and-space patterns formed on the wafer 131 may be made high. In this case, the contrast of the line-and-space patterns formed on the wafer 131 may be made even higher, by also rotating the polarization direction of the laser light L2.

10.4 Modification of Beam Rotating Mechanism

Figure 29:
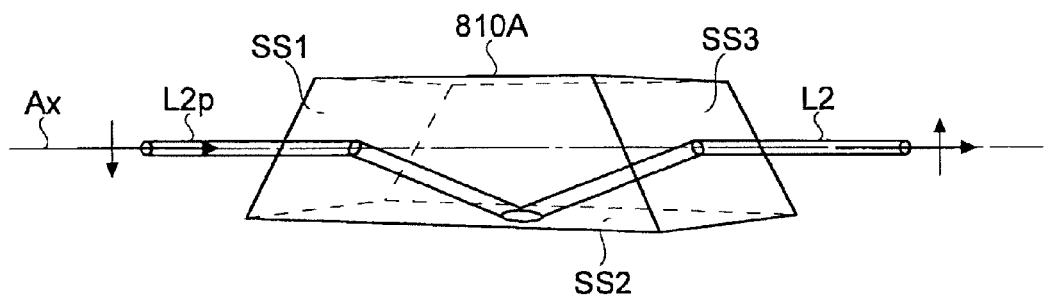
FIG. 29 is a diagram schematically illustrating a configuration of a second example of the beam rotating mechanism.

A second example of the beam rotating mechanism 810A illustrated in FIG. 29 may be used in place of the beam rotating mechanism 810 illustrated in FIGS. 27 and 28.

A beam rotating mechanism 810A illustrated in FIG. 29 may include a dove prism. As an example, a surface SS1 of the dove prism to which light is incident and a surface SS3 of the dove prism from which light is emitted, may be inclined by an acute angle with respect to a bottom surface SS2 of the dove prism. The surface SS1 to which the light is incident may correspond to the high reflection mirror 814, the surface SS3 from which the light is emitted may correspond to the high reflection mirror 818, and the bottom surface SS2 may correspond to the high reflection mirror 816. Accordingly, the optical axis of the laser light L2 emitted from the surface SS3 of the dove prism may preferably, substantially match the optical axis Ax of the laser light L2$p$ incident to the surface SS1.

The beam rotating mechanism 810A may include a rotating mechanism 812 and a driver 811, similarly as in the case of the beam rotating mechanism 810. In addition, the beam rotating mechanism 810A may further include a rotary plate 813, and a dove prism may be provided on the rotary plate 813. However, the configuration of the beam rotating mechanism 810A is not limited to the above configuration, and for example, the dove prism may be provided on a holder or the like, instead of being provided on the rotary plate 813. In this case, the rotating mechanism 812 may rotate the dove prism via the holder. The rotating mechanism 812 may rotate the beam rotating mechanism 810A about the optical axis Ax. According to this configuration, when the beam rotating mechanism 810A is rotated by an angle $\theta$ about the optical axis Ax, the beam cross section of the laser light L2 may rotate by twice the angle θ, that is, 2θ, with respect to the beam cross section of the laser light L2p. For example, in a case in which the rotary plate 813 rotates by 45° about the optical axis Ax, the beam cross section of the laser light L2 may be rotated by 90° with respect to the beam cross section of the laser light L2p. In this case, the polarization direction may be rotated together with the beam cross section.

11. Four-Beam Interference Exposure System (Ninth Embodiment)

Next, a detailed description will be given of the four-beam interference exposure system in a ninth embodiment of the present disclosure, with reference to the drawings. In the following description, those constituent elements that are similar to those described above are designated by the same reference characters, and redundant description thereof will be omitted. In addition, this embodiment may be combined with other configurations of the present disclosure.

The interference exposure system that forms patterns by causing interference of the light beams is not limited to using two light beams, but may cause four light beams to interfere, for example. In this case, amongst the four light beams, the direction in which two light beams are caused to interfere and the direction in which the remaining two light beams are caused to interfere may differ by 90°, for example, in order to form a grid pattern on the wafer 131. The grid pattern may refer to a two-dimensional arrangement of rectangular patterns.

11.1 Configuration

Figure 30:
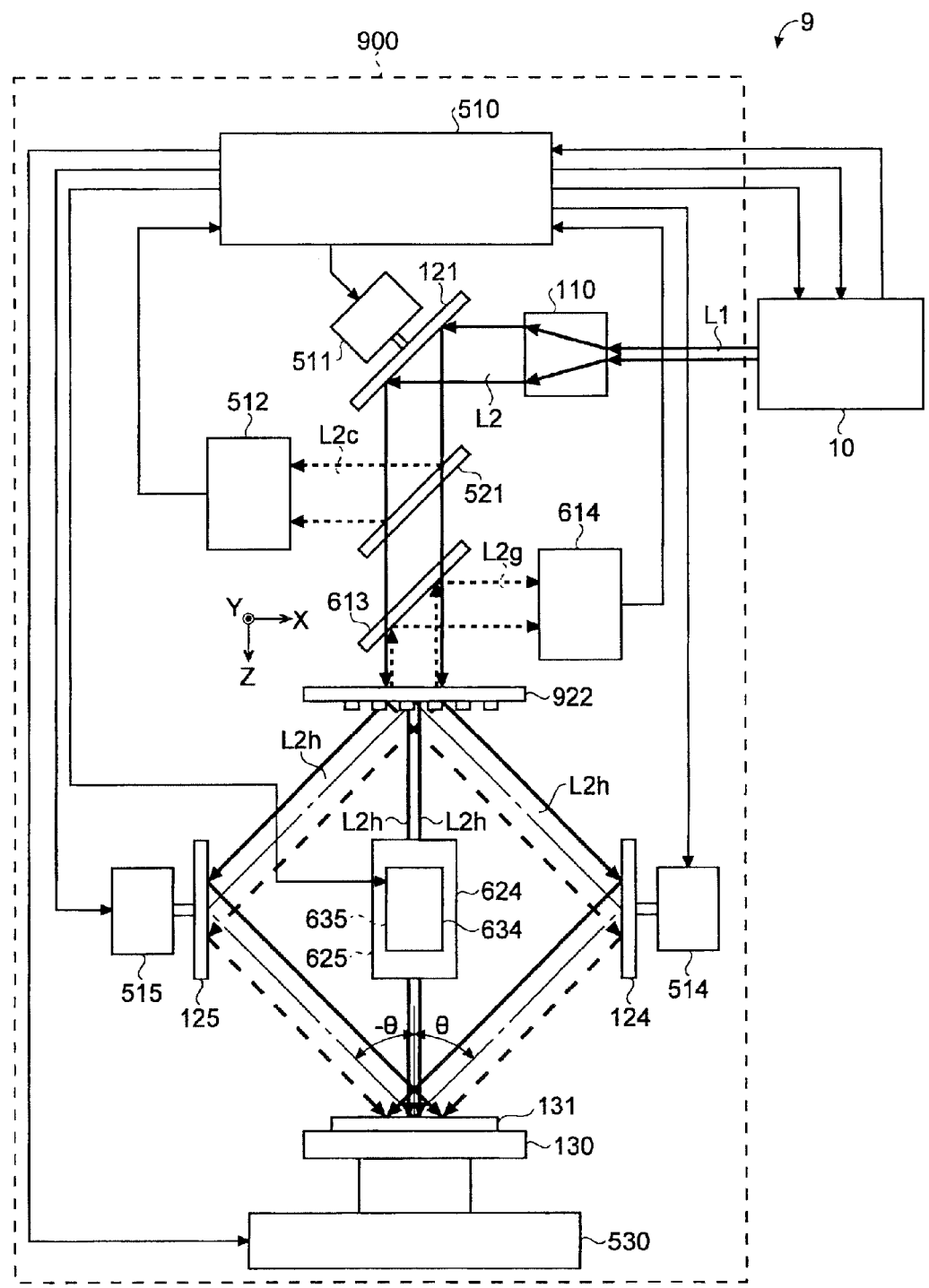
FIG. 30 is a diagram schematically illustrating a configuration of a four-beam interference exposure system in a ninth embodiment.

FIG. 30 is a diagram schematically illustrating a configuration of a four-beam interference exposure system 9 in the ninth embodiment. As illustrated in FIG. 30, the four-beam interference exposure system 9 may have a configuration similar to that of the two-beam interference exposure system 6 illustrated in FIG. 22, and include a grid type grating 922 in place of the transmission type grating 622. The grid type grating 922 may be a transmission type grating that diffracts and transmits the laser light L2, similarly as in the case of the transmission type grating 622, or be a reflection type grating. In addition, the rotary stage 621 may or may not be provided.

11.2 Operation

Figure 31:
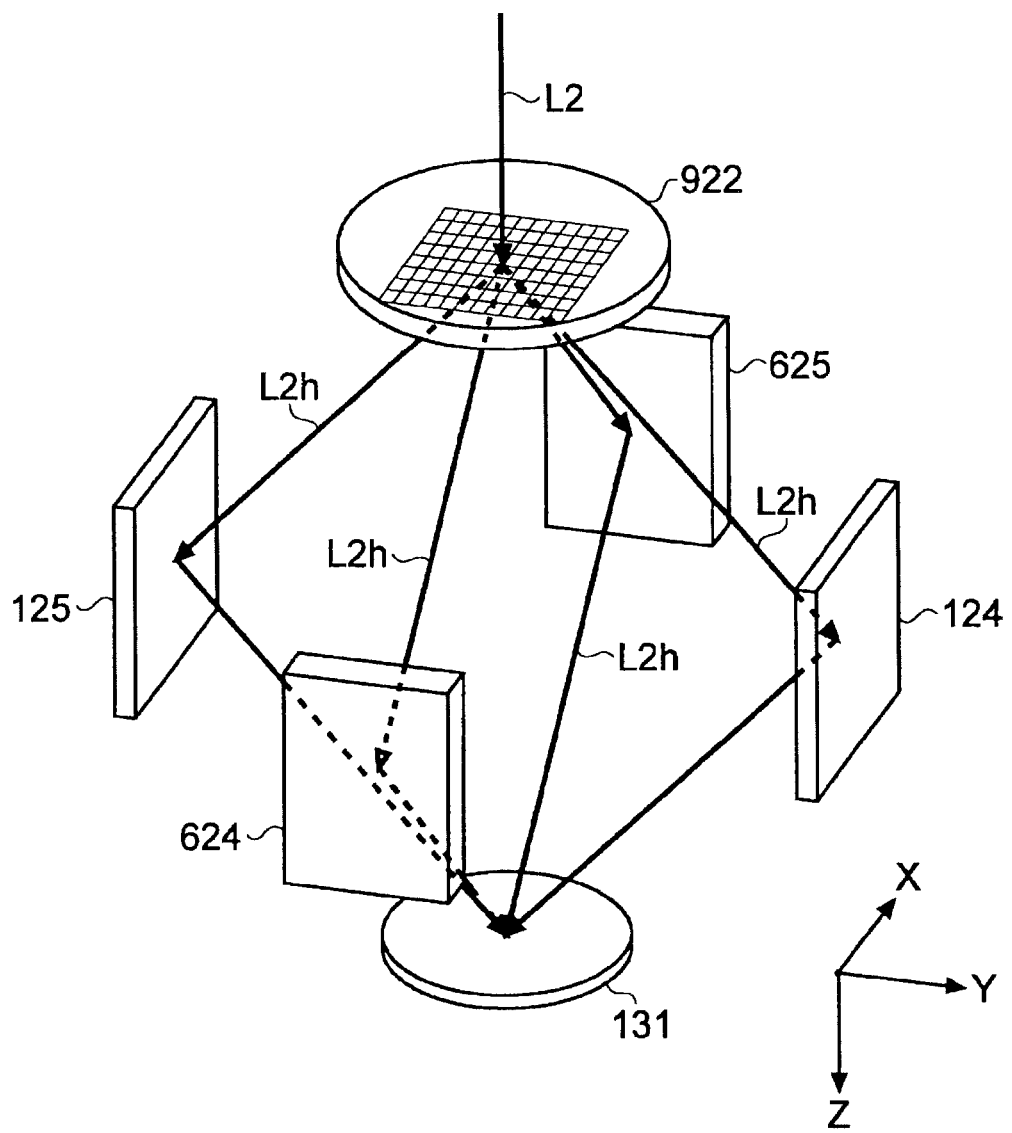
FIG. 31 is a diagram illustrating an optical path of ±1st order diffracted light transmitting through a grid type grating illustrated in FIG. 30.

FIG. 31 is a diagram illustrating an optical path of ±1st order diffracted light L2h diffracted by the grid type grating 922 illustrated in FIG. 30. The +1st order diffracted light and the −1st order diffracted light are not distinguished from each other in FIG. 31. As illustrated in FIG. 31, the grid type grating 922 may include grooves formed in a lattice shape. A depth of the grooves may be designed so that the +1st order diffracted light and the −1st order diffracted light of the incident laser light L2 interfere more strongly than other diffracted light, for example. The grid type grating 922 may emit ±1st order diffracted light L2h of the incident laser light L2 in each of +X-direction, −X-direction, +Y-direction, and −Y-direction in the coordinate system illustrated in FIG. 31. The ±1st order diffracted light L2h may be incident to the wafer 131 via the high reflection mirrors 124, 125, 624, and 625. As a result, interference fringes in which the interference fringes formed by the ±1st order diffracted light L2h reflected via the high reflection mirrors 124 and 125 and the ±1st order diffracted light L2h reflected via the high reflection mirrors 624 and 625 overlap, may be formed on the wafer 131. The shape of the patterns formed as a result of the overlapping interference fringes may substantially become the grid shape. The grid type grating 922 may be an example of a grid type grating having grooves or projections formed in a lattice shape.

11.3 Effects

The grid pattern may be formed on the wafer 131 by overlapping on the wafer 131 the two kinds of interference fringes having the mutually different directions in which the line-and-space patterns are arranged. The number of kinds of interference fringes to be overlapped is of course not limited to two. Patterns of various shapes may be formed by overlapping three or more kinds of interference fringes.

12. Two-Beam Interference Exposure System Using Laser Device Having Coherence Tuning Mechanism (Tenth Embodiment)

Next, a detailed description will be given of the two-beam interference exposure system in a tenth embodiment of the present disclosure, with reference to the drawings. In the following description, those constituent elements that are similar to those described above are designated by the same reference characters, and redundant description thereof will be omitted. In addition, this embodiment may be combined with other configurations of the present disclosure.

12.1 Configuration

Figure 32:
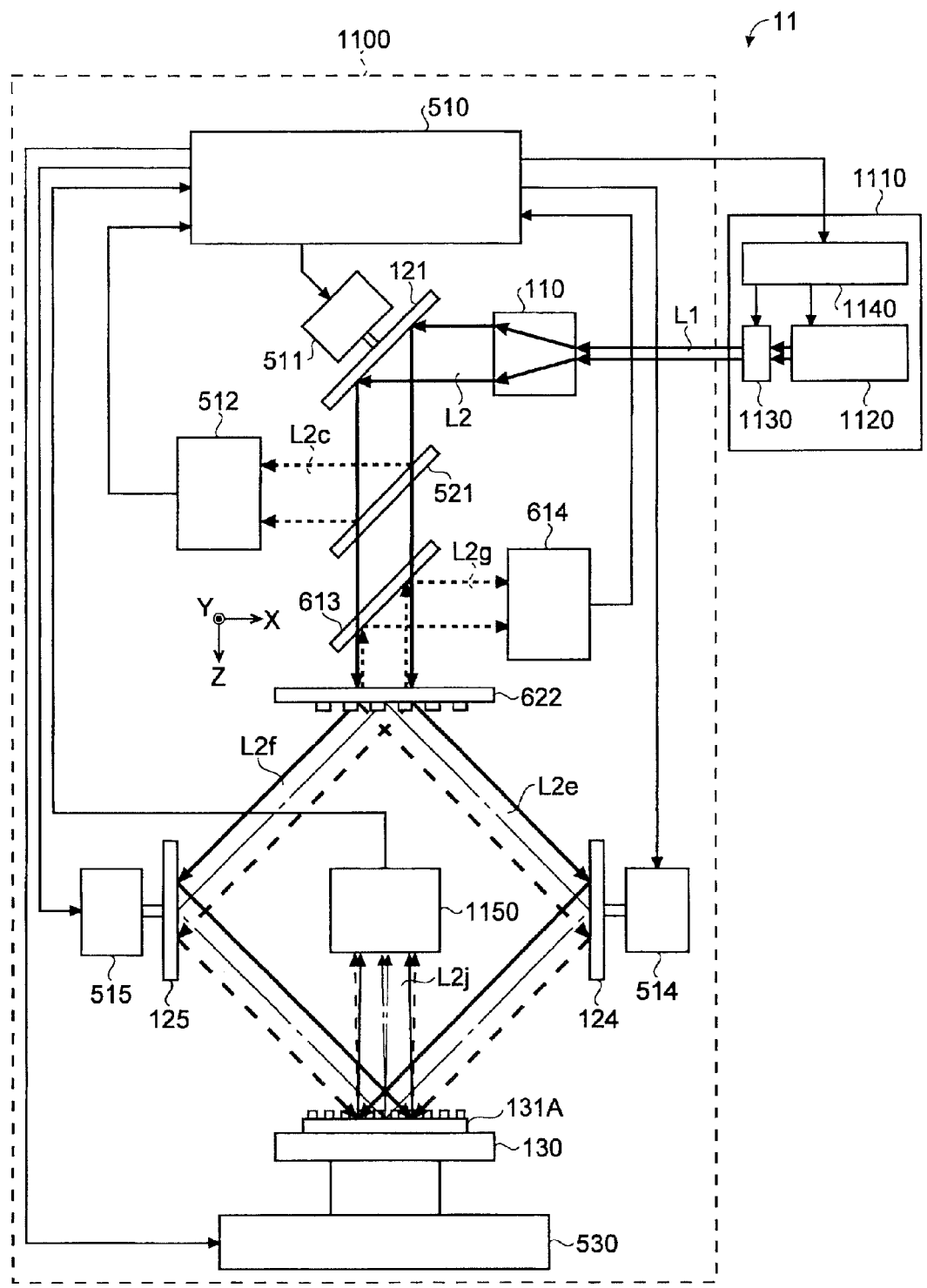
FIG. 32 is a diagram schematically illustrating a configuration of the two-beam interference exposure system in a tenth embodiment.

FIG. 32 is a diagram schematically illustrating a configuration of a two-beam interference exposure system 11 in the tenth embodiment. As illustrated in FIG. 32, the two-beam interference exposure system 11 may use a test wafer 131A that has a reflection type grating formed on an exposure surface thereof, in place of the wafer 131. The two-beam interference exposure system 11 may include a laser device 1110 that is provided with a coherence tuning mechanism in place of the laser device 10. In addition, the two-beam interference exposure system 11 may include an image sensor 1150 to monitor interference fringes formed on the test wafer 131A by diffracted light L2j. A rotary stage 621 may or may not be provided.

The laser device 1110 may include a laser controller 1140, a laser output unit 1120, and a coherence tuning mechanism 1130. The coherence tuning mechanism 1130 may be built within the laser output unit 1120. A detailed description of the coherence tuning mechanism 1130 will be given later in the specification.

The image sensor 1150 may be arranged in an emitting direction of ±1st order diffracted light L2j of +1st order diffracted light L2e and the −1st order diffracted light L2f diffracted by the test wafer 131A. For example, the image sensor 1150 may be formed by a CCD camera.

12.2 Operation

The laser output unit 1120 may output laser light L1 under the control of the laser controller 1140. The laser controller 1140 may control the coherence tuning mechanism 1130 in response to a command received from the controller 510. Hence, the laser light L1 whose spatial coherence is tuned may be output from the laser device 1110.

The laser light L1 output from the laser device 1110 may be incident to the transmission type grating 622 via the beam tuning unit 110, the high reflection mirror 121, and the beam splitters 521 and 613. The +1st order diffracted light L2e and the −1st order diffracted light L2f of the laser light L2 emitted from the transmission type grating 622 may be incident to the test wafer 131A via the high reflection mirrors 124 and 125, respectively. The ±1st order diffracted light L2j of the diffracted light L2e and L2f diffracted by the test wafer 131A may be incident to the image sensor 1150. The image sensor 1150 may generate image data by imaging interference fringes formed on a light receiving surface thereof by the ±1st order diffracted light L2j. The image data may be output to the controller 510. The controller 510 may control the high reflection mirrors 124 and 125 and the stage moving mechanism 530, based on the image data received from the image sensor 1150, in order to adjust the alignment of a two-beam interference apparatus 1100. In addition, the controller 510 may control the coherence tuning mechanism 113, when necessary, during the alignment adjustment.

12.2.1 Flow Chart

Figure 33:
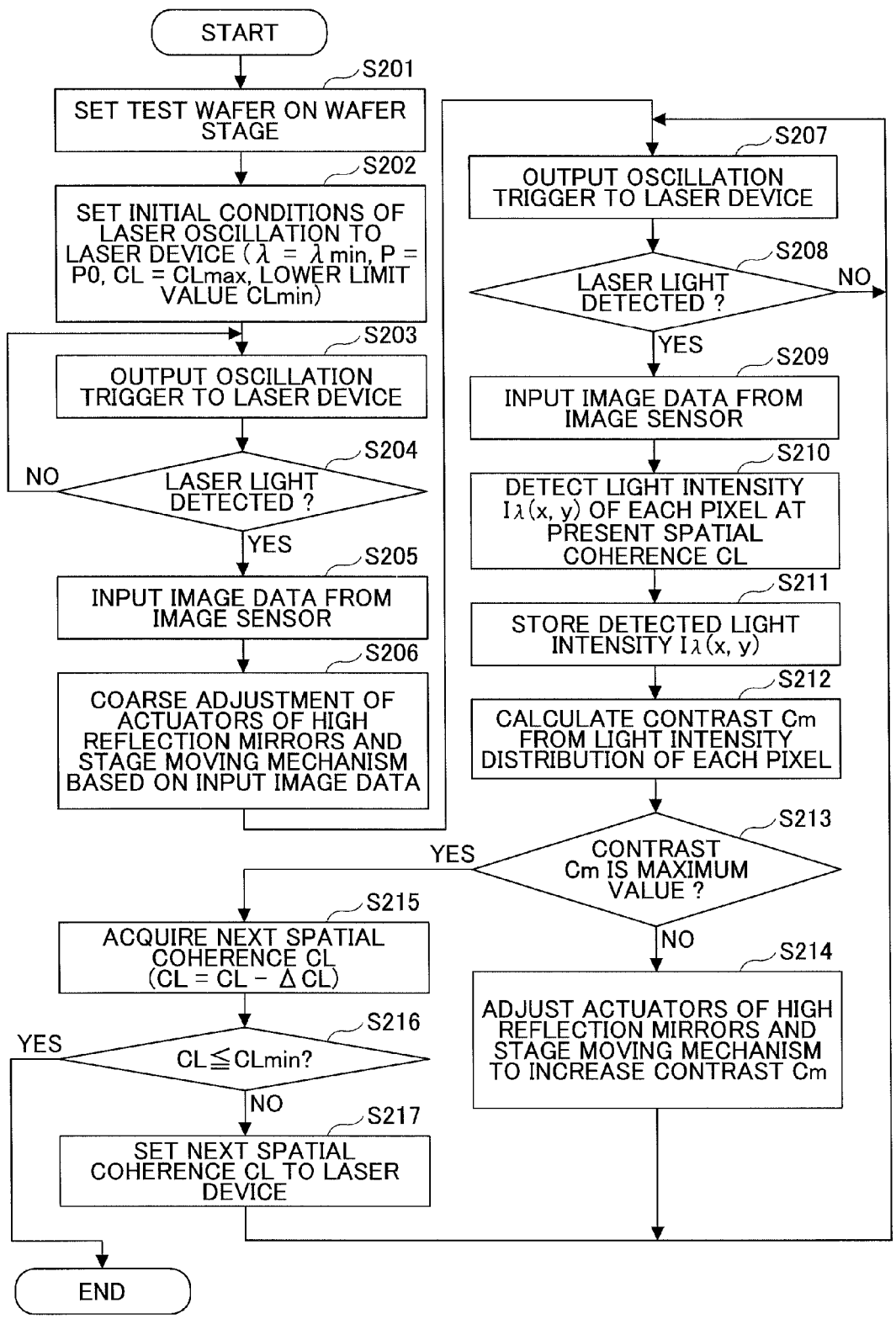
FIG. 33 is a flow chart illustrating an alignment adjusting operation using a coherence tuning mechanism in the tenth embodiment.

FIG. 33 is a flow chart illustrating an alignment adjusting operation using the coherence tuning mechanism. As illustrated in FIG. 33, in the alignment adjusting operation, the controller 510 may use the transport mechanism (not illustrated) or the like to set the test wafer 131A on the wafer stage 130, in step S201. The test wafer 131A may be set manually on the wafer stage 130.

Next, the controller 510 may set initial conditions of the laser oscillation of the laser device 1110, in step S202. The initial conditions may include the oscillation wavelength $\lambda (=\lambda \min)$ and a pulse energy P (=P0), a spatial coherence CL (=CLmax), and a spatial coherence lower limit value CLmin, for example. When the initial conditions are input from the controller 510, the laser controller 1140 of the laser device 1110 may set a current waveform to be applied to the laser output unit 1120 and the alignment of the coherence tuning mechanism 1130, based on the initial conditions.

Next, the controller 510 may output an oscillation trigger to the laser device 1110, in step S203. The laser device 1110 may drive the laser output unit 1120 and output the laser light L1 in response to the oscillation trigger. Next, when the judgment result in step S204 is NO, the controller 510 may wait until the laser light L2 is detected. For example, the laser light L2 may be detected based on an energy value detected by the energy sensor 512.

When the laser light L2 is detected and the judgment result in step S204 is YES, the controller 510 may input the image data from the image sensor 1150, in step S205. Next, the controller 510 may analyze the input image data, and drive the actuators 514 and 515 of the high reflection mirrors 124 and 125, and the stage moving mechanism 530, based on a result of the analysis, in order to perform a coarse adjustment of the optical alignment, in step S206. For example, the coarse alignment adjustment may control the driving of the actuators 514 and 515 and the stage moving mechanism 530, so that an overlap of a region in which the +1st order diffracted light L2e is detected and a region in which the −1st order diffracted light L2f is detected in the image data becomes large. The region in which the +1st order diffracted light L2e is detected and the region in which the −1st order diffracted light L2f is detected may be distinguishable by recognizing a region that moves when the actuator 514 is driven as the detection region of the +1st order diffracted light L2e, for example. In addition, the coarse alignment adjustment may be repeated until the overlap of the region in which the +1st order diffracted light L2e is detected and the region in which the −1st order diffracted light L2f is detected in the image data becomes the largest.

When the coarse alignment adjustment of the two-beam interference apparatus 1100 is completed, the controller 510 may then output the oscillation trigger to the laser device 1110, in step S207. Next, when the judgment result in step S208 is NO, the controller 510 may wait until the laser light L2 is detected. On the other hand, when the laser light L2 is detected and the judgment result in step S208 is YES, the controller 510 may input the image data from the image sensor 1150, in step S209. Next, the controller 510 may detect the light intensity $I_\lambda(x, y)$ of each pixel (x, y) from the input image data, in step S210. In addition, the controller 510 may store, in the memory (not illustrated) or the like, the light intensity $I_\lambda(x, y)$ for each detected pixel in correspondence with the spatial coherence CL presently set in the coherence tuning mechanism 1130, in step S211.

Next, the controller 510 may calculate a contrast Cm of the interference fringes monitored by the image sensor 1150, from the light intensity distribution of each stored pixel, in step S212. A definition of the contrast Cm will be given later in the specification.

Next, the controller 510 may judge whether the calculated contrast Cm is a maximum value, in step S213. When the contrast Cm is not the maximum value and the judgment result in step S213 is NO, the controller 510 may adjust the optical alignment by driving the actuators 514 and 515 of the high reflection mirrors 124 and 125, and the stage moving mechanism 530, so that the contrast Cm increases, in step S214. Thereafter, the controller 510 may return the operation to step S207, in order to calculate the contrast Cm after the alignment adjustment.

On the other hand, when the contrast Cm is the maximum value and the judgment result in step S213 is YES, the controller 510 may acquire the spatial coherence CL (=CL−ΔCL) that is to be set next to the laser device 1110, in step S215. The spatial coherence CL that is to be set next may be obtained by subtracting a preset step width ΔCL from the present spatial coherence CL. However, the spatial coherence CL that is to be set next is not limited to the above, and for example, a table of spatial coherences CL to be used for the measurement may be stored in the memory (not illustrated) or the like.

Next, the controller 510 may judge whether the next spatial coherence CL is less than or equal to a minimum value CLmin of the spatial coherence that may be set in the coherence tuning mechanism 1130, in step S216. When the next spatial coherence CL is greater than the minimum value CLmin and the judgment result in step S216 is NO, the controller 510 may set the next spatial coherence CL in the laser device 1110, in step S217. Thereafter, the controller 510 may return the operation to step S207, in order to repeat the operation described above until the next spatial coherence CL becomes less than or equal to the minimum value CLmin. On the other hand, when the next spatial coherence CL is less than or equal to the minimum value CLmin and the judgment result in step S216 is YES, the controller 510 may end the operation. In the operation described above, time coherence may be used in place of the spatial coherence CL.

12.3 Effects

According to the tenth embodiment described above, the optical alignment of the two-beam interference apparatus 1100 may be adjusted with a high accuracy. As a result, highly accurate line-and-space patterns may be formed on the wafer 131.

13. Variation of Laser Device

Next, a description will be given of other examples of the laser device in the embodiments described above.

13.1 MOPA System

Figure 34:
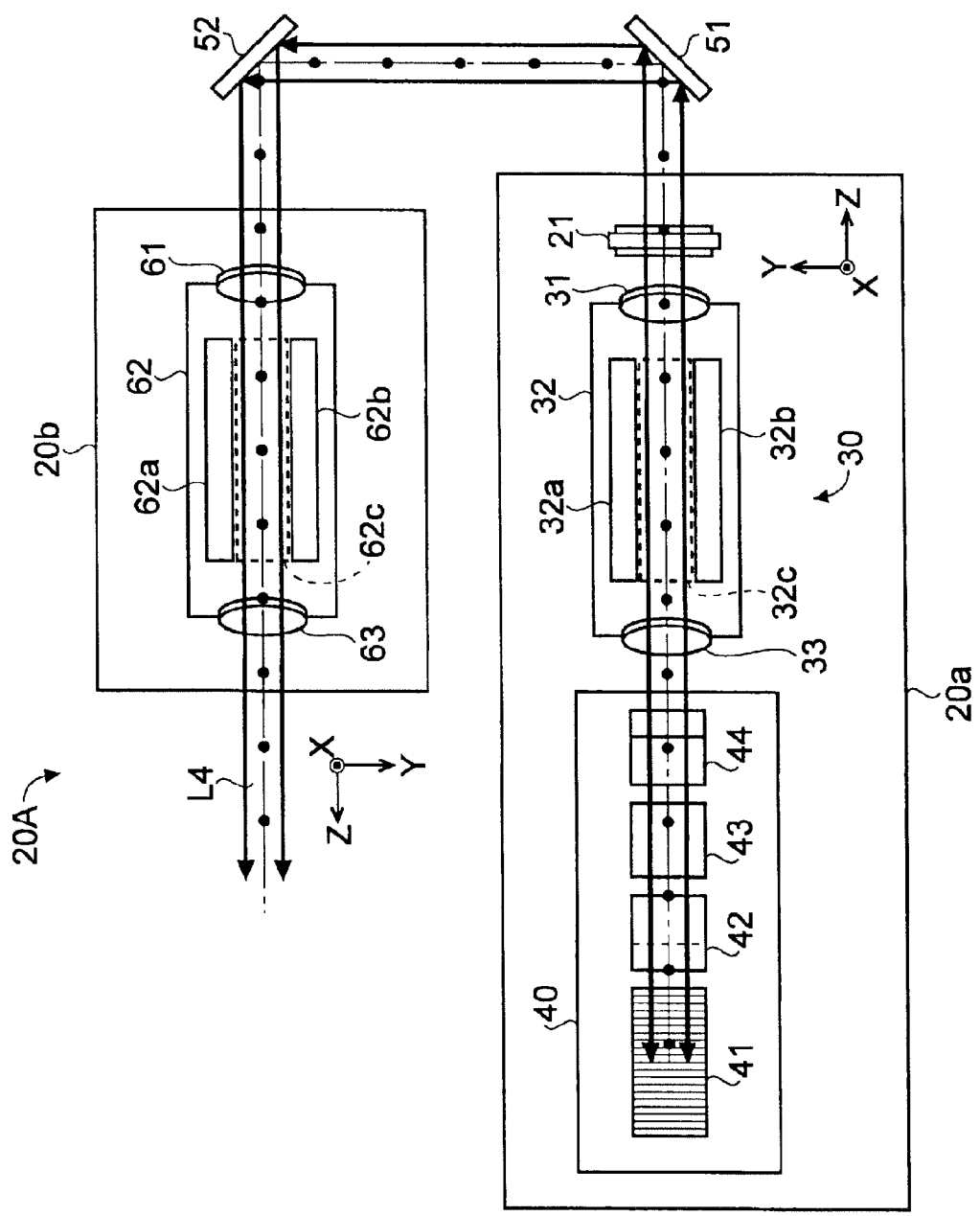
FIG. 34 is a diagram illustrating an example of a MOPA system laser device.

FIG. 34 is a diagram illustrating an example of a MOPA (Master Oscillator Power Amplifier) system laser device 20A. As illustrated in FIG. 34, the laser device 20A may include a master oscillator 20a and an amplifier apparatus 20b. High reflection mirrors 51 and 52 may be provided between the master oscillator 20a and the amplifier apparatus 20b, as an optical system that guides laser light output from the master oscillator 20a to the amplifier apparatus 20b.

The master oscillator 20a may have a configuration similar to that of the excimer laser device 20 described above. The amplifier apparatus 20b may amplify the laser light output from the master oscillator 20a. The amplifier apparatus 20b may include a laser chamber 62, windows 61 and 63, and a pair of excitation electrodes 62a and 62b. A discharge region 62c may be formed between the excitation electrodes 62a and 62b.

The windows 61 and 63 may be arranged to be inclined by the Brewster's angle with respect to the optical axis of the laser light that is input via the optical system. The direction in which the windows 61 and 63 are inclined with respect to the laser light may preferably be the same as that of the windows 31 and 33 in the amplifier unit 30 within the master oscillator 20a. For example, in a case in which the windows 31 and 33 are inclined in the X-direction with respect to the laser light, the windows 61 and 63 may preferably be also inclined in the X-direction with respect to the laser light. By employing such an arrangement and combination, the laser light L4 output from the laser device 20A may be made linearly polarized substantially in the X-direction, for example.

The inside of the laser chamber 62 may be filled with excimer gas forming the laser medium. The excimer gas may include various laser gasses such as a mixture gas of Kr gas and $F_2$ gas, and a mixture gas of Ar gas and $F_2$ gas. An excitation power from a power supply (not illustrated) may be applied to the excitation electrodes 62a and 62b under the control of a controller (not illustrated). A discharge may occur when the excitation power is applied to the excitation electrodes 62a and 62b, and the discharge region 62c may be formed between the excitation electrodes 62a and 62b. The laser light passing through the discharge region 62c may be amplified.

When the MOPA system laser device 20A described above is used, the laser light output from the master oscillator 20a may be amplified by the amplifier unit 20b in a state in which the quality of light is maintained. Accordingly, the laser light may be amplified substantially without affecting the quality of light including the spatial coherence, the time coherence, and the polarization direction. For this reason, it may be possible to further increase the light intensity of the interference fringes formed on the wafer 131 in the third embodiment described above, for example. The MOPA system laser device 20A of this example may be advantageous when a solid state oscillator is used for the master oscillator.

13.2 MOPO System

Figure 35:
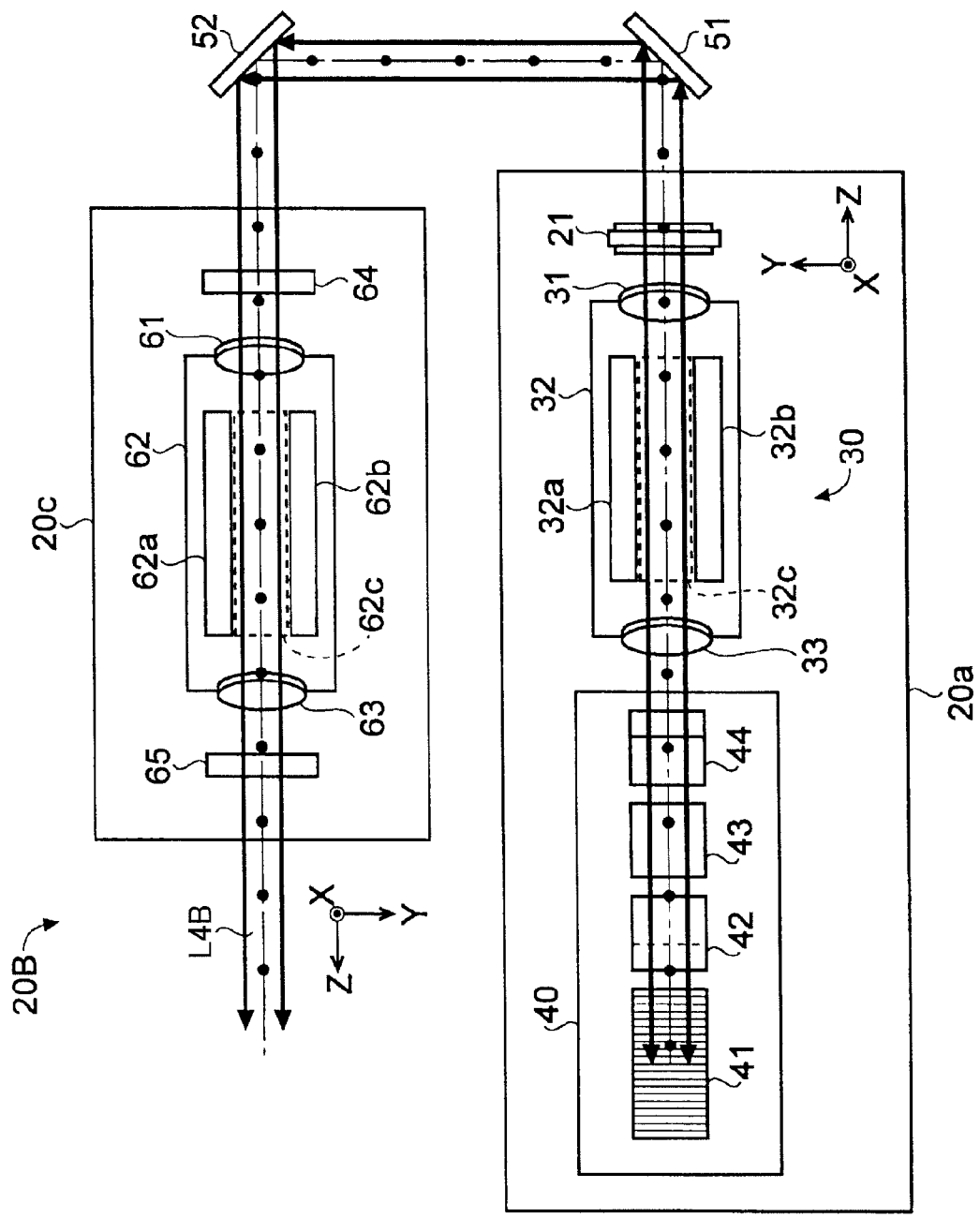
FIG. 35 is a diagram illustrating an example of a MOPO system laser device.

FIG. 35 is a diagram illustrating an example of a MOPO (Master Oscillator Power Oscillator) system laser device 20B. As illustrated in FIG. 35, the laser device 20B may include a master oscillator 20a and an amplifier apparatus 20c. The amplifier apparatus 20c may have a configuration similar to that of the amplifier apparatus 20b illustrated in FIG. 34, and further include a pair of resonator mirrors 64 and 65 that are arranged in an optical path of the laser light to sandwich a laser chamber 62.

In the MOPO system laser device 20B having a stable resonator, the laser light output from the master oscillator 20a may be amplified in a state in which the time coherence and the polarization direction are maintained. However, the spatial coherence may be affected depending on the configuration of the resonator. For example, in a case in which the resonator is formed by a Fabry-Perot stable resonator, the spatial coherence may become low. However, when the spatial coherence in the X-direction and the spatial coherence in the Y-direction are compared, the spatial coherence in the X-direction may become high. Accordingly, in a case in which laser light L4B is incident to the two-beam interference apparatus, the direction having the high spatial coherence may be utilized. For example, the laser light L4B output from the laser device 20B may be incident to the two-beam interference apparatus in accordance with the coordinate system of the laser light L4 output from the laser device 20 illustrated in FIG. 6.

13.3 Laser Device Using Amplifier Apparatus With Ring Resonator

Figure 36:
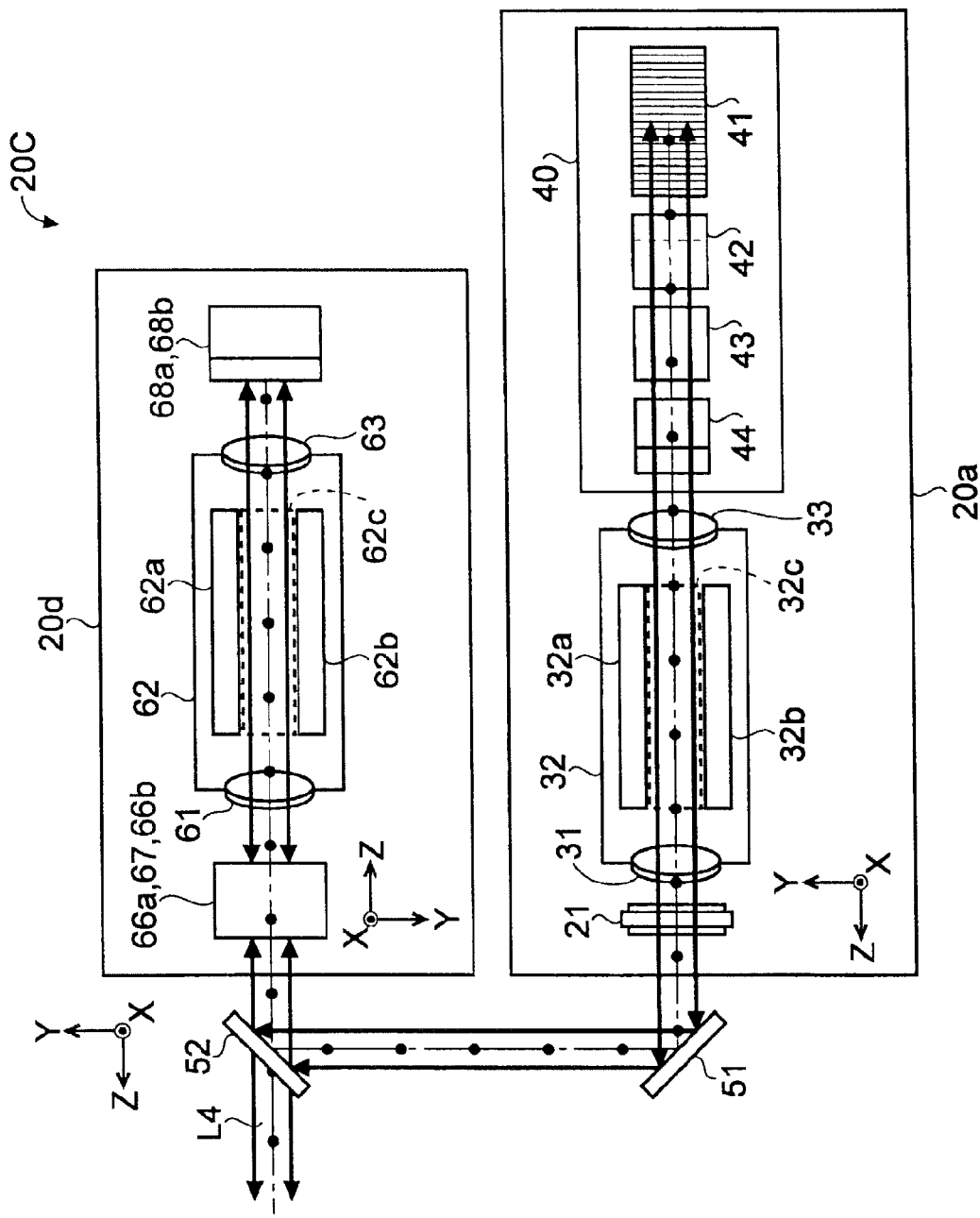
FIG. 36 is a diagram illustrating the laser device using a power oscillator provided with a ring resonator when viewed from the X-direction.
Figure 37:
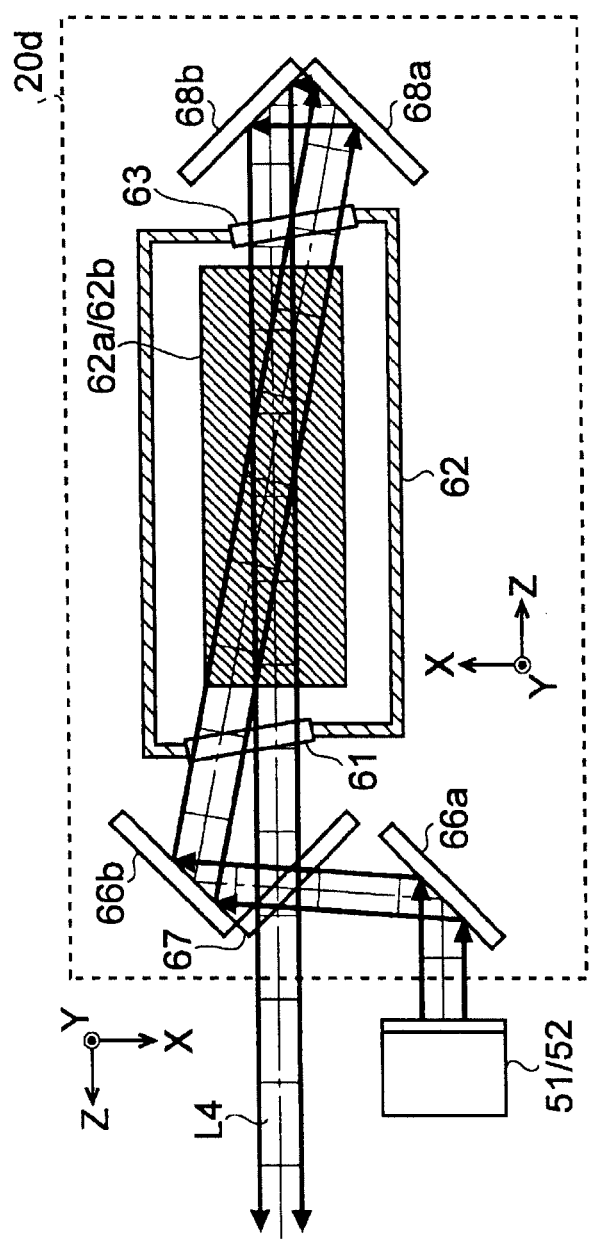
FIG. 37 is a diagram illustrating an amplifier apparatus of the laser device illustrated in FIG. 36 when viewed from the Y-direction.

FIGS. 36 and 37 illustrate an example of a laser device 20C using a power oscillator provided with a ring resonator. FIG. 36 is a diagram illustrating the laser device 20C when viewed from the X-direction with respect to the laser light L4, and FIG. 37 is a diagram illustrating an amplifier apparatus 20d of the laser device 20C when viewed from the Y-direction with respect to the laser light L4.

As illustrated in FIGS. 36 and 37, the laser device 20C may include a master oscillator 20a and the amplifier apparatus 20d. The amplifier apparatus 20d may include high reflection mirrors 66a, 66b, 68a and 68b, an output coupler 67, and a laser chamber 62. The high reflection mirrors 66a, 66b, 68a and 68b, and the output coupler 67 may form a multi-path optical path in which the laser light passes through a discharge region 62c within the laser chamber 62 a plurality of times. The output coupler 67 may be formed by a partial reflecting mirror. The laser chamber 62 may be arranged in an optical path formed by the high reflection mirrors 66a, 66b, 68a and 68b, and the output coupler 67. The amplifier apparatus 20d may further include slits (not illustrated) to tune the beam profile of the laser light propagating within the amplifier apparatus 20d. A gain medium, such as excimer gas, may be sealed inside the laser chamber 62 in order to fill a discharge region 62c. For example, the gain medium may include at least one of Kr gas, Ar gas, $F_2$ gas, Ne gas, and Xe gas.

According to the configuration described above, the laser light output from the master oscillator 20a, for example, may be incident to the amplifier apparatus 20d via the high reflection mirrors 51 and 52. The incident laser light may first be reflected by the high reflection mirrors 66a and 66b, and then be input inside the laser chamber 62 via the window 61. The laser light input inside the laser chamber 62 may be amplified as the laser light passes through the discharge region 62c between the two excitation electrodes 62a and 62b that are applied with a voltage. The laser light after the amplification may be emitted from the laser chamber 62 via the window 63. The emitted laser light may be reflected by the high reflection mirrors 68a and 68b, and be input again inside the laser chamber 62 via the window 63. Thereafter, the laser light may be amplified again as the laser light passes through the discharge region 62c within the laser chamber 62. The laser light after the amplification may be emitted from the laser chamber 62 via the window 61.

A part of the laser light that passes through the discharge region 62c within the laser chamber 62 two times may be output via the output coupler 67. In addition, the remaining part of the laser light reflected by the output coupler 67 may be amplified again as the remaining part of the laser light propagates along the optical path formed by the high reflection mirrors 66b, 68a and 68b, and the optical coupler 67.

When the laser device 20C that uses the amplifier apparatus 20d including the ring resonator is used to input the laser light L4 to the two-beam interference exposure system 3, the XYZ-directions of the laser light L4 may be matched to the XYZ-directions of the laser light L4 illustrated in FIG. 6.

13.4 Laser Device Using Amplifier Apparatus with Unstable Resonator

Figure 38:
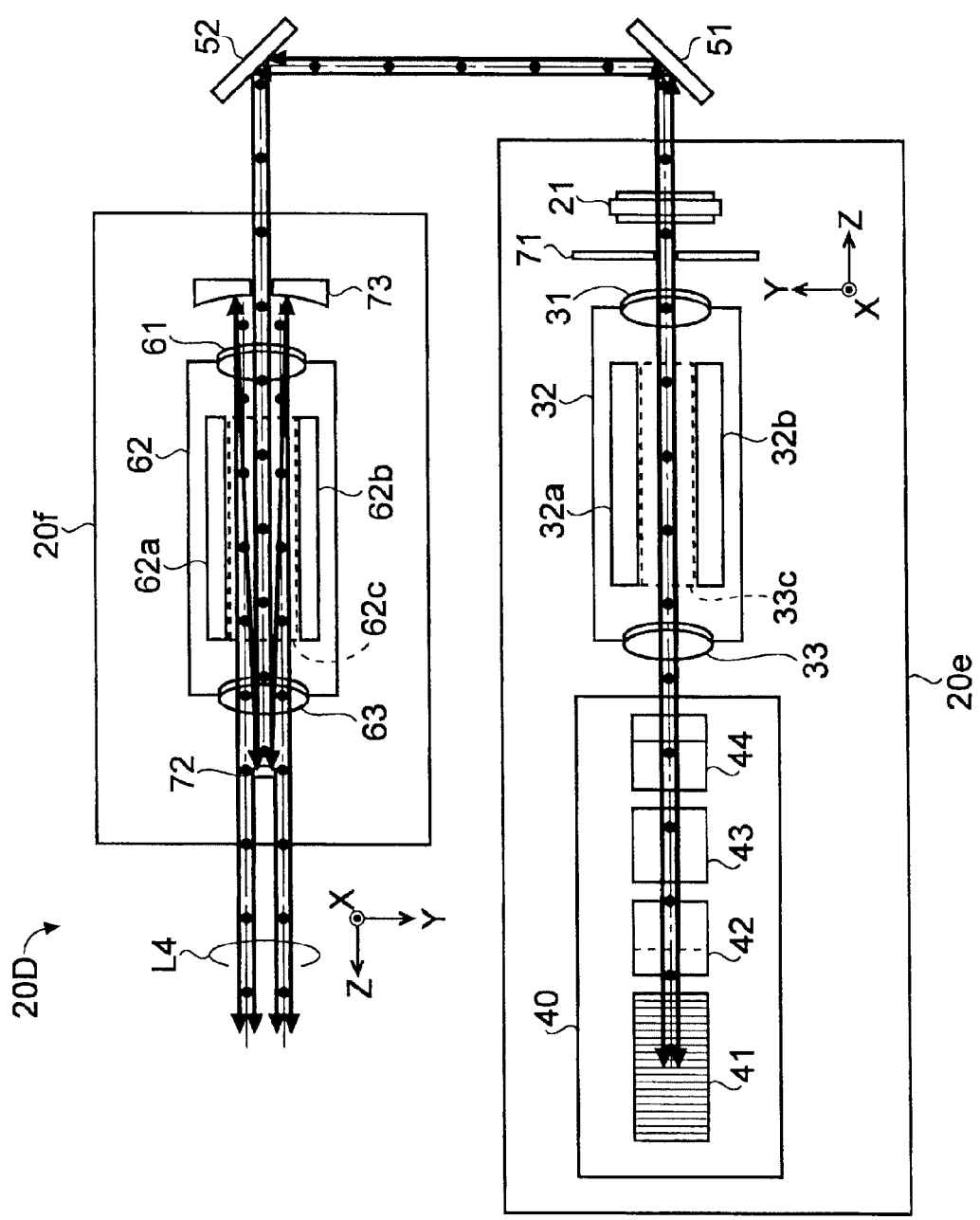
FIG. 38 is a diagram illustrating an example of the laser device using the amplifier apparatus provided with an unstable resonator.

FIG. 38 is a diagram illustrating an example of a laser device 20D using an amplifier apparatus 20f provided with an unstable resonator. As illustrated in FIG. 38, the laser device 20D may include a master oscillator 20e and the amplifier apparatus 20f. The master oscillator 20e may have a configuration similar to that of the master oscillator 20a, and further include a pin hole 71 arranged in an optical path of the laser light reciprocating within the optical resonator. By providing the pin hole 71, the number of transverse modes within the master oscillator 20e may be reduced, and the spatial coherence may be improve not only in the X-direction but also in the Y-direction.

The amplifier apparatus 20f may have a configuration similar to that of the amplifier apparatus 20b, and further include a convex high reflection mirror 72 and a concave high reflection mirror 73 that sandwich a laser chamber 62 in the optical path of the laser light. The convex high reflection mirror 72 and the concave high reflection mirror 73 may form an unstable resonator.

The concave high reflection mirror 73 may include a penetration hole to pass the laser light output from the master oscillator 20e from a surface on the opposite side from the reflection surface thereof. This penetration hole may be formed approximately at the center of the reflection surface. The laser light passing the penetration hole may be amplified as the laser light passes through a discharge region 62c within the laser chamber 62. The amplified laser light may be reflected by the convex high reflection mirror 72, to again pass through the discharge region 62c within the laser chamber 62. In this case, the laser light may be converted into enlarged light. The enlarged light may be reflected by the concave high reflection mirror 73, to again pass through the discharge region 62c within the laser chamber 62. In this case, the enlarged light may be converted into collimated light. Thereafter the collimated light may be output from the amplifier apparatus 20f, as the laser light L4.

The time coherence and the polarization direction of the laser light L4 output from the MOPO system laser device 20D including the unstable resonator may be the same as those of the laser light output from the master oscillator 20e. However, the spatial coherence of the laser light L4 output from the MOPO system laser device 20D may be higher than that of the laser light output from the master oscillator 20e. For this reason, the spatial coherence may be high when compared to that of the third embodiment described above. As a result, the contrast of the interference fringes formed by the two-beam interference apparatus 300 may be high.

In FIG. 38, the unstable resonator, that is formed by the concave high reflection mirror 73 having the penetration hole and the convex high reflection mirror 72, is used in the example; however, the configuration of the unstable resonator is not limited to such a resonator. For example, the unstable resonator may be formed by two mirrors that are coated with a partial reflection film. In this case, the curvature of each mirror may be designed to form the unstable resonator.

13.5 Solid State Laser Device

Figure 39:
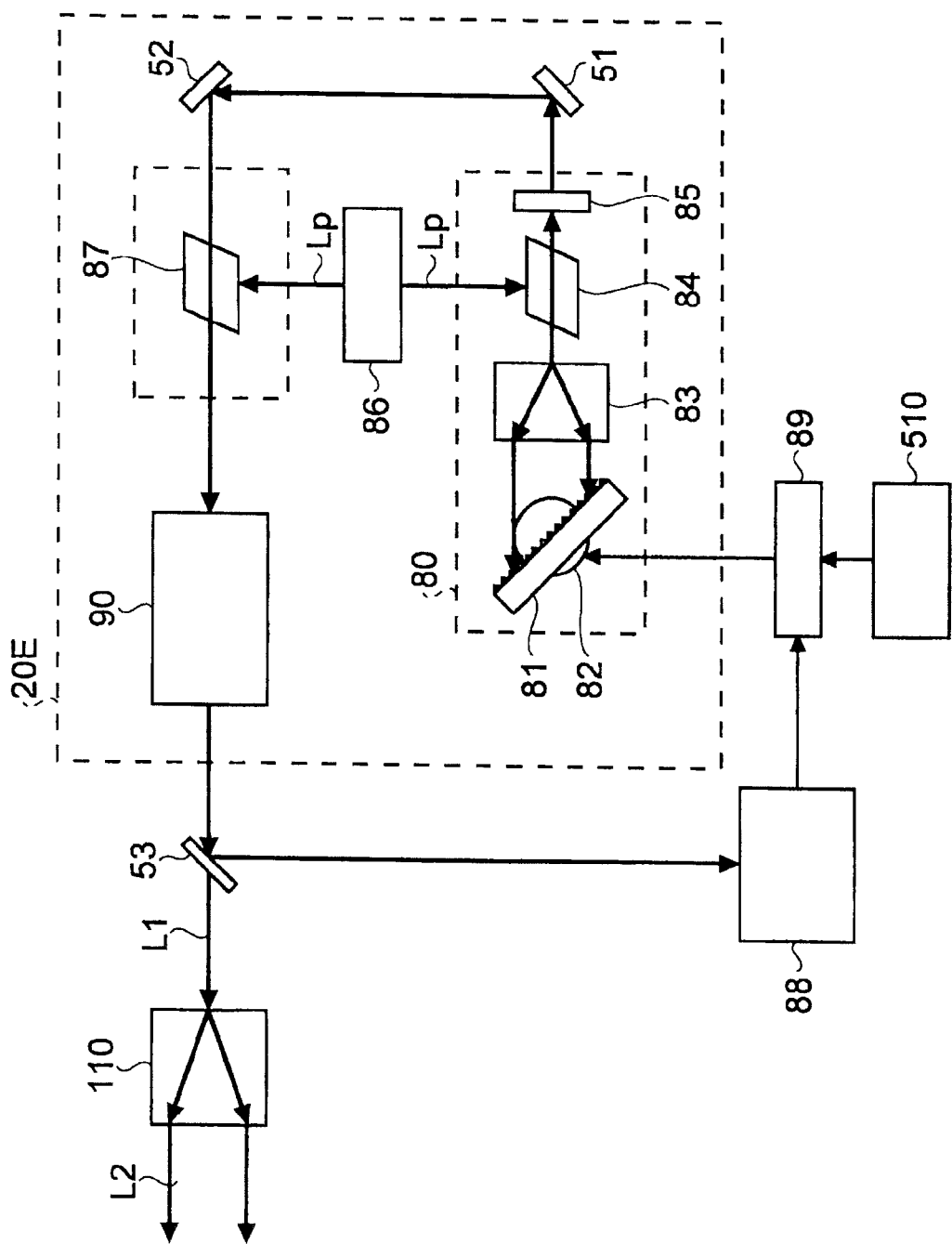
FIG. 39 is a diagram illustrating an example of a solid state laser device.

FIG. 39 is a diagram illustrating an example of a solid state laser device 20E. As illustrated in FIG. 39, the solid state laser device 20E may include a master oscillator 80, a pumping laser 86, an amplifier unit 87, and a wavelength converter 90. In addition, the solid state laser device 20E may further include a beam splitter 53, a wavelength detector 88, and a laser controller 89.

For example, the master oscillator 80 may be formed by a titanium sapphire laser. The master oscillator 80 may include a grating 81, a beam expander 83, a titanium sapphire crystal 84, and an output coupling mirror 85. The grating 81 may be fixed on a rotary table 82 that is rotatable. The titanium sapphire crystal 84 may be supplied with pumping light Lp from the pumping laser 86. Hence, the master oscillator 80 may undergo a laser oscillation in a single vertical mode. A wavelength of the laser light output from the master oscillator 80 may be 773.6 nm, for example.

The laser light output from the master oscillator 80 may be input to the amplifier unit 87 via an optical system that includes the high reflection mirrors 51 and 52 and the like. The amplifier unit 87 may include a titanium sapphire crystal, for example. In addition, the amplifier unit 87 may be formed by a power oscillator or a power amplifier. The pumping light Lp from the pumping laser 86 may be supplied to the amplifier unit 87. Hence, the laser light passing through the amplifier unit 87 may be amplified. The pumping laser 86 may be formed by a pumping laser that is provided separately from the master oscillator 80.

The laser light output from the amplifier unit 87 may be incident to the wavelength converter 90. The wavelength converter 90 may convert the wavelength of the laser light by generating harmonic light having the incident laser light as the fundamental wave.

The laser light output from the wavelength converter 90 may be input as it is to the two-beam interference apparatus. Alternatively, the laser light output from the wavelength converter 90 may be input to the two-beam interference apparatus after being amplified by a power oscillator, a power amplifier, or the like using ArF/KrF excimer laser.

In addition, the laser light output from the wavelength converter 90 may be split by the beam splitter 53. The wavelength detector 88 may detect the wavelength of the split laser light. The detected wavelength data may be input to the laser controller 89. The laser controller 89 may control the rotary table 82 of the master oscillator 80 so that the wavelength indicated by the wavelength data input from the wavelength detector 88 becomes the oscillation wavelength λ that is specified from the controller 510.

13.5.1 Wavelength Converter For ArF Excimer Laser

Figure 40:
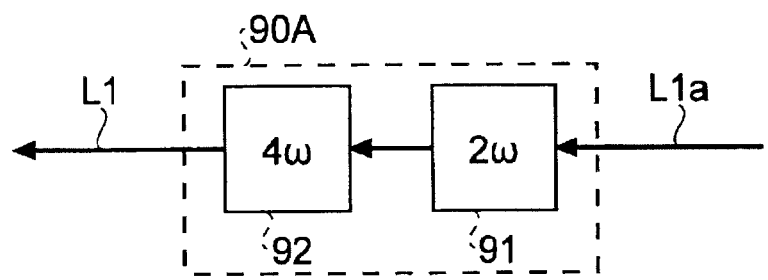
FIG. 40 is a diagram illustrating an example of a wavelength converter for ArF excimer laser.

FIG. 40 is a diagram illustrating an example of the wavelength converter for ArF excimer laser. As illustrated in FIG. 40, a wavelength converter 90A may include two non-linear optical crystals 91 and 92. The non-linear optical crystal 91 may be formed by a LBO crystal, for example. The non-linear optical crystal 92 may be formed by a KBBF crystal, for example. A BBO crystal or the like may be used in place of the LBO crystal forming the non-linear optical crystal 91.

The non-linear optical crystal 91 may generate second harmonic light (wavelength of 386.8 nm) having incident laser light L1a (wavelength of 773.6 nm) as the fundamental wave. The non-linear optical crystal 92 may generate fourth harmonic light (wavelength of 193.4 nm) that is the second harmonic in a case in which the second harmonic light generated by the non-linear optical crystal 91 is the fundamental wave. The fourth harmonic light may be output as the laser light L1.

13.5.2 Wavelength Converter For KrF Excimer Laser

Figure 41:
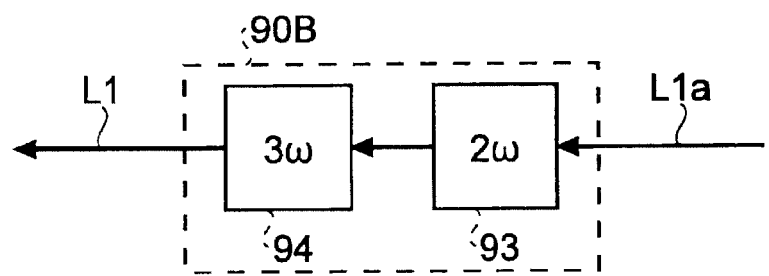
FIG. 41 is a diagram illustrating an example of a wavelength converter for KrF excimer laser.

FIG. 41 is a diagram illustrating an example of a wavelength converter for KrF excimer laser. As illustrated in FIG. 41, a wavelength converter 90B may include two non-linear optical crystals 93 and 94. The non-linear optical crystal 93 may be formed by a LBO crystal, for example. The non-linear optical crystal 94 may be formed by a BBO crystal, for example. A BBO crystal, a CLBO crystal or the like may be used in place of the LBO crystal forming the non-linear optical crystal 93. In addition, a CLBO crystal or the like may be used in place of the BBO crystal forming the non-linear optical crystal 94.

The non-linear optical crystal 93 may generate second harmonic light (wavelength of 372.6 nm) having incident laser light L1a (wavelength of 745.2 nm) as the fundamental wave. The non-linear optical crystal 94 may generate third harmonic light (wavelength of 248.4 nm) that corresponds to a sum frequency of the second harmonic light generated by the non-linear optical crystal 93 and the laser light L1a transmitted through the non-linear optical crystal 93. The third harmonic light may be output as the laser light L1.

13.6 F2 Laser Using Solid State Seeder

The laser device in the embodiments described above may be formed by a F2 laser using a solid state seeder. A description will hereinafter be given of examples of the F2 laser using the solid state seeder.

13.6.1 Solid State Seeder Using Non-Linear Optical Crystal

Figure 42:
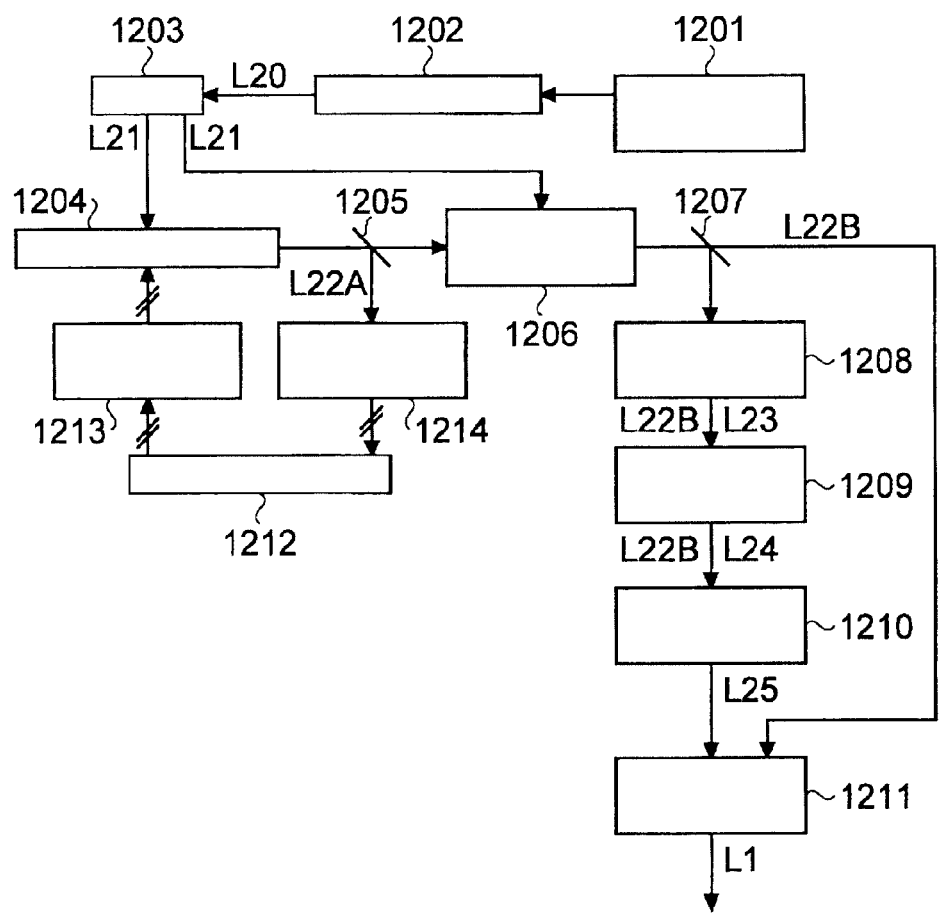
FIG. 42 is a diagram illustrating an example of an ultraviolet laser device using a solid state seeder for F2 laser.

FIG. 42 is a diagram illustrating an example of an ultraviolet laser device 1200 using a solid state seeder for F2 laser. As illustrated in FIG. 42, the ultraviolet laser device 1200 may include a YLF laser device 1202 and a single mode titanium sapphire laser device 1204. In addition, the ultraviolet laser device 1200 may include a multi-path amplifier 1206 to amplify laser light using a titanium sapphire crystal, and wavelength converters 1208 through 1211 to convert the wavelength of the amplified laser light. In the following description, the single mode titanium sapphire laser device may also be referred to as a titanium sapphire laser device.

The YLF laser device 1202 may be excited by a semiconductor laser device 1201, and output laser light L20 having a wavelength of 1054.0 nm. The laser light L20 emitted from the YLF laser device 1202 may be incident to a second harmonic generator 1203, and converted into laser light L21 having a wavelength of 527.0 nm.

The laser light L21 emitted from the second harmonic generator 1203 may be incident to the titanium sapphire laser device 1204, in order to excite the titanium sapphire laser device 1204. The excited titanium sapphire laser device 1204 may output laser light L22A having a wavelength of 788.145 nm. The laser light L22A may be obtained by a pulse oscillation at a high repetition frequency. The wavelength of the laser light L22A may be in a narrow band single vertical mode.

The laser light L22A emitted from the titanium sapphire laser device 1204 may be split by a beam splitter 1205. A part of the laser light L22A reflected by the beam splitter 1205 may be incident to a wavelength detector 1214. A controller 1212 may control the titanium sapphire laser device 1204 via a wavelength controller 1213, based on a detection result of the wavelength detector 1214, so that the wavelength of the laser light L22A is maintained to a target value (788.145 nm).

The laser light L22A transmitted through the beam splitter 1205 may be incident to the multi-path amplifier 1206. The multi-path amplifier 1206 may be excited by the laser light L21 emitted from the second harmonic generator 1203. The excited multi-path amplifier 1206 may amplify the laser light L22A output from the titanium sapphire laser device 1204, in a state in which the wavelength (788.145 nm) and the spectral line width are maintained.

The amplified laser light L22B may be incident to the wavelength converter 1208. The wavelength converter 1208 may include a non-linear optical crystal, such as a BBO crystal, a LBO crystal, a CLBO crystal, and the like, for example. The wavelength converter 1208 may convert the laser light L22B into laser light L23 having a wavelength of 394.073 nm, utilizing the second order non-linear optical effect.

Figure 43:
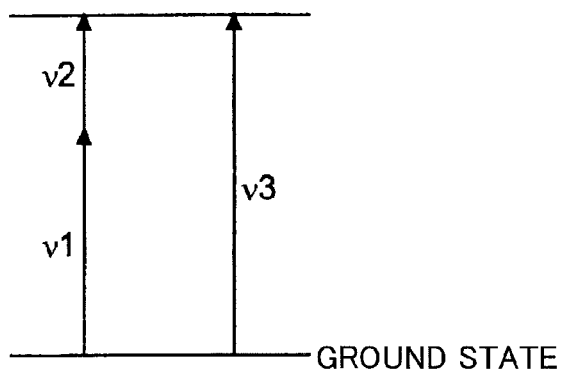
FIG. 43 is a diagram for explaining a non-liner optical effect of a non-linear optical crystal.

A brief description will be given of the non-linear optical effect for a case in which laser light having a wavelength $\omega 1$ and laser light having a wavelength $\omega 2$ are converted into laser light having a shorter wavelength $\omega 3$ ($\omega 1 > \omega 3$, $\omega 2 > \omega 3$) using the non-linear optical crystal. In FIG. 43, $\nu 1$ denotes the frequency of the laser light having the wavelength $\omega 1$ input to the non-linear optical crystal, $\nu 2$ denotes the frequency of the laser light having the wavelength $\omega 2$ input to the non-linear optical crystal, and $\nu 3$ denotes the frequency of the laser light having the wavelength $\omega 3$ output from the non-linear optical crystal. As illustrated in FIG. 43, when the laser light having the frequency $\nu 1$ and the laser light having the frequency $\nu 2$ are incident to the non-linear optical crystal, polarization may occur in the non-linear optical crystal due to the optical electric field of the laser light. The laser light having the frequency $\nu 3$ ($=\nu 1+\nu 2$), which is the sum of the frequencies $\nu 1$ and $\nu 2$, may be generated due to the polarization. In this case, because the frequency $\nu 3$ is higher than each of the frequencies $\nu 1$ and $\nu 2$, the wavelength $\omega 3$ may be shorter than each of the wavelengths $\omega 1$ and $\omega 2$. In addition, in a case in which the wavelengths $\omega 1$ and $\omega 2$ satisfy $\omega 1 = \omega 2$, for example, the frequency $\nu 3$ becomes $2 \cdot \nu 1$, and the wavelength $\omega 3$ becomes $(1/2) \cdot \omega 1$.

The laser light L23 (wavelength of 394.073 nm) whose wavelength is converted and the laser light L22B (wavelength of 788.145 nm) transmitted through the wavelength converter 1208 may be incident to the wavelength converter 1209. The wavelength converter 1209 may include a non-linear optical crystal similar to that of the wavelength converter 1208. The wavelength converter 1209 may convert the wavelengths of the laser light L22B and the laser light L23, and output laser light L24 having a wavelength of 262.715 nm.

The laser light L24 whose wavelength is converted and the laser light L22B (wavelength of 788.145 nm) transmitted through the wavelength converter 1209 may be incident to the wavelength converter 1210. The wavelength converter 1210 may include a non-linear optical crystal similar to that of the wavelength converter 1209. The wavelength converter 1210 may convert the wavelengths of the laser light L22B and the laser light L24, and output laser light L25 having a wavelength of 197.036 nm.

The laser light L25 whose wavelength is converted and the laser light L22B (wavelength of 788.145 nm) split by a beam splitter 1207 may be incident to the wavelength converter 1211. The wavelength converter 1211 may include a $KBe_2BO_3F_2$ (hereinafter simply referred to as KBBF) crystal having the non-linear optical effect. The mechanism of the wavelength conversion by the KBBF crystal may be the same as the non-linear optical effect described above in conjunction with FIG. 43, and the KBBF crystal may convert the wavelengths of the laser light L22B and the laser light L25 and output the laser light L25 having a wavelength of 157.629 nm. The KBBF crystal may have a characteristic to partially transmit the light having the wavelength of 157 nm. For this reason, the laser light L1 having a wavelength of 157.629 nm may be output from the wavelength converter 1211.

13.6.2 Solid State Seeder Using Xenon Gas Cell

Figure 44:
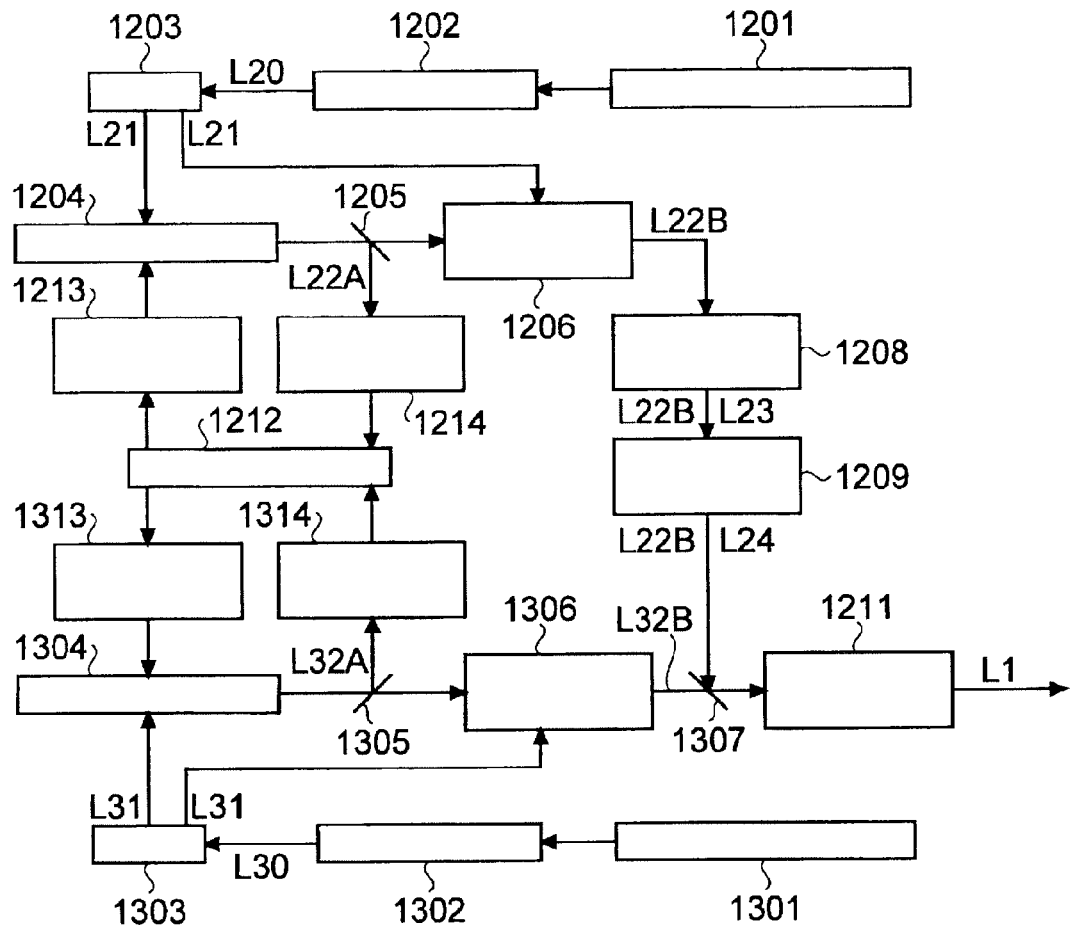
FIG. 44 is a diagram illustrating another example of the ultraviolet laser device using the solid state seeder for F2 laser.

FIG. 44 is a diagram illustrating another example of an ultraviolet laser device 1300 using the solid state seeder for F2 laser. As illustrated in FIG. 44, the ultraviolet laser device 1300 may include YLF laser devices 1202 and 1302, and single mode titanium sapphire laser devices 1204 and 1304. In addition, the ultraviolet laser device 1300 may include multi-path amplifiers 1206 and 1306 to amplify the laser light using a titanium sapphire crystal, and wavelength converters 1208 through 1211 to convert the wavelength of the amplified laser light. In the following description, the single mode titanium sapphire laser device may also be referred to as a titanium sapphire laser device.

The YLF laser devices 1202 and 1302 may be excited by semiconductor laser devices 1201 and 1301, to generate laser light L20 and laser light L30 having a wavelength of 1054.0 nm, respectively. The laser light L20 emitted from the YLF laser device 1202 may be incident to a second harmonic generator 1203, and converted into laser light L21 having a wavelength of 527.0 nm. On the other hand, the laser light L30 emitted from the YLF laser device 1302 may be incident to a second harmonic generator 1303, and converted into laser light L31 having a wavelength of 527.0 nm.

The laser light L21 emitted from the second harmonic generator 1203 may be incident to the titanium sapphire laser device 1204, to excite the titanium sapphire laser device 1204. The excited titanium sapphire laser device 1204 may output laser light L22A having a wavelength of 768.046 nm. On the other hand, the laser light L31 emitted from the second harmonic generator 1303 may be incident to the titanium sapphire laser device 1304, to excite the titanium sapphire laser device 1304. The excited titanium sapphire laser device 1304 may output laser light L32A having a wavelength of 681.190 nm. Each of the laser light L22A and the laser light L32A may be obtained by a pulse oscillation at a high repetition frequency. The wavelengths of the laser light L22A and the laser light L32A may be in a narrow band single vertical mode.

The laser light L22A emitted from the titanium sapphire laser device 1204 may be split by a beam splitter 1205. A part of the laser light L22A reflected by the beam splitter 1205 may be incident to a wavelength detector 1214. A controller 1212 may control the titanium sapphire laser device 1204 via a wavelength controller 1213, based on a detection result of the wavelength detector 1214, so that the wavelength of the laser light L22A is maintained to a target value (768.046 nm). In addition, the laser light L32A emitted from the titanium sapphire laser device 1304 may be split by a beam splitter 1305. A part of the laser light L32A reflected by the beam splitter 1305 may be incident to a wavelength detector 1314. The controller 1212 may control the titanium sapphire laser device 1304 via a wavelength controller 1313, based on a detection result of the wavelength detector 1314, so that the wavelength of the laser light L32A is maintained to a target value (681.190 nm).

The laser light L22A transmitted through the beam splitter 1205 may be incident to the multi-path amplifier 1206. The multi-path amplifier 1206 may include a titanium sapphire crystal that is excited by the laser light L21 emitted from the second harmonic generator 1203. The multi-path amplifier 1206 may amplify the laser light L22A output from the titanium sapphire laser device 1204, in a state in which the wavelength (768.046 nm) and the spectral line width are maintained. The amplified laser light L22B may be incident to the wavelength converter 1208. The wavelength converter 1208 may include a non-linear optical crystal, such as a BBO crystal, a LBO crystal, a CLBO crystal, and the like, for example. The wavelength converter 1208 may convert the laser light L22B into laser light L23 having a wavelength of 384.023 nm, utilizing the second order non-linear optical effect. The laser light L23 (wavelength of 384.046 nm) whose wavelength is converted and the laser light L22B (wavelength of 768.046 nm) transmitted through the wavelength converter 1208 may be incident to the wavelength converter 1209. The wavelength converter 1209 may include a non-linear optical crystal similar to that of the wavelength converter 1208. The wavelength converter 1209 converts the wavelengths of the laser light L22B and the laser light L23, and outputs laser light L24 having a wavelength of 256.015 nm.

The laser light L32A transmitted through the beam splitter 1305 may be incident to the multi-path amplifier 1306. The multi-path amplifier 1306 may be excited by the laser light L22 emitted from the second harmonic generator 1303. The multi-path amplifier 1306 may amplify the laser light L32A, in a state in which the wavelength (681.190 nm) and the spectral line width are maintained, and emit the laser light L32A as laser light L32B. The laser light L24 having a wavelength of 256.015 nm and the laser light L32B having a wavelength of 681.190 nm may be combined in a dichroic mirror 1307, and the combined laser light may be incident to the wavelength converter 1211. The wavelength converter 1211 may include a cell having xenon gas sealed inside the cell. The wavelength converter 1211 may convert the wavelengths of the laser light L32B and the laser light L24, utilizing the non-linear optical effect of the two-photon resonant four-wave mixing (FWM), in order to output the laser light L1 having a wavelength of 157.629 nm.

13.6.2.1 Wavelength Converting Mechanism Using Xenon Gas

Figure 45:
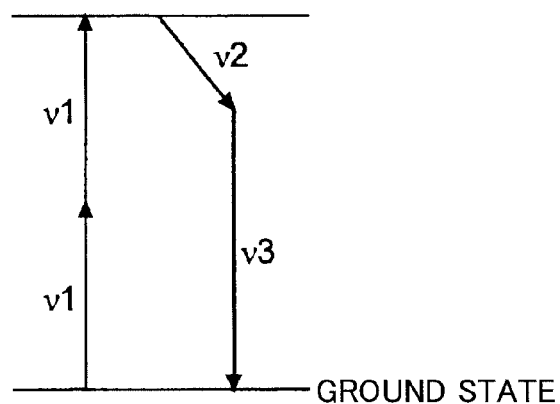
FIG. 45 is a diagram for explaining the non-linear optical effect of a two-photon resonant four-wave mixing (FWM)

A brief description will be given of the non-linear optical effect of the two-photon resonant FWM described above, by referring to FIG. 45. In FIG. 45, ν1 denotes the frequency of the laser light L24 having the wavelength of 256.015 nm and input to the wavelength converter 1211, ν2 denotes the frequency of the laser light L32B having the wavelength of 681.190 nm and input to the wavelength converter 1211, and ν3 denotes the frequency of the laser light L1 having the wavelength of 157.629 nm and output from the wavelength converter 1211. The two-photon resonant FWM may cause the atoms (or molecules) of the non-linear optical medium to resonate at a resonance line (excitation level) by the two photons of the laser light. The two-photon resonant FWM may generate laser light having a different frequency by subtracting (difference frequency mixing) or adding (sum frequency mixing) the photons of other laser light. In the present disclosure, as illustrated in FIG. 45, the xenon gas is caused to resonate at the resonance line by the two photons of the laser light having the frequency ν1, and the laser light having the frequency ν3 is generated by subtracting (difference frequency mixing) the photons of the laser light having the frequency ν2 from the laser light having the frequency ν1. Hence, by utilizing the two-photon resonant FWM, the wavelength conversion efficiency may be approximately 0.01% and high compared to the wavelength conversion efficiency of approximately 0.0001% obtained by the difference frequency mixing or sum frequency mixing that does not utilize the two-photon resonance.

The two-photon resonant FWM may be realized by using a metal gas, such as alkali metal vapor or the like, for example, in place of rare gas such as xenon. However, in the case of the rare gas, the apparatus may be simple because no apparatus is required to generate metal gas. In addition, because a threshold value of the dielectric breakdown is large for the rare gas, the intensities of the laser light L24 and L32B may be set high, to thereby enable a high output for the laser light L1. Moreover, although the two-photon resonant FWM may be carried out using other rare gases (for example, argon and krypton), the width between the ground level and the excited level of xenon gas is the smallest amongst the rare gases, and for this reason, the use of the xenon gas is most preferable amongst the rare gases. Details of the non-linear optical effect of the two-photon resonant FWM may be found in "Tunable VUV Radiation Generated by Two-Photon Resonant Frequency Mixing in Xenon" (IEEE Journal of Quantum Electronics, Vol. QE-19, No. 2, February 1983), for example.

13.7 Laser Device Having Coherence Tuning Mechanism

In addition, the laser device having the coherence tuning mechanism of the tenth embodiment described above, for example, may have the following configuration.

13.7.1 Configuration

Figure 46:
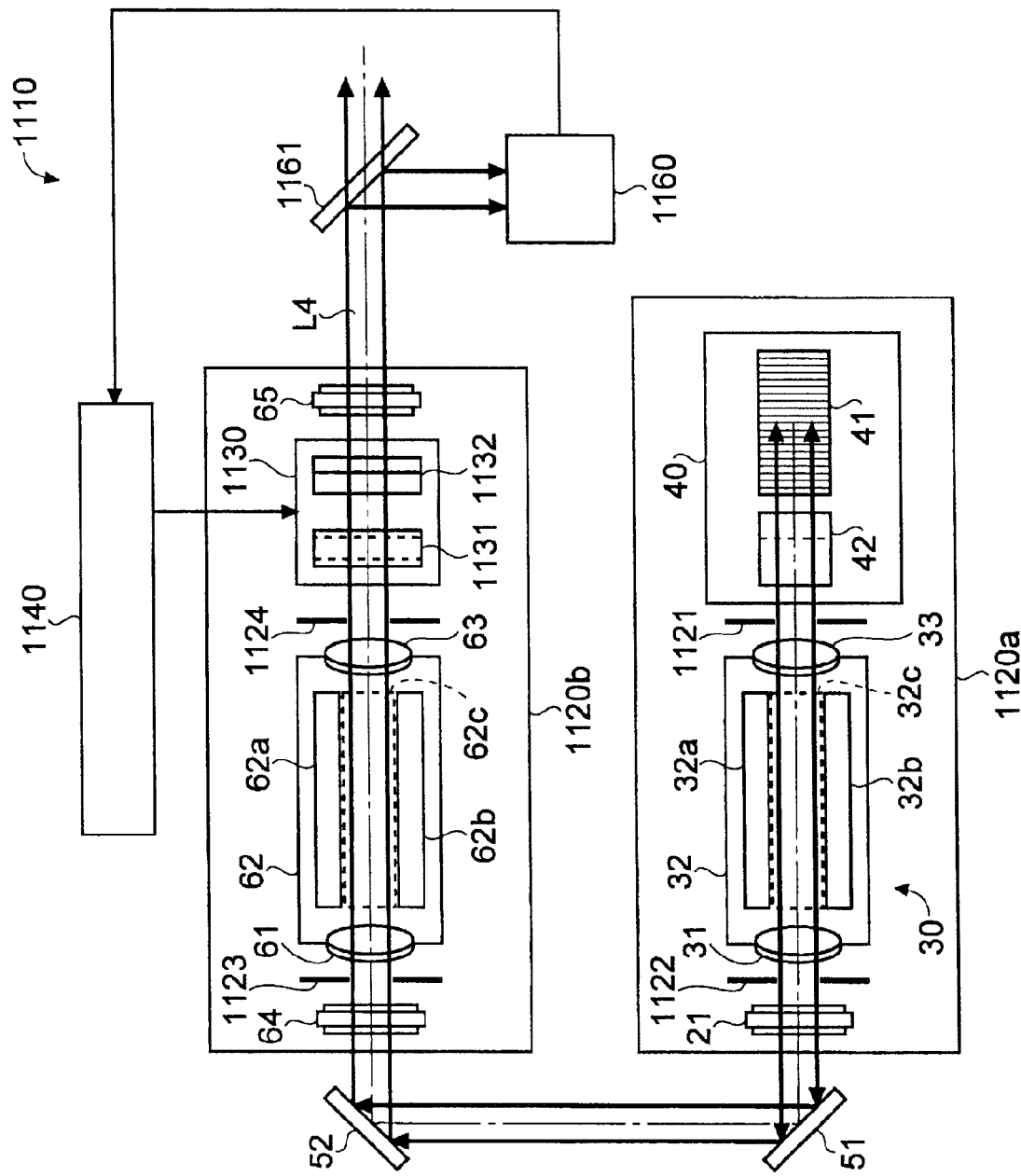
FIG. 46 is a side view schematically illustrating a configuration of the laser device provided with a coherence tuning mechanism.
Figure 47:
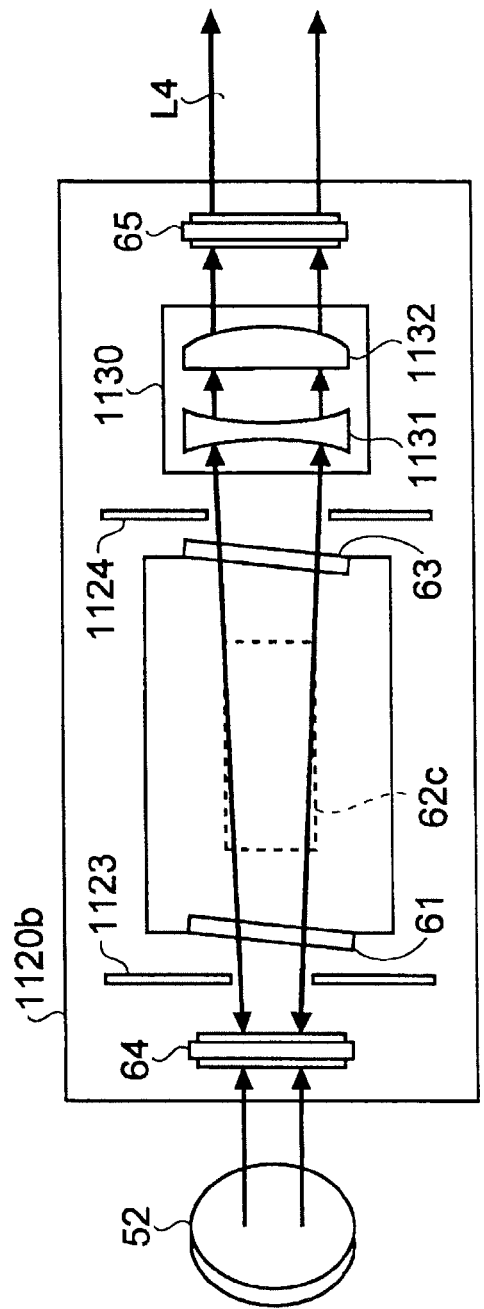
FIG. 47 is a top view schematically illustrating a configuration of an amplifier-stage laser in the laser device illustrated in FIG. 46.

FIG. 46 is a side view schematically illustrating the configuration of the laser device provided with the coherence tuning mechanism. FIG. 47 is a top view schematically illustrating the configuration of an amplifier-stage laser in the laser device illustrated in FIG. 46.

As illustrated in FIGS. 46 and 47, a laser device 1110 may include a master oscillator 1120a and an amplifier apparatus 1120b. The master oscillator 1120a may have a configuration similar to that of the master oscillator 20a illustrated in FIG. 35, for example. However, the master oscillator 1120a may include at least two slits 1121 and 1122 in an optical path within the resonator. The amplifier apparatus 1120b may have a configuration similar to that of the amplifier apparatus 20c illustrated in FIG. 35, for example. However, the amplifier apparatus 1120b may include at least two slits 1123 and 1124 in an optical path within the resonator, and a coherence tuning mechanism 1130.

The laser device 1110 may further include a beam splitter 1161 and a coherence measuring unit 1160. The beam splitter 1161 may be arranged in an optical path of laser light L4 output from the amplifier apparatus 1120b. The coherence measuring unit 1160 may be arranged in an optical path of the laser light L4 split by the beam splitter 1161, and measure the coherence of the incident laser light L4. In addition, the coherence measuring unit 1160 may output the measured coherence to a laser controller 1140. The laser controller 1140 may tune the coherence tuning mechanism 1130, based on the measured coherence.

13.7.1.1 Example of Coherence Tuning Mechanism

Figure 48:
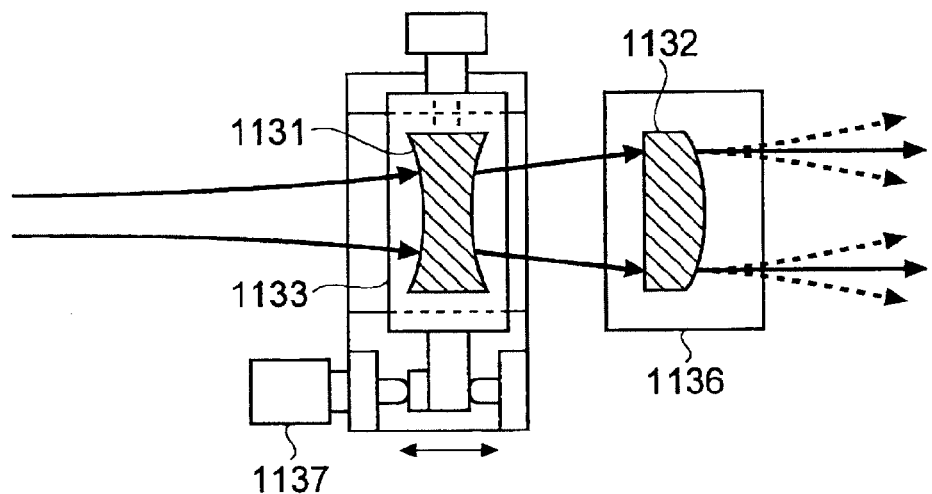
FIG. 48 is a top view schematically illustrating a configuration of the coherence tuning mechanism using a wave front tuning unit.
Figure 49:
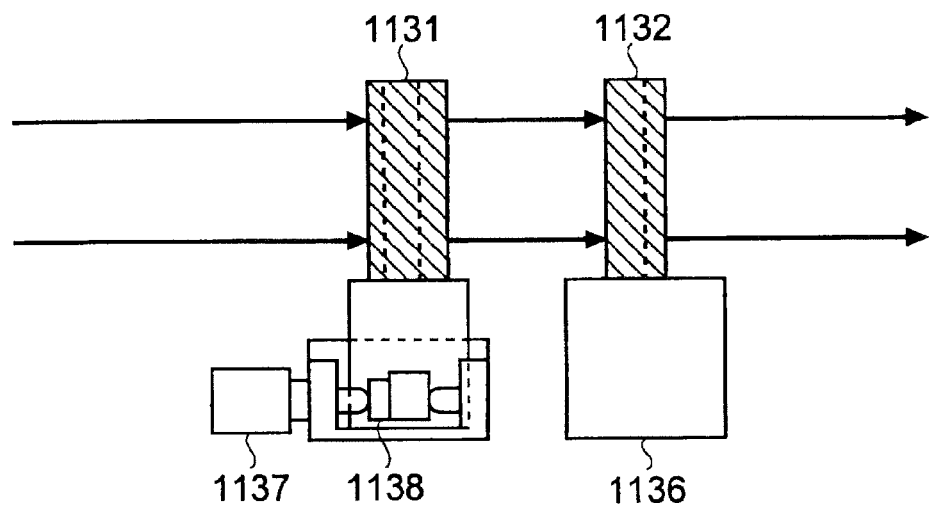
FIG. 49 is a side view schematically illustrating the configuration of the coherence tuning mechanism illustrated in FIG. 48.

A description will be given of an example of the configuration of the coherence tuning mechanism 1130. The coherence tuning mechanism 1130 may be formed by a wave front tuning unit that tunes the wave front of the laser light. FIG. 48 is a top view schematically illustrating the configuration of the coherence tuning mechanism using the wave front tuning unit. FIG. 49 is a side view schematically illustrating the configuration of the coherence tuning mechanism illustrated in FIG. 48.

As illustrated in FIGS. 48 and 49, the coherence tuning mechanism 1130 may include a cylindrical concave lens 1131 and a cylindrical convex lens 1132. The cylindrical concave lens 1131 may be fixed on a uniaxial automatic stage 1133 that moves parallel to the propagating direction of the laser light L4. The cylindrical convex lens 1132 may be fixed on a plate 1136. A pulse motor 1137 and a PZT 1138 may be provided on the uniaxial automatic stage 1133. The pulse motor 1137 may slide the automatic stage 1133 in a direction parallel to the propagating direction of the laser light L4. Hence, the cylindrical concave lens 1131 may move in the direction parallel to the propagating direction of the laser light L4 by a large amount. In addition, the PZT 1138 may be driven when moving the cylindrical concave lens 1131 at a high speed by a small amount. The cylindrical concave lens 1131 may be moved at a high speed by a small amount for every pulse. The automatic stage 1133 described above may be effective when tuning the spatial coherence within a desired range required by the exposure apparatus.

The cylindrical lenses are used in the example illustrated in FIGS. 48 and 49; however, the lenses are not limited to cylindrical lenses and spherical lenses, for example, may be used to form the coherence tuning mechanism 1130.

13.7.2 Operation

Next, a description will be given of the operation of the laser device 1110 illustrated in FIGS. 46 through 49. The laser light output from the master oscillator 1120a may be reflected by the two high reflection mirrors 51 and 52 and injected into the resonator of the amplifier apparatus 1120b as seed light.

A high voltage may be applied between the excitation electrodes 62a and 62b within the laser chamber 62 of the amplifier apparatus 1120b, in synchronism with the injection of the seed light into the resonator of the amplifier apparatus 1120b. Hence, a discharge may be generated between the excitation electrodes 62a and 62b, and the discharge region 62c may be formed. As a result, the seed light may resonate by reciprocating between the resonator mirrors 64 and 65, and the laser light may be subjected to amplification and oscillation.

The coherence tuning mechanism 1130 may be provided between the resonator mirror 65 and the laser chamber 62 of the resonator of the amplifier apparatus 1120b. The spatial coherence and the beam divergence of the laser light L4 that is emitted may be changed by tuning the coherence tuning mechanism 1130. In addition, a resonator length L of the amplifier apparatus 1120b may be longer than lc/2, where lc denotes the time coherent length of the seed light. Hence, the time coherent length lc of the laser light may be represented by the following formula (4), where λ denotes a center wavelength of the laser light, and Δλ denotes the spectral line width of the seed light output from the master oscillator 1120a.

$$lc = \lambda^2 / \Delta\lambda \quad (4)$$

The mutual interference of the laser light amplified in the amplifier apparatus 1120b and reciprocating may be reduced, by setting the time coherent length of the seed light based on the above formula (4).

In addition, as illustrated in FIG. 47, the seed light having the narrow spectral line width may be reflected by the high reflection mirror 52 and the resonator mirror 64 of the amplifier apparatus 1120b, and be incident to the discharge region 62c via the window 61. The seed light incident to the discharge region 62c may be amplified and be incident to the coherence tuning mechanism 1130 via the window 63. The wave front of the seed light transmitted through the coherence tuning mechanism 1130 may change within a plane perpendicular to the discharge direction. Thereafter, a part of the seed light whose wave front is changed may be output by being transmitted through the resonator mirror 65.

The wave front of the seed light reflected by the resonator mirror 65 may be changed again within the plane perpendicular to the discharge direction by the coherence tuning mechanism 1130, and may thereafter be incident to the discharge region 62c within the laser chamber 62 via the window 63. The seed light incident to the discharge region 62c may be amplified and reach the resonator mirror 64 via the window 61. This seed light may be reflected by the resonator mirror 64, and be output from the laser device 1110 via the window 61, again, the discharge region 62c, the window 63, the coherence tuning mechanism 1130, and the resonator mirror 65. The operation described above may be repeated by using the seed light reflected by the resonator mirror 65 as feedback light, in order to further amplify and output the seed light.

In the examples illustrated in FIGS. 46 through 49, the resonator mirror 64 may be coated with a partial reflecting film. In this case, the reflectivity of the resonator mirror 64 may be in a range of 60% to 90%.

In a case in which the coherence tuning mechanism 1130 is formed by a combination of concave and convex cylindrical lenses, the wave front in the direction parallel to the paper in FIG. 47 may be adjusted, without adjusting the wave front in the direction perpendicular to the paper in FIG. 47.

In the examples illustrated in FIGS. 46 through 49, the coherence tuning mechanism 1130 is provided between the laser chamber 62 and the resonator mirror 65 of the amplifier apparatus 1120b. However, the arrangement of the coherence tuning mechanism 1130 is not limited to such a location. For example, the coherence tuning mechanism 1130 may be provided between the laser chamber 62 and the resonator mirror 64. In addition, the resonator mirror 64 or the resonator mirror 65 may be formed by a deformable mirror with a freely variable curvature. In this case, the resonator mirror 64 itself or the resonator mirror 65 itself, that is formed by the deformable mirror, may operate as the coherence tuning mechanism.

For example, the coherence measuring unit 1160 may include two pinholes separated by a fixed distance, and an image sensor that measures the interference fringes of the laser light transmitted through the two pin holes. According to this coherence measuring unit 1160, a contrast Cm of the interference fringes may be measured from the image data acquired by the image sensor.

The laser controller 1140 may receive a target spatial coherence CL from the two-beam interference apparatus 1100, and tune the coherence tuning mechanism 1160 based on the detection result of the coherence measuring unit 1160, in order to realize the target spatial coherence CL.

14. Definition of Contrast

Figure 50:
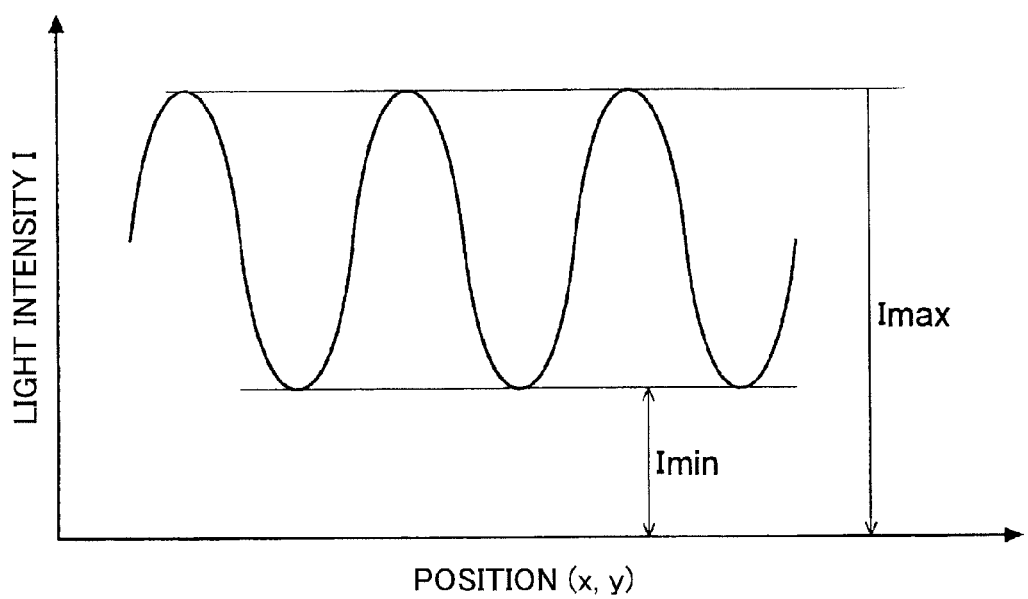
FIG. 50 is a diagram illustrating an example of a light intensity distribution of one line in image data acquired by the image sensor.

A definition of the contrast of the interference fringes of the present disclosure will now be given. FIG. 50 is a diagram illustrating an example of a light intensity distribution of one line in the image data acquired by the image sensor. As illustrated in FIG. 50, the light intensity distribution in one direction perpendicular to the stripes of the interference fringes may be approximated by a sine wave. Hence, the contrast Cm may be calculated using the following formula (5), where Imax denotes a maximum light intensity and Imin denotes a minimum light intensity.

$$Cm=(Imax-Imin)/(Imax+Imin) \quad (5)$$

15. Complementary Lithography

Next, a description will be given of an example of a complementary lithography using the two-beam interference exposure system of the embodiment described above. FIGS. 51 through 55 are diagrams for explaining the complementary lithography using the two-beam interference exposure system. In FIGS. 51 through 55, it is assumed that the example of the complementary lithography uses the DSA (Direct Self Assembly) technique. In addition, it is assumed for the sake of convenience that each pattern in FIGS. 51 through 55 is formed on the exposure surface of the wafer 131.

Figure 51:
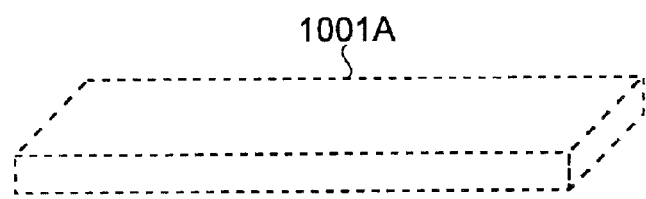
FIG. 51 is a diagram for explaining a complementary lithography using the two-beam interference exposure system (part 1)
Figure 52:
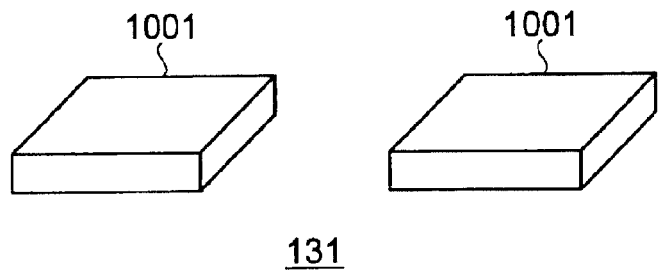
FIG. 52 is a diagram for explaining the complementary lithography using the two-beam interference exposure system (part 2)

As illustrated in FIG. 51, according to the complementary lithography, the wafer 131 that is the exposure target may first be coated with a photoresist 1001A. Next, the photoresist 1001A may be exposed by the laser beam using the two-beam interference exposure system, and the pattern may be developed after the exposure. Hence, as illustrated in FIG. 52, a line-shaped pre-pattern 1001 may be arranged at a predetermined interval in one direction, in the line-and-space manner. For example, the pre-pattern 1001 may be formed by using the KrF excimer laser having a high coherence as the laser device, and carrying out the exposure by subjecting the KrF laser light output from the laser device to the two-beam interference. In this case, the line-and-space pre-patterns 1001 having a half pitch interval (or half pitch) of 90 nm, for example, may be formed. The incident angle θ of the two laser light in the two-beam interference apparatus may be obtained from the formula (1) described above. Furthermore, in a case in which the ArF excimer laser is used as the laser device, the line-and-space pre-patterns 1001 having a half pitch interval (or half pitch) of 60 nm may be formed when the incident angle θ is 45°.

Figure 53:
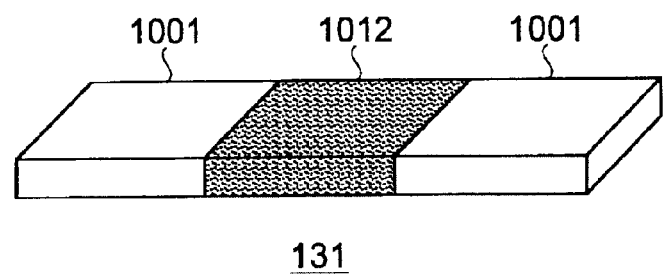
FIG. 53 is a diagram for explaining the complementary lithography using the two-beam interference exposure system (part 3)
Figure 54:
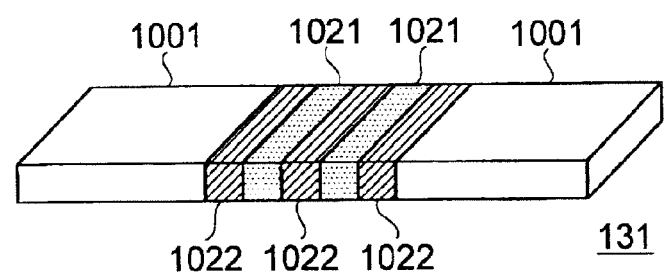
FIG. 54 is a diagram for explaining the complementary lithography using the two-beam interference exposure system (part 4)
Figure 55:
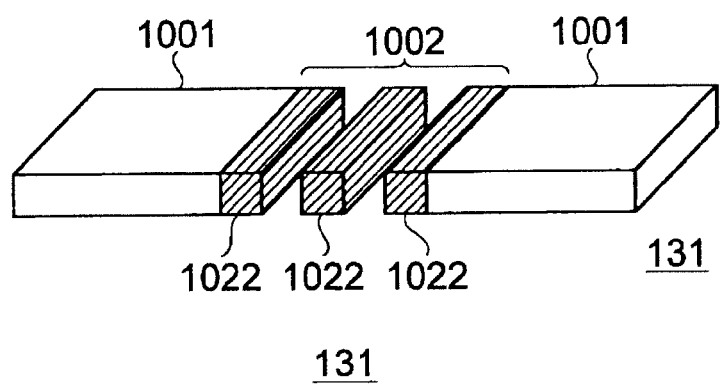
FIG. 55 is a diagram for explaining the complementary lithography using the two-beam interference exposure system (part 5)

Next, as illustrated in FIG. 53, a block copolymer 1012 may be coated between the pre-patterns 1001 formed on the wafer 131. The coated block copolymer 1012 may then be annealed. Then, as illustrated in FIG. 54, the block copolymer 1012 between the pre-patterns 1001 may self-align, and a plurality of patterns 1022 extending in the same direction as the pre-patterns 1001 may be formed between the pre-patterns 1001. Next, parts 1021 of the patterns 1022 that are not altered may be etched. A RIE (Reactive Ion Etching) or the like may be used to etch the parts 1021. According to the direct self assembly technique described above, line-and-space patterns 1002 that are arranged in the same direction as the direction in which the pre-patterns 1001 are arranged may be formed as illustrated in FIG. 55. A half pitch interval of the line-and-space patterns 1002 may be on the order of 1/10 the half pitch interval of the pre-patterns 1001, for example.

Figure 56:
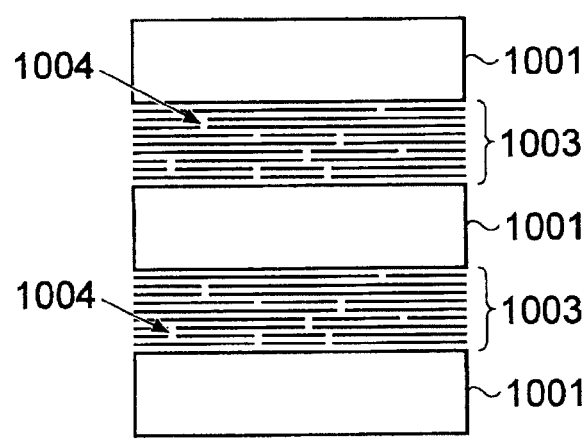
FIG. 56 is a diagram illustrating an example of an element pattern that may be formed using the complementary lithography.
Figure 57:
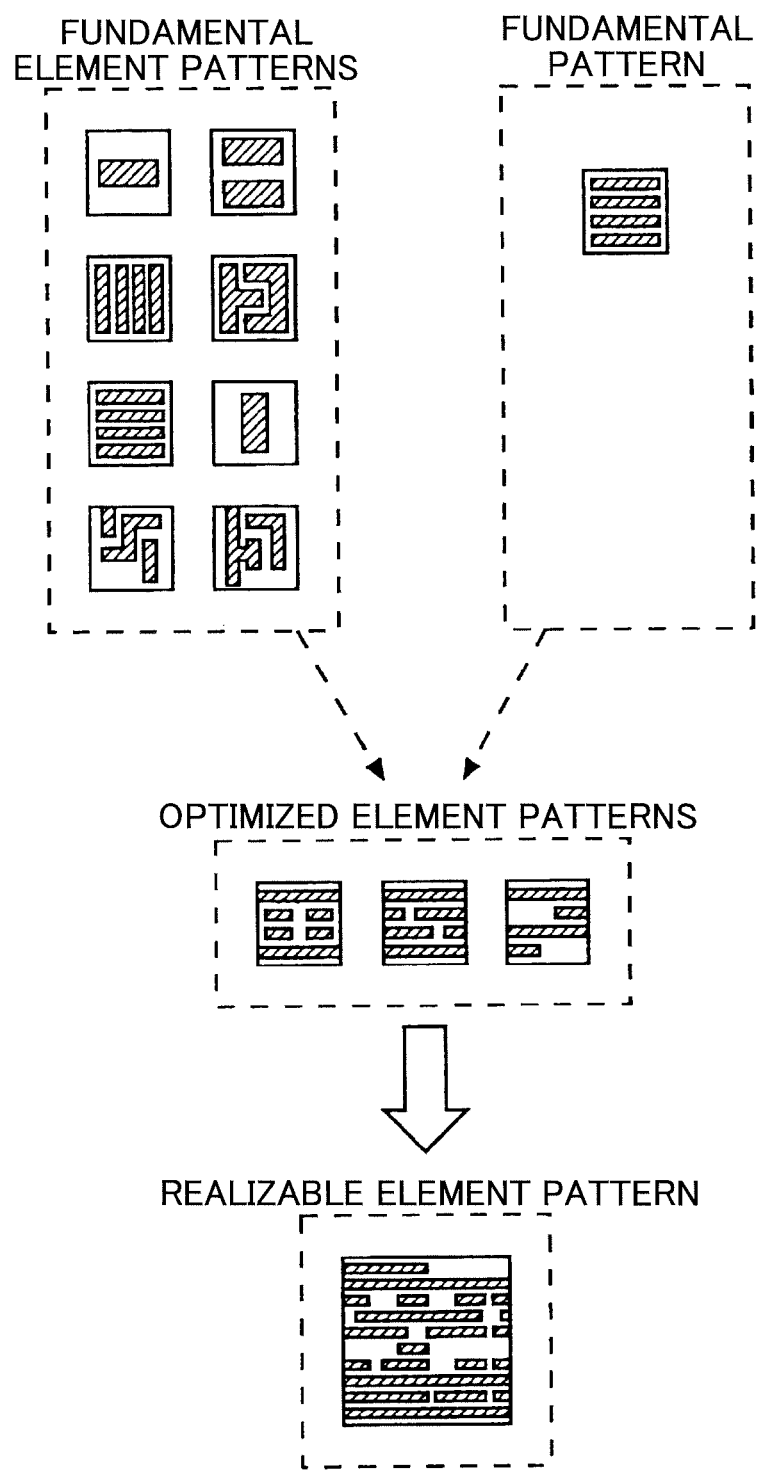
FIG. 57 is a diagram illustrating an example of the element pattern that may be formed using the complementary lithography and the direct self-assembly technique.

The line-and-space patterns 1002 formed in the above described manner may further be cut, in order to remove desired parts and form a cut part 1004. As a result, as illustrated in FIG. 56, patterns 1003 including desired circuit elements may be formed. The line-and-space patterns 1002 may be cut using an electron beam, EUV exposure, or the like. FIG. 57 illustrates examples of element patterns that may be created using the technique described above.

The description given above are intended to be taken only as examples, and is not to be seen as limiting in any way. Accordingly, it may be clear to those skilled in the art that variations and modifications of the embodiments of the present disclosure may be made without departing from the scope of the appended claims.

The terms used in this specification and in the entirety of the scope of the appended claims are to be interpreted as not being limiting. For example, terms such as "includes" or "included" should be interpreted as not being limited to the item that is described to include or be included. In addition, the terms such as "comprising" and "has" should be interpreted as not being limited to the item that is described to comprise or have. Furthermore, the indefinite article "a" or "an" as used in this specification and the scope of the appended claims should be interpreted as meaning "at least one" or "one or more".

Although the embodiments are numbered as "first embodiment", "second embodiment", . . . , for example, the ordinal numbers do not imply priorities of the embodiments. Many other variations and modifications will be apparent to those skilled in the art.

What is claimed is:

1. A two-beam interference apparatus comprising:
a wafer stage configured to receive a wafer to be set on the wafer stage;
a beam splitter configured to split first laser light output from a laser device into second laser light and third laser light having a beam intensity distribution elongated in a first direction within a surface of the wafer;
an optical system configured to guide the second laser light and the third laser light onto the wafer;
a phase error detector configured to detect a phase error between the second laser light and the third laser light; and
a controller configured to tune a wavelength of the first laser light output from the laser device based on the phase error detected by the phase error detector,
wherein the wafer is irradiated with the second laser light from a second direction perpendicular to the first direction, and the third laser light from a third direction perpendicular to the first direction but different from the second direction, to thereby cause interference of the second and third laser light output from the optical system on the wafer.

2. The two-beam interference apparatus as claimed in claim 1, further comprising:
a beam expander configured to enlarge a beam cross section of the first laser light,
wherein the beam splitter splits the first laser light enlarged by the beam expander.

3. The two-beam interference apparatus as claimed in claim 1, further comprising:
a beam tuning unit configured to convert a beam profile of the first laser light,
wherein the beam splitter splits the first laser light whose beam profile is converted by the beam tuning unit.

4. The two-beam interference apparatus as claimed in claim 3, wherein the beam tuning unit converts the beam profile of the first laser light into a top hat shape.

5. The two-beam interference apparatus as claimed in claim 4, wherein the beam tuning unit includes two axicon lenses having vertexes thereof arranged to oppose each other.

6. The two-beam interference apparatus as claimed in claim 4, wherein the beam tuning unit includes two cylindrical lenses having curved surfaces thereof arranged to oppose each other.

7. The two-beam interference apparatus as claimed in claim 1, wherein
the phase error detector includes an image sensor, and
the optical system overlaps, on the image sensor, the second laser light and the third laser light reflected by the wafer.

8. The two-beam interference apparatus as claimed in claim 7, wherein the phase error detector varies the wavelength of the first laser light output from the laser device, and detects the phase error between the second laser light and the third laser light based on a change in interference fringes generated by the second laser light and the third laser light detected by the image sensor.

9. The two-beam interference apparatus as claimed in claim 1, wherein the optical system includes one or more high reflection mirrors, and one or more actuators configured to control inclinations of the one or more high reflection mirrors, and
the controller controls the one or more actuators based on the phase error detected by the phase error detector.

10. The two-beam interference apparatus as claimed in claim 1, wherein the beam splitter includes a grating.

11. The two-beam interference apparatus as claimed in claim 10, wherein the grating includes a grid type grating having grooves or projections formed in a lattice shape.

12. The two-beam interference apparatus as claimed in claim 10, further comprising:
a rotating mechanism configured to rotate the grating within a plane perpendicular to an optical axis of the first laser light,
wherein the optical system includes a first optical system configured to cause the second laser light and the third laser light to interfere on the wafer when the grating is positioned at a first rotary state by the rotating mechanism, and a second optical system configured to cause the second laser light and the third laser light to interfere on the wafer when the grating is positioned at a second rotary state different from the first rotary state by the rotating mechanism.

13. The two-beam interference apparatus as claimed in claim 1, further comprising:
an optical retarder configured to tilt a polarization direction of the first laser light in a rotating direction about an optical axis of the first laser light,
wherein the beam splitter splits the first laser light whose polarization direction is tilted by the optical retarder.

14. The two-beam interference apparatus as claimed in claim 1, further comprising:
a beam rotating mechanism configured to rotate a beam cross section of the first laser light about an optical axis of the first laser light,
wherein the beam splitter splits the first laser light whose beam cross section is rotated by the beam rotating mechanism.

15. The two-beam interference apparatus as claimed in claim 14, wherein the beam rotating mechanism tilts the polarization direction of the first laser light in a rotating direction about the optical axis of the first laser light, together with the beam cross section of the first laser light.

16. A two-beam interference exposure system comprising:
a laser device configured to output first laser light and having an amplifier unit that includes a pair of excitation electrodes forming a discharge region, wherein a cross section of the discharge region taken in a direction perpendicular to an optical axis of the first laser light is elongated in a first direction;
a two-beam interference apparatus configured to cause interference of the laser light output from the laser device, wherein the two-beam interference apparatus includes
a beam splitter configured to split the first laser light output from the laser device into second laser light and third laser light,
a wafer stage configured to receive a wafer to be set on the wafer stage, and
an optical system configured to guide the second laser light and the third laser light onto the wafer;
a phase error detector configured to detect a phase error between the second laser light and the third laser light; and a controller configured to tune a wavelength of the first laser light output from the laser device based on the phase error detected by the phase error detector, wherein the wafer is irradiated with the second laser light from a second direction perpendicular to the first direction, and the third laser light from a third direction perpendicular to the first direction but different from the second direction, to thereby cause interference of the second and third laser light output from the optical system on the wafer.

17. The two-beam interference exposure system as claimed in claim 16, wherein the laser device includes at least one of an excimer laser and a solid state seeder for F2 laser.

18. The two-beam interference exposure system as claimed in claim 16, wherein the laser device includes a coherence tuning mechanism configured to vary a coherence of the first laser light.

19. The two-beam interference exposure system as claimed in claim 18, wherein the coherence tuning mechanism includes a wave front tuning unit.

\* \* \* \* \*